United States Patent
Endisch et al.

(10) Patent No.: US 7,630,121 B2
(45) Date of Patent: Dec. 8, 2009

(54) ELECTROMECHANICAL DEVICE WITH OPTICAL FUNCTION SEPARATED FROM MECHANICAL AND ELECTRICAL FUNCTION

(75) Inventors: Denis Endisch, Cupertino, CA (US); Marc Mignard, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/772,751

(22) Filed: Jul. 2, 2007

(65) Prior Publication Data

US 2009/0009845 A1  Jan. 8, 2009

(51) Int. Cl.
G02B 26/00 (2006.01)

(52) U.S. Cl. .............. 359/291; 359/290; 359/292; 359/295

(58) Field of Classification Search .......... 359/290, 359/291, 292, 295
See application file for complete search history.

(56) References Cited

U.S. PATENT DOCUMENTS

| | | | |
|---|---|---|---|
| 3,728,030 A | 4/1973 | Hawes | |
| 3,955,190 A | 5/1976 | Teraishi | |
| 3,955,880 A | 5/1976 | Lerke | |
| 4,403,248 A | 9/1983 | te Velde | |
| 4,441,791 A | 4/1984 | Hornbeck | |
| 4,786,128 A | 11/1988 | Birnbach | |
| 4,859,060 A | 8/1989 | Katagiri et al. | |
| 4,954,789 A | 9/1990 | Sampsell | |
| 4,956,619 A | 9/1990 | Hornbeck | |
| 4,982,184 A | 1/1991 | Kirkwood | |
| 5,022,745 A | 6/1991 | Zahowski et al. | |
| 5,028,939 A | 7/1991 | Hornbeck et al. | |
| 5,091,983 A | 2/1992 | Lukosz | |
| 5,096,279 A | 3/1992 | Hornbeck et al. | |
| 5,170,283 A | 12/1992 | O'Brien et al. | |
| 5,315,370 A | 5/1994 | Bulow | |
| 5,381,232 A | 1/1995 | Van Wijk | |
| 5,471,341 A | 11/1995 | Warde et al. | |
| 5,526,172 A | 6/1996 | Kanack | |
| 5,559,358 A | 9/1996 | Burns et al. | |

(Continued)

FOREIGN PATENT DOCUMENTS

EP   1 122 577   8/2001

(Continued)

OTHER PUBLICATIONS

Feenstra et al., Electrowetting displays, Liquivista BV, 16 pp., Jan. 2006.

(Continued)

*Primary Examiner*—David N Spector
(74) *Attorney, Agent, or Firm*—Knobbe Martens Olson & Bear, LLP

(57) ABSTRACT

In certain embodiments, a microelectromechanical (MEMS) device comprises a substrate having a top surface, a movable element over the substrate, and an actuation electrode disposed laterally from the reflective surface. The movable element comprises a deformable layer and a reflective element mechanically coupled to the deformable layer. The reflective element includes a reflective surface. The movable element is responsive to a voltage difference applied between the actuation electrode and the movable element by moving in a direction generally perpendicular to the top surface of the substrate.

33 Claims, 43 Drawing Sheets

U.S. PATENT DOCUMENTS

| | | | |
|---|---|---|---|
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,710,656 A | 1/1998 | Goosen |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 6,028,689 A | 2/2000 | Michalicek et al. |
| 6,040,937 A | 3/2000 | Miles |
| 6,055,090 A | 4/2000 | Miles |
| 6,097,145 A | 8/2000 | Kastalsky et al. |
| 6,195,196 B1 | 2/2001 | Kimura et al. |
| 6,262,697 B1 | 7/2001 | Stephenson |
| 6,327,071 B1 | 12/2001 | Kimura |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,791,735 B2 | 9/2004 | Stappaerts |
| 6,794,119 B2 | 9/2004 | Miles |
| 6,813,059 B2 | 11/2004 | Hunter et al. |
| 6,841,081 B2 | 1/2005 | Chang et al. |
| 6,844,959 B2 | 1/2005 | Huibers et al. |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,982,820 B2 | 1/2006 | Tsai |
| 7,006,272 B2 | 2/2006 | Tsai |
| 7,008,812 B1 | 3/2006 | Carley |
| 7,012,732 B2 | 3/2006 | Miles |
| 7,046,422 B2 | 5/2006 | Kimura et al. |
| 7,053,737 B2 | 5/2006 | Schwartz et al. |
| 7,075,700 B2 | 7/2006 | Muenter |
| 7,119,945 B2 | 10/2006 | Kothari et al. |
| 7,123,216 B1 | 10/2006 | Miles |
| 7,126,738 B2 | 10/2006 | Miles |
| 7,126,741 B2 | 10/2006 | Wagner et al. |
| 7,130,104 B2 | 10/2006 | Cummings |
| 7,184,195 B2 | 2/2007 | Yang |
| 7,184,202 B2 | 2/2007 | Miles et al. |
| 7,198,873 B2 | 4/2007 | Geh et al. |
| 7,221,495 B2 | 5/2007 | Miles et al. |
| 7,236,284 B2 | 6/2007 | Miles |
| 7,289,259 B2 | 10/2007 | Chui et al. |
| 7,302,157 B2 | 11/2007 | Chui |
| 7,321,457 B2 | 1/2008 | Heald |
| 7,372,613 B2 | 5/2008 | Chui et al. |
| 7,372,619 B2 | 5/2008 | Miles |
| 7,379,227 B2 | 5/2008 | Miles |
| 7,385,744 B2 | 6/2008 | Kogut et al. |
| 7,385,762 B2 | 6/2008 | Cummings |
| 7,463,421 B2 | 12/2008 | Miles |
| 7,471,444 B2 | 12/2008 | Miles |
| 7,550,810 B2 * | 6/2009 | Mignard et al. ............. 257/419 |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0015215 A1 | 2/2002 | Miles |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2003/0016428 A1 | 1/2003 | Kato et al. |
| 2003/0029705 A1 | 2/2003 | Qiu et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0075967 A1 | 4/2004 | Lynch et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Pichl et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0249966 A1 | 11/2005 | Tung et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066935 A1 | 3/2006 | Cummings et al. |
| 2006/0066936 A1 | 3/2006 | Chui et al. |

| | | |
|---|---|---|
| 2006/0067633 A1 | 3/2006 | Gally et al. |
| 2006/0067643 A1 | 3/2006 | Chui |
| 2006/0067649 A1 | 3/2006 | Tung et al. |
| 2006/0067651 A1 | 3/2006 | Chui et al. |
| 2006/0076311 A1 | 4/2006 | Tung et al. |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0079048 A1 | 4/2006 | Sampsell |
| 2006/0220160 A1 | 10/2006 | Miles |
| 2006/0261330 A1 | 11/2006 | Miles |
| 2006/0262279 A1 | 11/2006 | Miles |
| 2006/0262380 A1 | 11/2006 | Miles |
| 2006/0262389 A1 | 11/2006 | Zaczek |
| 2006/0268388 A1 | 11/2006 | Miles |
| 2006/0274074 A1 | 12/2006 | Miles |
| 2006/0274398 A1 | 12/2006 | Chou |
| 2006/0274400 A1 | 12/2006 | Miles |
| 2007/0020948 A1 | 1/2007 | Piehl et al. |
| 2007/0040777 A1 | 2/2007 | Cummings |
| 2007/0058095 A1 | 3/2007 | Miles |
| 2007/0086078 A1 | 4/2007 | Hagood et al. |
| 2007/0121118 A1 | 5/2007 | Gally et al. |
| 2007/0121205 A1 | 5/2007 | Miles |
| 2007/0132843 A1 | 6/2007 | Miles |
| 2007/0139758 A1 | 6/2007 | Miles |
| 2007/0177247 A1 | 8/2007 | Miles |
| 2007/0194630 A1 | 8/2007 | Mignard et al. |
| 2007/0216987 A1 | 9/2007 | Hagood et al. |
| 2007/0229936 A1 | 10/2007 | Miles |
| 2007/0253054 A1 | 11/2007 | Miles |
| 2007/0279729 A1 | 12/2007 | Kothari et al. |
| 2008/0003710 A1 | 1/2008 | Kogut et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0036795 A1 | 2/2008 | Miles |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088908 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0130089 A1 | 6/2008 | Miles |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0316566 A1 | 12/2008 | Lan |
| 2008/0316568 A1 | 12/2008 | Griffiths et al. |
| 2009/0068781 A1 | 3/2009 | Tung et al. |
| 2009/0080060 A1 | 3/2009 | Sampsell et al. |
| 2009/0135465 A1 | 5/2009 | Chui |

FOREIGN PATENT DOCUMENTS

| | | |
|---|---|---|
| EP | 1 275 997 | 1/2003 |
| EP | 1 473 581 | 11/2004 |
| EP | 1 640 763 | 3/2006 |
| EP | 1 640 765 | 3/2006 |
| FR | 2 824 643 A | 11/2002 |
| JP | 04-276721 | 10/1992 |
| JP | 211999 | 11/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2003 195201 | 7/2003 |
| JP | 2004-212638 | 7/2004 |
| JP | 2004-212680 | 7/2004 |
| JP | 2005 279831 | 10/2005 |
| WO | WO 99/52006 | 10/1999 |
| WO | WO 03/014789 A2 | 2/2003 |
| WO | WO 2005/006364 A1 | 1/2005 |
| WO | WO 2006/036386 | 4/2006 |
| WO | WO 2008/057228 | 5/2008 |

OTHER PUBLICATIONS

Lezec, Submicrometer dimple array based interference color field displays and sensors, Nano Lett. 7(2):329-333, Dec. 23, 2006.
European Search Report for EP 05 25 5637.
Jerman, J.H. et al., "Miniature Fabry-Perot Interferometers Micromachined in Silicon for Use in Optical Fiber WDM Systems" Transcucers, San Francisco, Jun. 24-27, 1991,, Proceedings of the International Conference on Solid State Sensors and Actuators, New York, IEEE, US, vol. Conf. 6, Jun. 24, 1991, pp. 372-375, XP000608532.
Office Action for U.S. Appl. No. 11/057,045, dated Jul. 27, 2006.
Office Action for U.S. Appl. No. 11/057,045, dated Feb. 27, 2006.
Office Action for U.S. Appl. No. 11/112,734, dated Apr. 20, 2007.
Conner, "Hybrid Color Display Using Optical Interference Filter Array," SID Digest, pp. 577-580 (1993).
Jerman et al., "A Miniature Fabry-Perot Interferometer with a Corrugated Silicon Diaphragm Support", (1988).
Miles, Mark, W., "A New Reflective FPD Technology Using Interferometric Modulation", The Proceedings of the Society for Information Display (May 11-16, 1997).
Taii et al., "A transparent sheet display by plastic MEMS," Journal of the SID 14(8):735-741, 2006.
Pape et al., Characteristics of the deformable mirror device for optical information processing, Optical Engineering, 22(6):676-681, Nov.-Dec. 1983.
Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.
Miles, Interferometric modulation: MOEMS as an enabling technology for high performance reflective displays, Proceedings of SPIE, vol. 4985, pp. 131-139, 2003.
Invitation to Pay Additional Fees dated Nov. 10, 2008 in PCT/US08/068061.
Partial European Search Report dated Oct. 27, 2008 in App. No. 08153252.5.
International Search Report and Written Opinion for International Application No. PCT/US2008/068061, dated Mar. 24, 2009.
International Search Report and Written Opinion for International Application No. PCT/US2008/068062, dated Sep. 19, 2008.
International Search Report and Written Opinion for International Application No. PCT/US2008/068063, dated Sep. 19, 2008.
Miles M.W., *A mems based interferometric modulator (IMOD) for display applications*, Proceedings of Sensors Expo, Oct. 21, 1997, pp. 281-284.
Office Action for U.S. Appl. No. 11/772,730 dated Feb. 9, 2009.
Search Report for European Patent Application No. 08153252.5, dated Mar. 25, 2009.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

ELECTROMECHANICAL DEVICE WITH OPTICAL FUNCTION SEPARATED FROM MECHANICAL AND ELECTRICAL FUNCTION

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a microelectromechanical (MEMS) device comprises a substrate having a top surface, a movable element over the substrate, and an actuation electrode disposed laterally from the reflective surface. The movable element comprises a deformable layer and a reflective element mechanically coupled to the deformable layer. The reflective element includes a reflective surface. The movable element is responsive to a voltage difference applied between the actuation electrode and the movable element by moving in a direction generally perpendicular to the top surface of the substrate.

In certain embodiments, a microelectromechanical (MEMS) device comprises means for moving a portion of the device, means for supporting the moving means, and means for actuating the moving means. The moving means comprises means for deforming and means for reflecting. The actuating means is disposed laterally from the reflecting means.

In certain embodiments, a method of manufacturing a microelectromechanical (MEMS) device comprises forming an actuation electrode over a substrate, forming a sacrificial layer over the actuation electrode, forming a deformable layer over the sacrificial layer, forming a reflective element over the sacrificial layer and mechanically coupled to the deformable layer, and removing the sacrificial layer. The reflective element includes a reflective surface disposed laterally from the actuation electrode.

In certain embodiments, a method of modulating light comprises providing a display element comprising a substrate, a movable element over the substrate, and an actuation electrode. The movable element comprises a deformable layer and a reflective element. The reflective element is mechanically coupled to the deformable layer and includes a reflective surface. The actuation electrode is disposed laterally from the reflective surface. The method further comprises applying a voltage to the actuation electrode. The voltage generates an attractive force on the movable element, thereby causing the movable element to move towards the substrate.

BRIEF DESCRIPTION OF THE DRAWINGS

FIGS. 16A-16B2 are cross sections of an example embodiment of the MEMS device of FIG. 8A taken along line A-A including a second actuation electrode.

FIGS. 16C-16D2 are cross sections of the embodiment of FIGS. 16A-16B2 taken along line C-C of FIG. 8A.

FIGS. 16E-16F2 are cross sections of the embodiment of FIGS. 16A-16D2 taken along line E-E of FIG. 8A.

FIGS. 16G-16H2 are cross sections of the embodiment of FIGS. 16A-16F2 taken along line G-G of FIG. 8A.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices. Moreover, all figures herein have been drawn to depict the relationships between certain elements, and therefore are highly diagrammatic and should not be considered to be to scale.

In certain embodiments, an actuation electrode disposed laterally from the reflective surface of a reflective element is provided. The actuation electrode is not in the optical path, which allows it to comprise a non-transparent conductor and to be thicker, thereby improving power consumption. In some embodiments, the actuation electrode acts on a deformable layer mechanically coupled to the reflective element such that the deformable layer, rather than the reflective surface, contacts a stationary portion of the MEMS device upon actuation, which reduces, in turn, stiction, spring constant, electrostatic force, and capacitor area, thus enabling fast and low power operation. In some embodiments, surface roughening and other anti-stiction features may be formed between the actuation electrode and the deformable layer without impacting optical performance because they are not in the optical path. In some embodiments, the reflective surface does not contact anything upon actuation, allowing it to be substantially smooth and flat without the danger of stiction. In some embodiments, a second actuation electrode is provided above or below the deformable layer and/or the reflective surface such that the reflective surface is stable in at least three states.

Figure 1:
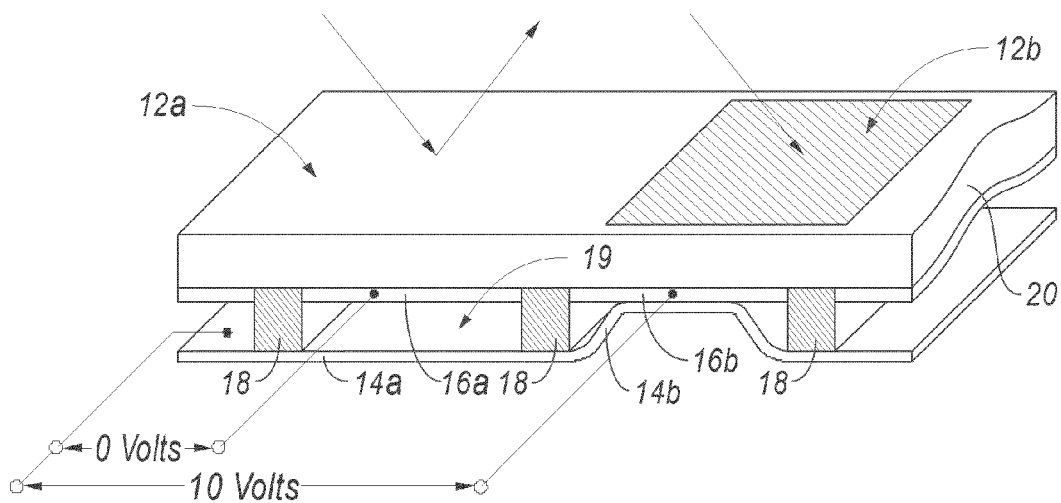
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
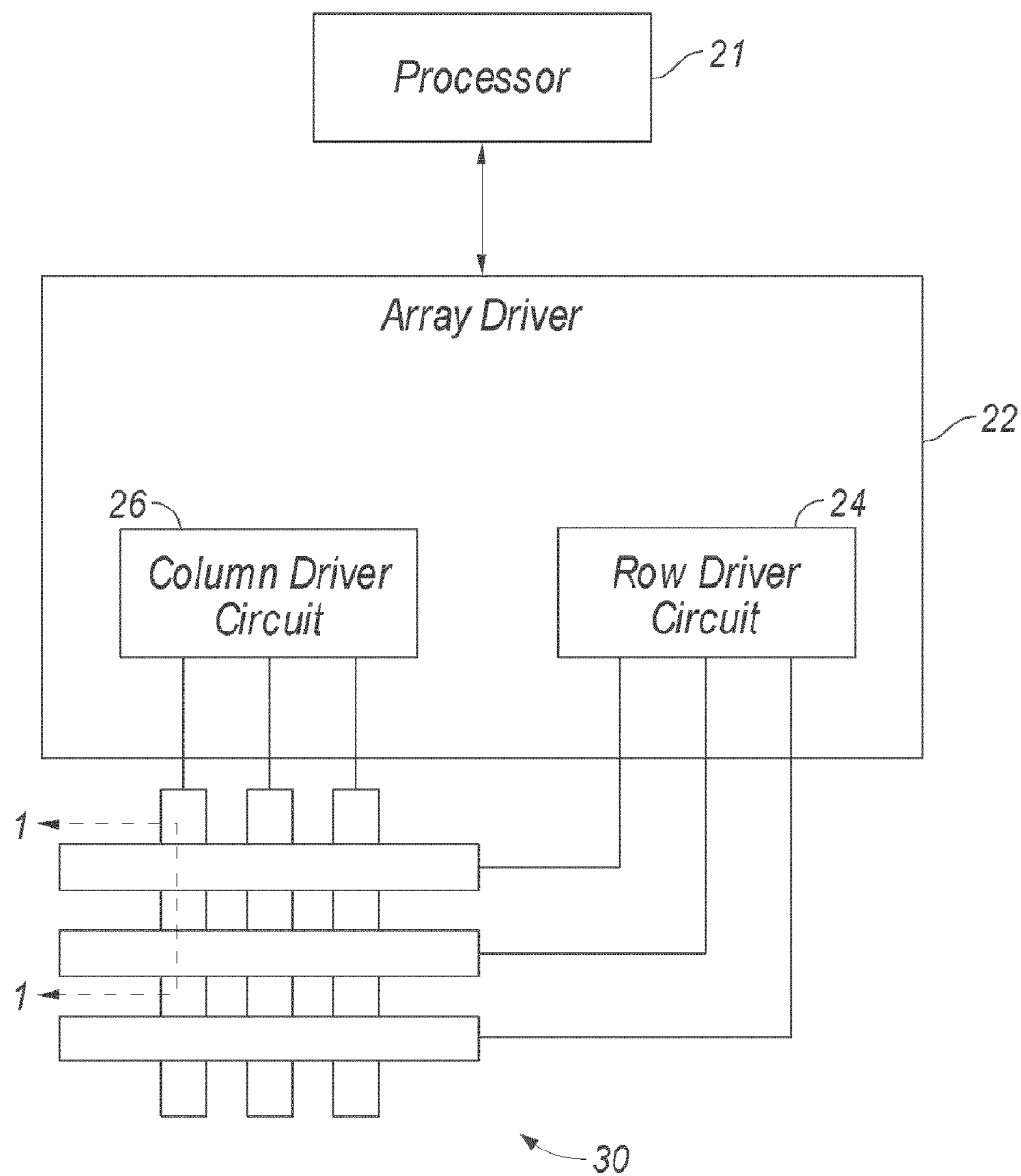
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, PentiumII®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
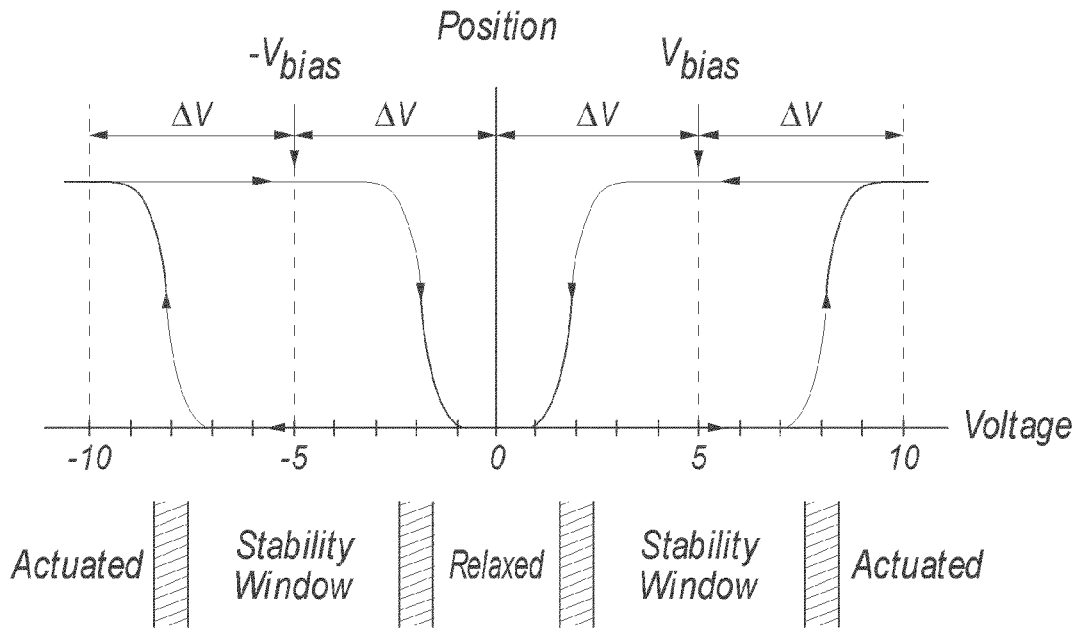
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
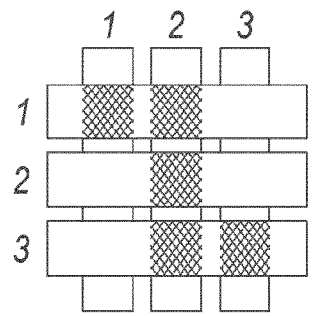
FIG. 5A illustrates one exemplary frame of display data in the 3×3 interferometric modulator display of FIG. 2.
Figure 5B:
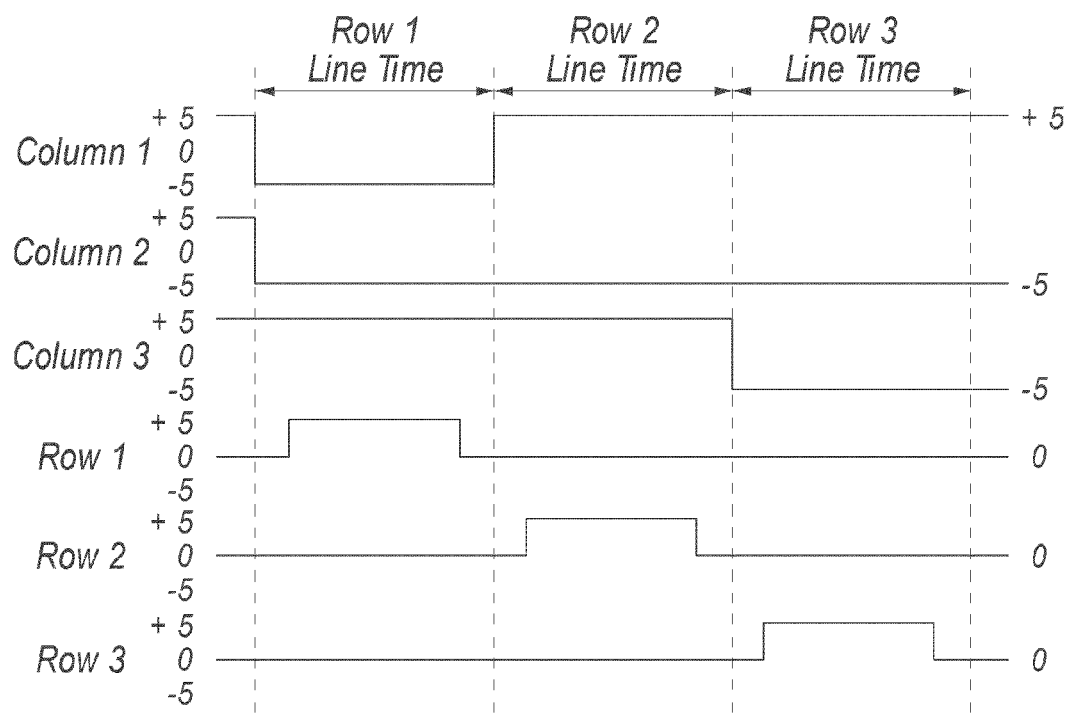
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
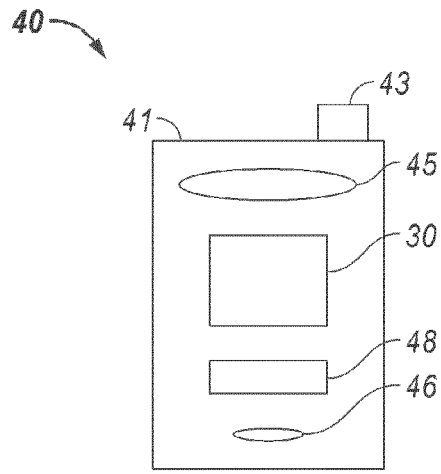
FIGS. 6A and 6B are system block diagrams illustrating an embodiment of a visual display device comprising a plurality of interferometric modulators.
Figure 6B:
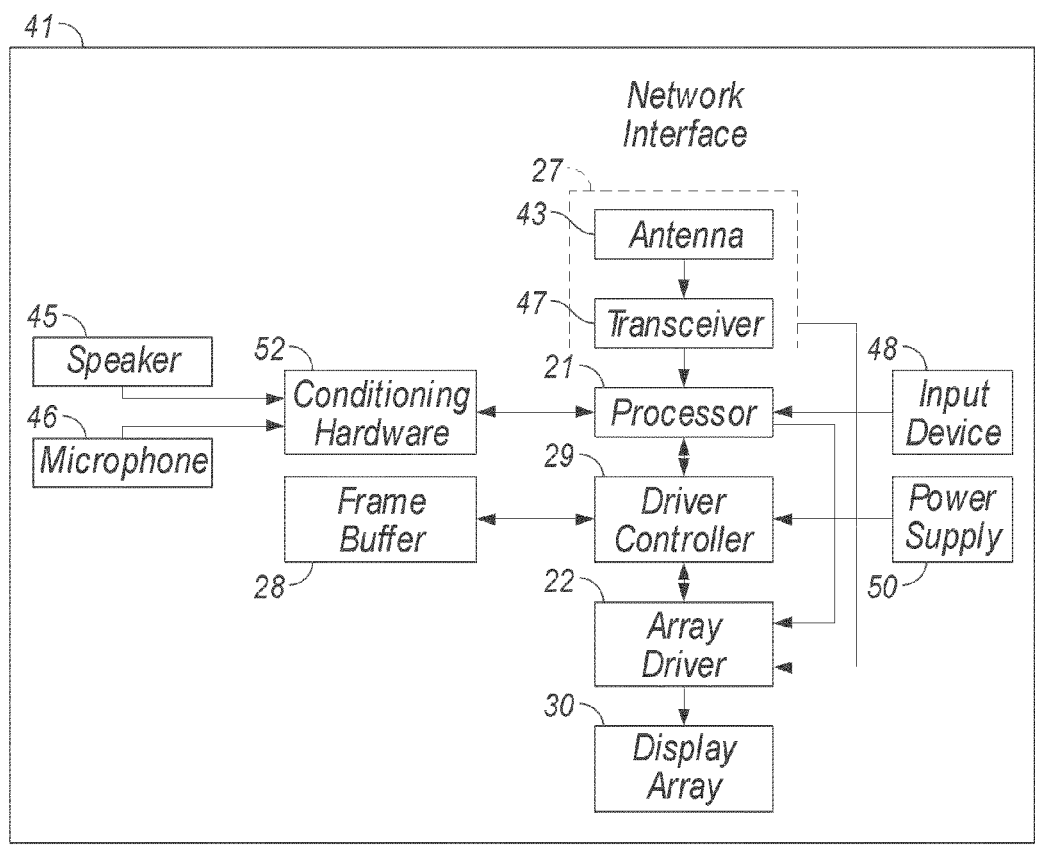

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
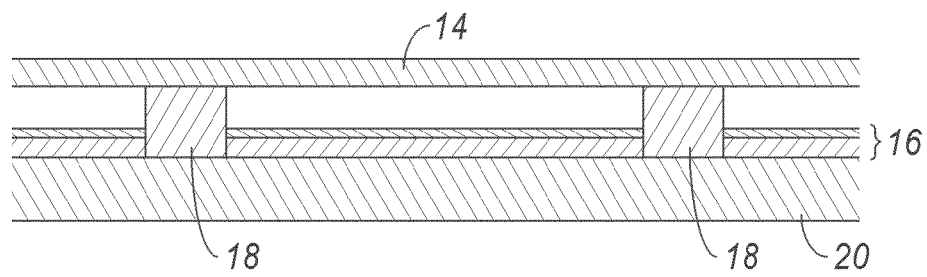
FIG. 7A is a cross section of the device of FIG. 1.
Figure 7B:
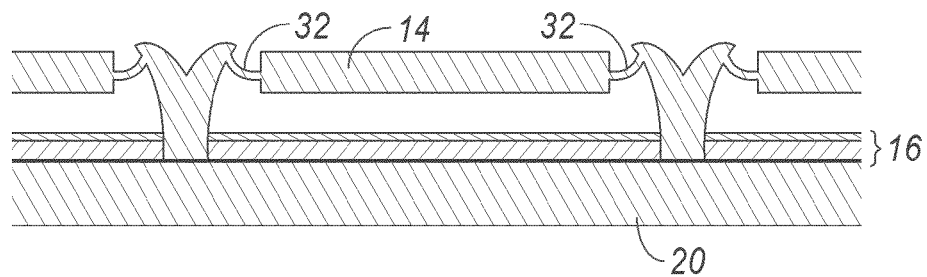
FIG. 7B is a cross section of an alternative embodiment of an interferometric modulator.
Figure 7C:
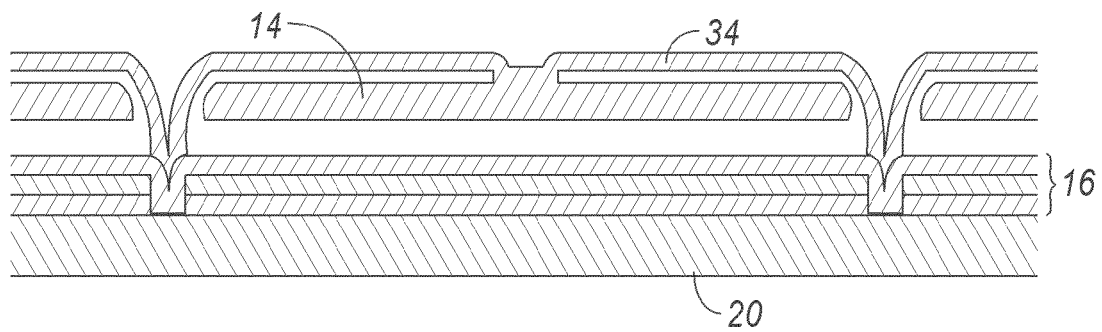
FIG. 7C is a cross section of another alternative embodiment of an interferometric modulator.
Figure 7D:
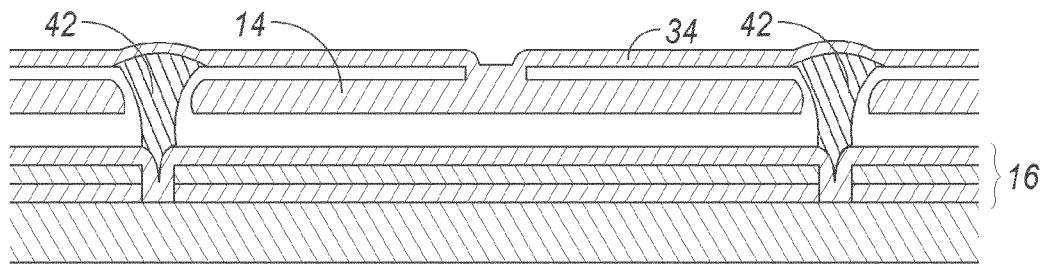
FIG. 7D is a cross section of yet another alternative embodiment of an interferometric modulator.
Figure 7E:
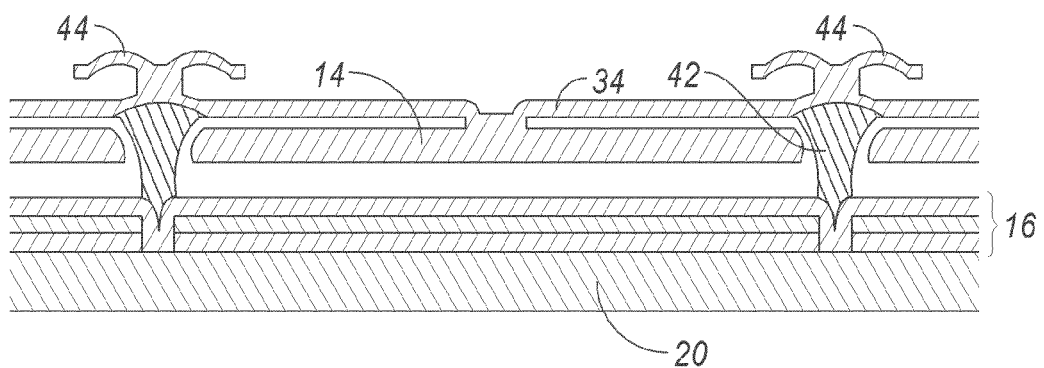
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In certain embodiments, the optical properties of the movable element are separated from both the electrical and mechanical properties of the movable element by disposing the actuation electrode laterally from the reflective surface of the reflective element. In such embodiments, the movable element is responsive to a voltage difference applied between the actuation electrode and the movable element by moving in a direction generally perpendicular to the top surface of the substrate. In particular, the deformable layer 34, rather than the reflective element 14, is attracted towards the actuation electrode by electrostatic forces. The reflective element 14 is mechanically coupled to the deformable layer 34 such that the reflective element 14 also moves in a direction generally perpendicular to the top surface of the substrate when the deformable layer 34 is attracted towards the actuation electrode. In certain embodiments, application of a voltage difference between the actuation electrode and the movable element causes displacement of the deformable layer 34 and displacement of the reflective surface of the reflective element 14 that is parallel to the displacement of the deformable layer 34.

Figure 8A:
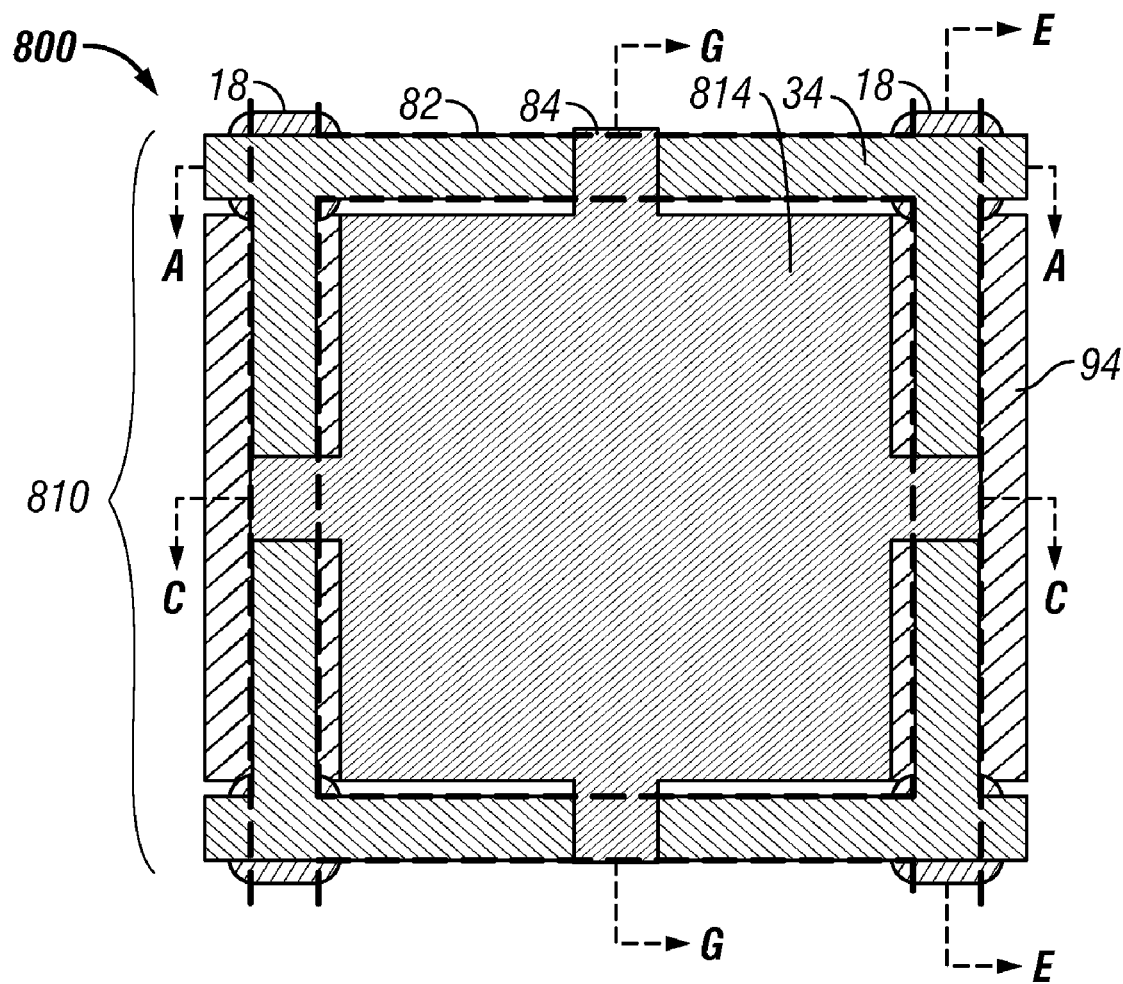
FIG. 8A is a top plan view of an example embodiment of a MEMS device.
Figure 9A:
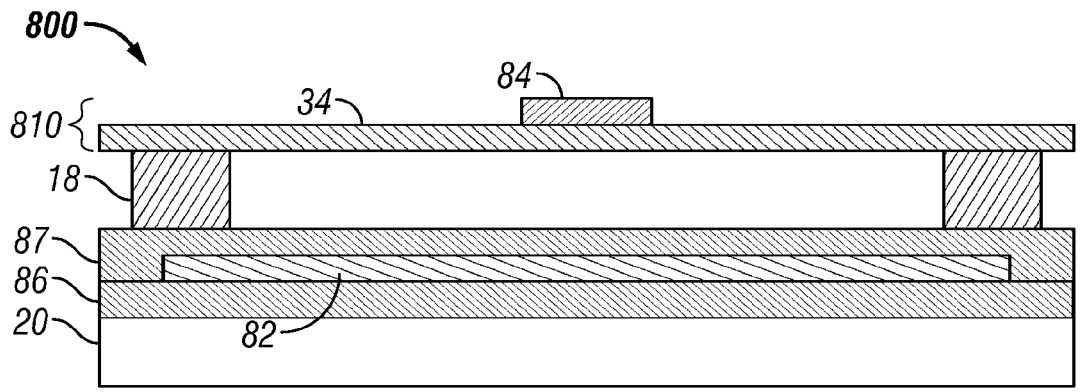
FIGS. 9A-9B are cross sections of an example embodiment of the MEMS device of FIG. 8A taken along line A-A.
Figure 9B:
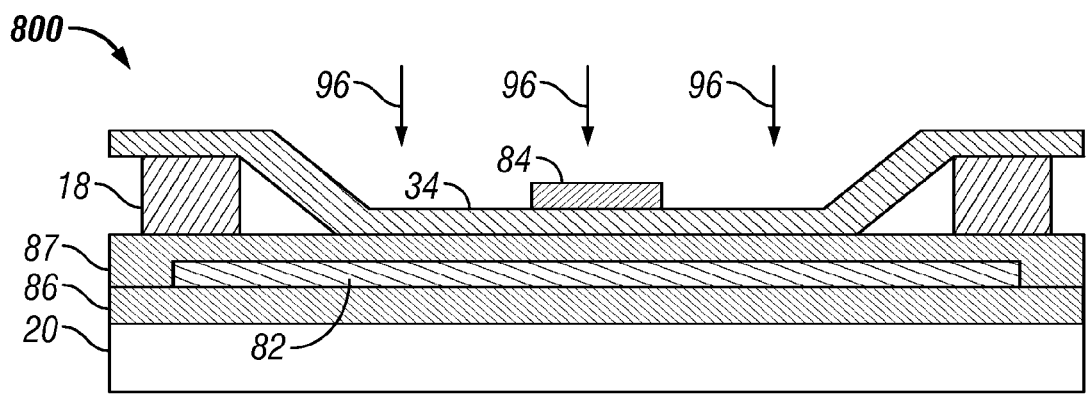
Figure 9C:
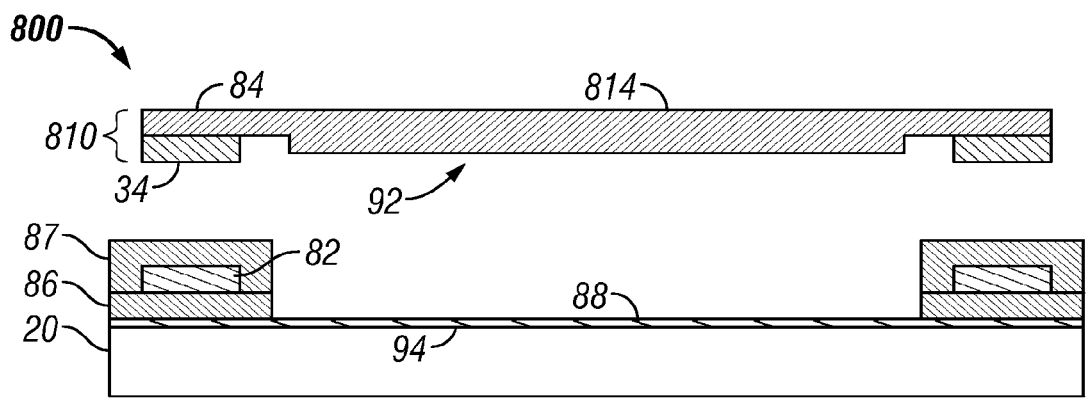
FIGS. 9C-9D are cross sections of the embodiment of FIGS. 9A-9B taken along line C-C of FIG. 8A.
Figure 9D:
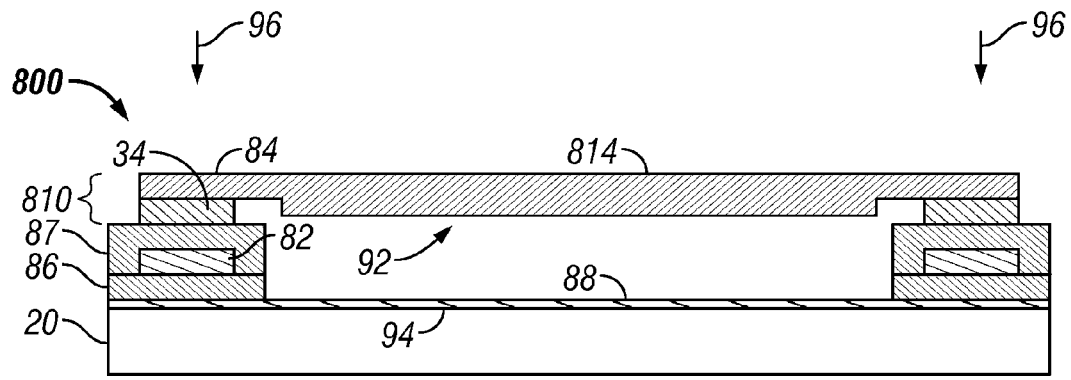
Figure 9E:
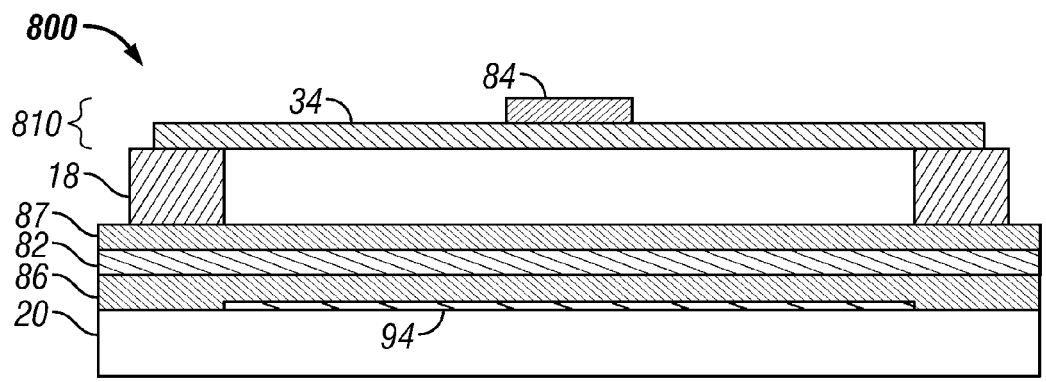
FIGS. 9E-9F are cross sections of the embodiment of FIGS. 9A-9D taken along line E-E of FIG. 8A.
Figure 9F:
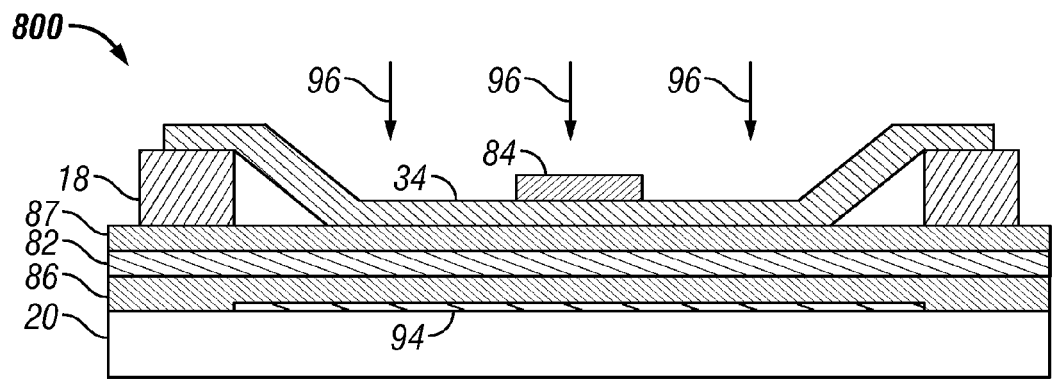
Figure 9G:
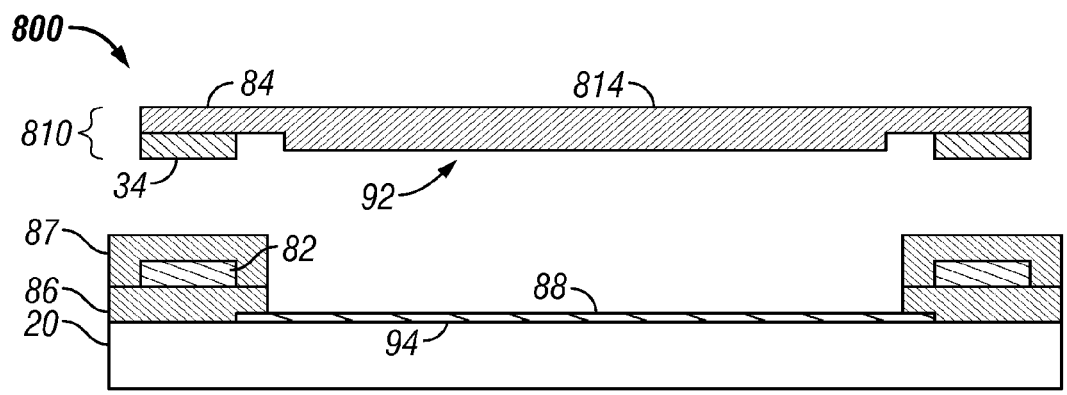
FIGS. 9G-9H are cross sections of the embodiment of FIGS. 9A-9F taken along line G-G of FIG. 8A.
Figure 9H:
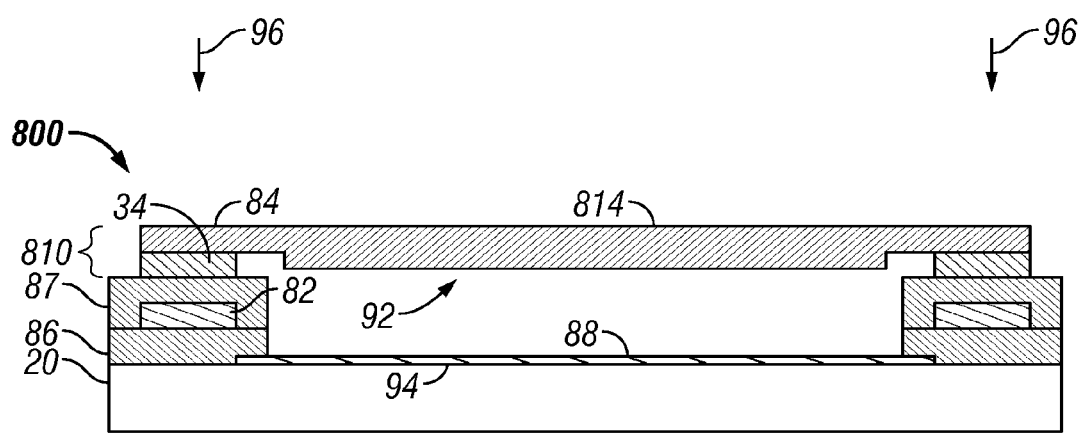

FIG. 8A illustrates a top view an example embodiment of a MEMS device 800 (e.g., an interferometric modulator) in which the optical properties of the movable element 810 are separated from both the electrical and mechanical properties of the movable element 810. FIGS. 9A-9H depict cross sections of an example embodiment of the MEMS device 800 of FIG. 8A. FIG. 9A is a cross section taken along line A-A, and FIG. 9C is a cross section taken along line C-C, when the MEMS device 800 is in an unactuated (or "relaxed") state. FIGS. 9B and 9D depict the cross sections along lines A-A and C-C, respectively, when the MEMS device 800 is in an actuated state. FIG. 9E is a cross section taken along line E-E, and FIG. 9G is a cross section taken along line G-G, when the MEMS device 800 is in an unactuated state. FIGS. 9F and 9H depict the cross sections along lines E-E and G-G, respectively, when the MEMS device 800 is in an actuated state.

The MEMS device 800 comprises a substrate 20 having a top surface 88, and a movable element 810 over the substrate 20. The movable element 810 comprises a deformable layer 34 and a reflective element 814 mechanically coupled to the deformable layer 34 and including a reflective surface 92. The MEMS device 800 further comprises an actuation electrode 82 disposed laterally form the reflective surface 92. The movable element 810 is responsive to a voltage difference applied between the actuation electrode 82 and the movable element 810 by moving in a direction generally perpendicular to the top surface 88 of the substrate 20.

In certain embodiments, the MEMS devices 800 may be used to modulate light (e.g., to interferometrically modulate light) by applying a voltage to the actuation electrode 82. The voltage generates an attractive force on the movable element 810, which causes the movable element 810 to move towards the actuation electrode 82.

The substrate 20 may comprise a material that is at least partially transparent or translucent and at least partially reflective, examples of which include, but are not limited to, glass or plastic. The substrate 20 may also be fabricated into a variety of forms, including, but not limited to, a homogeneous substance or a non-homogenous substance, or having a uniform thickness or a non-uniform thickness. The substrate 20 may also have several sublayers, a shorter expanse or region, or multiple expanses or regions. In certain embodiments, the substrate 20 includes an optical stack 16 as described above. For example, the substrate 20 may be integrated with the first reflective layer 94, a black mask (not shown), or other layers or structures.

As used herein, the phrase, "the top surface of the substrate" is a broad phrase including, but not limited to, the uppermost surface of the structure beneath the reflective surface 92 of the reflective element 814. For example and without limitation, the top surface 88 of the substrate 20 can be: the top surface of the substrate 20 itself, the top surface of the insulating layer 86, the top surface of the insulating layer 87 (e.g., as illustrated in FIGS. 10C, 10D, 11C, and 11D), the top surface of the first reflective layer 94 (e.g., as illustrated in FIGS. 9C, 9D, 9G, and 9H), or the top surface of a black mask. In certain embodiments, the top surface 88 of the substrate 20 is the top surface of one or more insulating structures (e.g., insulating or conductive bumps disposed on the actuation electrode 82 and/or the first reflective layer 94).

Figure 8B:
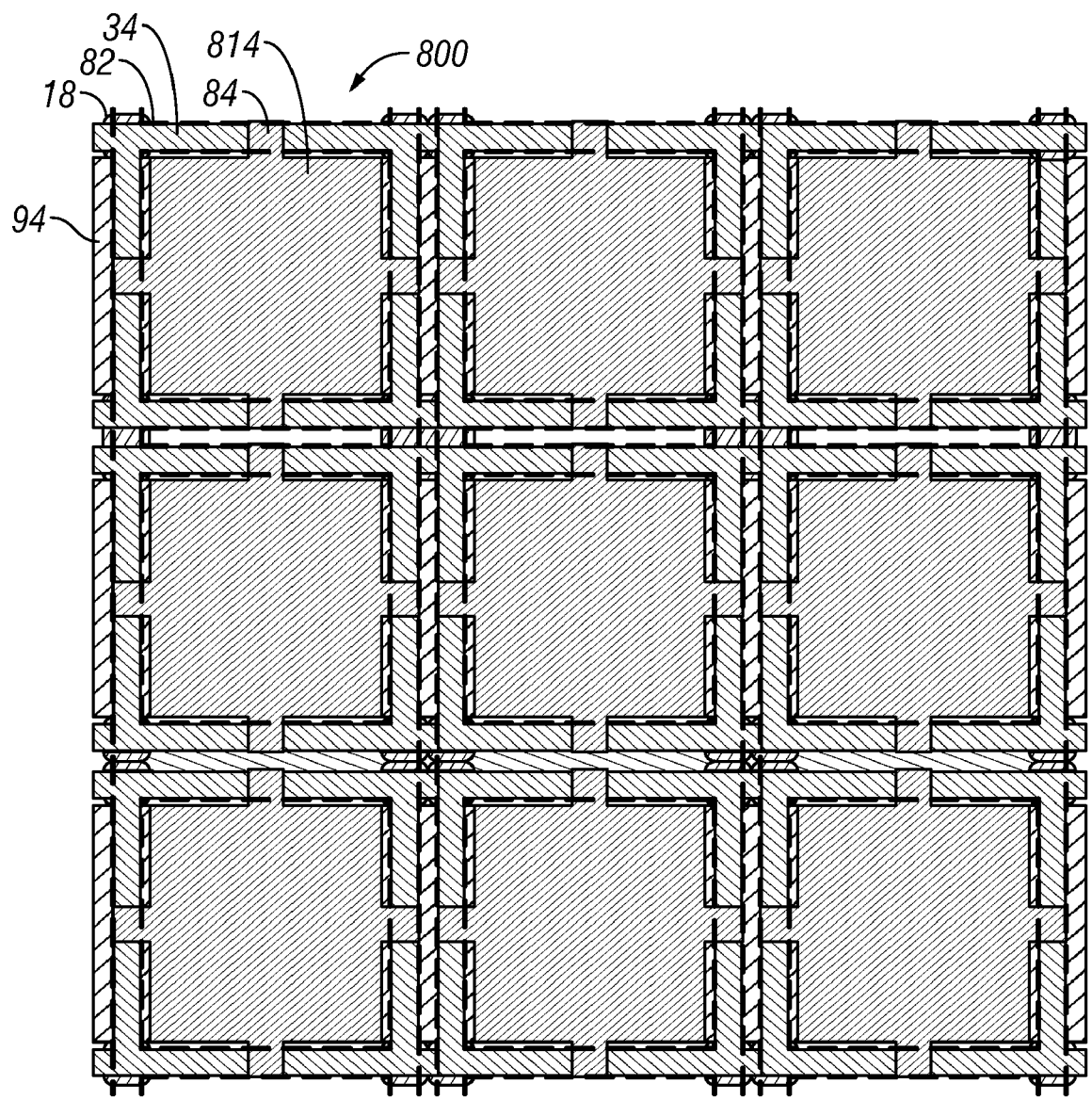
FIG. 8B is a top plan view of a 3×3 array of the MEMS device of FIG. 8A.

The deformable layer 34 preferably comprises a conductive and flexible material (e.g., nickel). In some embodiments, the deformable layer 34 extends across rows of MEMS devices 800 (e.g., as depicted in FIG. 8B) and the deformable layer 34 of a row of MEMS devices 800 is electrically isolated from the deformable layer 34 of other rows of MEMS devices 800 so as to effect the actuation protocol described above. In some embodiments, the deformable layer 34 extends across columns of MEMS devices 800 and the deformable layer 34 of a column of MEMS devices 800 is electrically isolated from the deformable layer 34 of other columns of MEMS devices 800 so as to effect the actuation protocol described above. The reflective surface 92 of the reflective element 814 preferably comprises a reflective material such as aluminum, although the reflective element 814 does not need to have any particular electrical properties. As used herein, the term "reflective surface" is a broad term including, but not limited to, the portion of the reflective element 814 configured to reflect light. In the embodiment illustrated in FIGS. 9A-9H, the movable element 810 comprises a reflective element 814 that is mechanically coupled to the top surface of the deformable layer 34. Other configurations are also possible (e.g., the embodiments illustrated in FIGS. 10A-11D).

In certain embodiments, the movable element 810 comprises one or more connecting elements 84, and the reflective element 814 is mechanically coupled to the deformable layer 34 by the one or more connecting elements 84. In some embodiments, the connecting element 84 comprises at least one protrusion that extends from the reflective element 814 and that is mechanically coupled to the deformable layer 34 (e.g., as depicted in FIG. 8A). The connecting element 84 preferably comprises a material that has suitable mechanical properties, but the connecting element 84 does not need to have any particular optical and/or electrical properties. For example, the connecting element 84 of certain embodiments comprises a material that has an internal stress and/or a coefficient of thermal expansion that is similar to the internal stress and/or coefficient of thermal expansion of the bulk of the reflective element 814. In certain embodiments, the connecting element 84 comprises a material that can fuse to the materials of the reflective element 814 and the deformable layer 34. In certain embodiments, a layer of aluminum comprises the connecting element 84 and the reflective surface 92 of the reflective element 814.

In some embodiments, the deformable layer 34 is supported by posts 18. The posts 18 preferably comprise oxide (e.g., $SiO_2$), but may comprise any suitably rigid material. Although the deformable layer 34 illustrated in FIGS. 9A-9H is supported by the posts 18 in a similar manner as in the deformable layer 34 of FIGS. 7A and 7D, it will be appreciated that the configuration of the deformable layer 34 may correspond to the embodiments illustrated in FIGS. 7B, 7C, and 7E or other configurations.

The actuation electrode 82 is illustrated by dashed lines in FIGS. 8A and 8B to indicate that, in some embodiments, at least a portion of the actuation electrode 82 is under at least a portion of the deformable layer 34 (e.g., as illustrated in the cross sections of FIGS. 9A-9H). In certain embodiments, the MEMS device 800 comprises a plurality of actuation electrodes 82 (e.g., at least a portion of each of the actuation electrodes 82 under at least a portion of the deformable layer 34). The actuation electrode 82 is preferably covered by (e.g., encapsulated in) insulating layers 86, 87 (e.g., comprising $SiO_2$) such that the actuation electrode 82 is insulated from the movable element 810 and the first reflective layer 94. The insulating layers 86, 87 may comprise the same material (e.g., $SiO_2$) or different materials (e.g., $SiO_2$ and $Al_2O_3$). The actuation electrode 82 may be connected between columns of MEMS devices 800 (e.g., as depicted in FIG. 8B) or between rows of MEMS devices 800 so as to effect the actuation protocol described above.

The actuation electrode 82 is disposed laterally from the reflective surface 92 of the reflective element 814, so the actuation electrode 82 may advantageously comprise an opaque conductor rather than the transparent conductors such as ITO described above. Moreover, the use an opaque actuation electrode 82 allows formation of the actuation electrode 82 using materials that have a lower resistance than transparent conductors, thereby reducing power consumption and response time $\tau$. For example, the actuation electrode 82 may comprise nickel, aluminum, copper, silver, gold, and alloys thereof. Furthermore, by laterally disposing the actuation electrode 82 from the reflective surface 92, in certain embodiments, better contrast ratios can advantageously be provided as compared to embodiments in which a transparent conductor is disposed within the optical path.

Certain transparent conductors such as ITO are sensitive to high temperature processes, such that the maximum processing temperature of the MEMS device is limited after formation of the actuation electrode 902. For example, ITO degrades at temperatures around 350° C. and higher, increasing the resistivity of an actuation electrode comprising ITO. As such, certain processes (e.g., chemical vapor deposition (CVD) greater than 350° C.) are not typically performed on structures comprising ITO. However, MEMS devices comprising an actuation electrode 82 laterally disposed from the reflective surface 92 may have an actuation electrode 82 comprising a variety of conductors that can withstand high temperature processing, which increases process flexibility for components of the MEMS device 800. For example, certain depositions (e.g., deposition of the support structures 18) can be performed at high temperatures. For another example, certain deposition processes may be CVD rather than physical vapor deposition (PVD) (e.g., sputter), which can enhance deposition conformality and uniformity.

The thickness of an actuation electrode in the optical path is limited in order to avoid adversely impacting the optical properties of the MEMS device, but an actuation electrode 82 that is laterally disposed from the reflective surface 92 may have a variety of thicknesses because it is not in the optical path. Increasing the thickness of the actuation electrode can, for example, advantageously increase conductivity, thereby reducing response time and/or power consumption of the MEMS device. Moreover, thick actuation electrodes 82 enable the use of alternative deposition methods (e.g., coating, inkjet printing, printable conductors), which can lower manufacturing costs.

Referring again to FIG. 8A, the reflective surface 92 of the reflective element 814 is disposed laterally from the actuation electrode 82. By contrast to the MEMS devices described above with respect to FIGS. 7A-7E, the portion of the movable element 810 that experiences electrical attraction due to electrostatic forces does not modulate light. In some embodiments, a black mask (not shown) is disposed on the substrate 20 (e.g., between the substrate 20 and the actuation electrode 82) in the portions of the MEMS device 800 in which the movable element 810 experiences electrical attraction to prevent undesired modulation of light. In some embodiments, a black mask (not shown) is disposed on the substrate 20 in areas not covered by the reflective element 814 (e.g., under the support structures 18, between the actuation electrode 82 and the reflective surface 92), for example to minimize the reflectance of areas that do not modulate light, thereby improving contrast ratio.

As described above, the deformable layer 34 comprises a flexible material that can be attracted towards the actuation electrode 82 by electrostatic forces. Thus, when a voltage is applied to the actuation electrode 82, electrostatic forces attract the deformable layer 34 towards the actuation electrode 82, which in the illustrated embodiment is also towards the substrate 20. In response to the attractive forces, the portions of the deformable layer 34 not supported by the posts 18 are deflected in the direction of the arrows 96 (e.g., as depicted in FIGS. 9B, 9D, 9F, and 9G). The reflective element 814 is mechanically coupled to the deformable layer 34, so it also moves in the direction of the arrows 96 in response to voltages applied to the actuation electrode 82. Thus, the movable element 810 moves in a direction generally perpendicular to the top surface 88 of the substrate 20.

FIG. 8B illustrates a 3×3 array of MEMS devices 800 of FIG. 8A. The deformable layers 34 are connected in a row from left to right and the actuation electrodes 82 are connected in a column from top to bottom so as to effect the actuation protocol described above. In certain embodiments, the actuation electrodes 82 are connected in a row from left to right and the deformable layers 34 are connected in a column from top to bottom. In some embodiments, the support structure 18 supports the deformable layer 34 of a plurality of MEMS devices 800 (e.g., as illustrated between the top row and the middle row). In some embodiments, the support structure 18 supports the deformable layer 34 of one MEMS device 800 (e.g., as illustrated between the middle row and the bottom row). In some embodiments, a portion of the actuation electrode 82 extending between rows of MEMS devices 800 is substantially only under the deformable layer 34 (e.g., as illustrated between the top row and the middle row). In some embodiments, a portion of the actuation electrode 82 extending between rows of MEMS devices 800 is substantially under the deformable layer 34 and areas between the deformable layers 34 (e.g., as illustrated between the middle row and the bottom row).

In the embodiment illustrated in FIGS. 9A-9H, the reflective element 814 is mechanically coupled to the top surface of the deformable layer 34. However, other coupling methods are also possible.

Figure 10A:
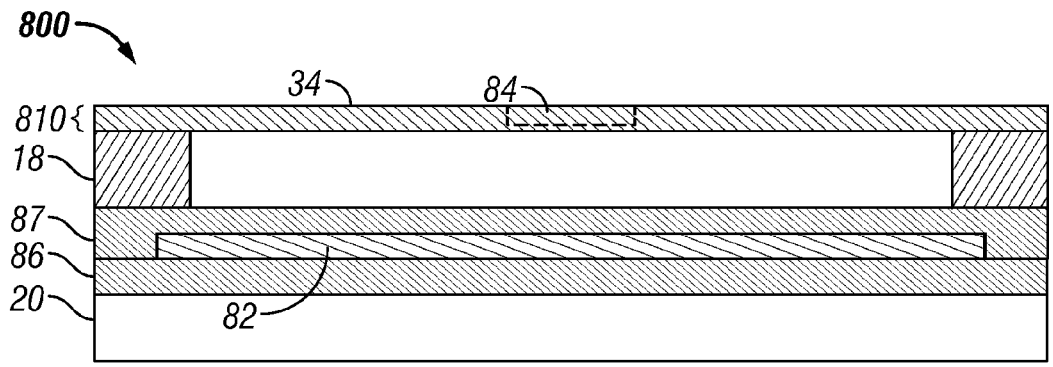
FIGS. 10A-10B are cross sections of another example embodiment of the MEMS device of FIG. 8A taken along line A-A.
Figure 10B:
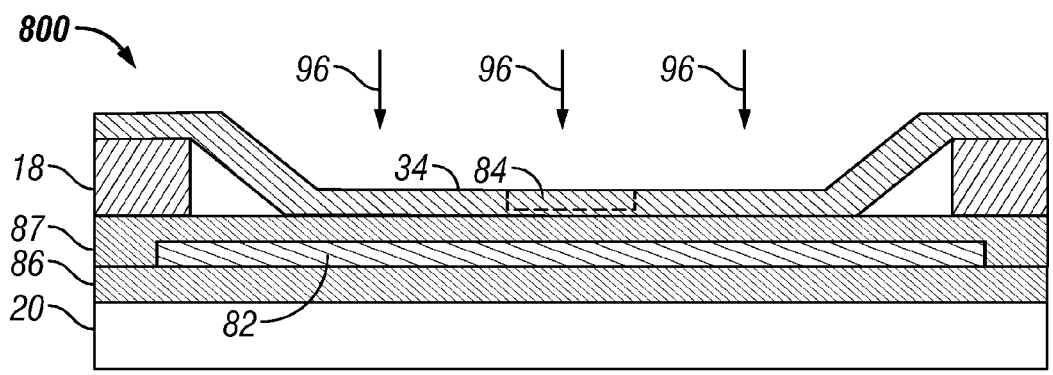
Figure 10C:
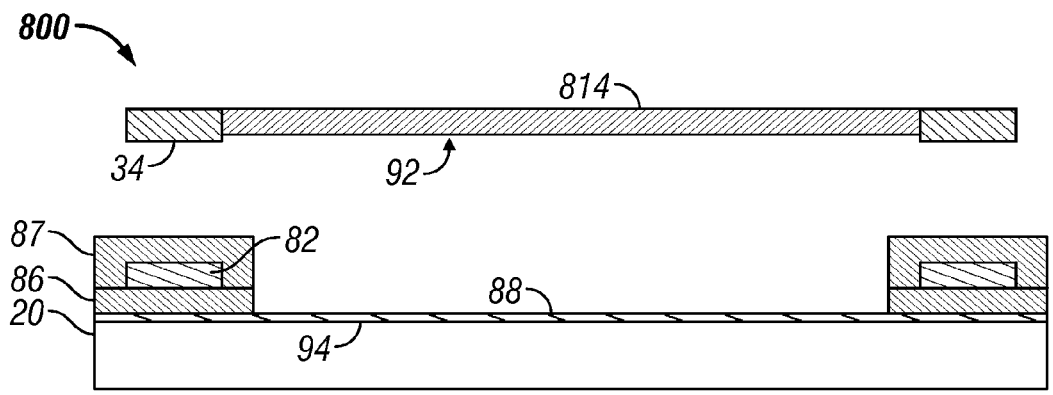
FIGS. 10C-10D are cross sections of the embodiment of FIGS. 10A-10B taken along line C-C of FIG. 8A.
Figure 10D:
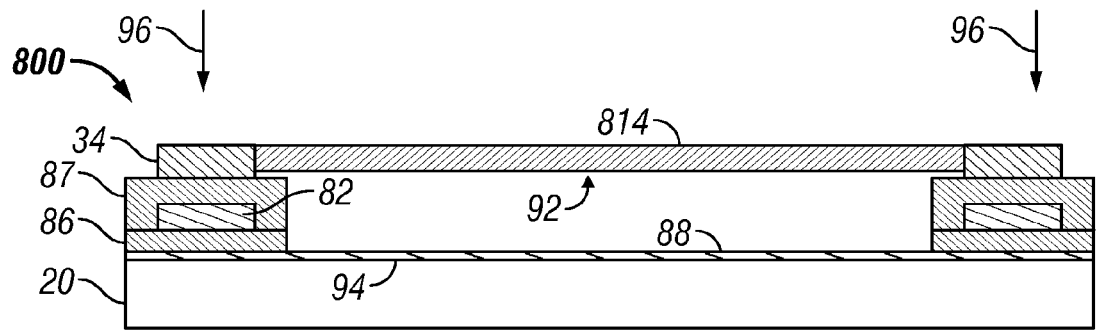

FIG. 10A is a cross section of another example embodiment of a MEMS device 800 such as taken along line A-A of FIG. 8A, and FIG. 10C is a cross section such as taken along line C-C of FIG. 8A, when the MEMS device 800 is in an unactuated state. FIGS. 10B and 10D depict the cross sections along lines A-A and C-C, respectively, when the MEMS device 800 is in an actuated state. In the plan view illustrated in FIG. 8A, the connecting elements 84 overlap the deformable layer 34. However, in the embodiment illustrated in FIGS. 10A-10D, an edge or side of the reflective element 814 is mechanically coupled to an edge or side of the deformable layer 34 via a connecting element 84 that abuts, but does not overlap the deformable layer 34. The dashed line in FIG. 10B illustrates an area of contact between the deformable layer 34 and the connecting element 84 behind the deformable layer 34. Other embodiments are also possible. For example, a plurality of sides of the connecting element 84 may abut a plurality of sides of the deformable layer 34. The movable element 810 is configured such that the reflective surface 92 of the reflective element 814 does not contact the top surface 88 of the substrate 20 when the MEMS device 800 is in the actuated state (e.g., as depicted in FIG. 10D). For example, the reflective element 814 may be thinner than the deformable layer 34 such that the deformable layer 34 contacts the top surface 88 of the substrate 20 while the reflective surface 92 does not (e.g., as illustrated in FIGS. 10C and 10D), or the deformable layer 34 may be specially shaped (e.g., having a vertically raised portion) to avoid contact between the reflective surface 92 and the top surface 88 of the substrate 20. The cross sections such as taken along lines E-E and G-G of FIG. 8A would be apparent to one of skill in the art based on the cross sections of FIGS. 10A-10D and 9A-9H.

Figure 11A:
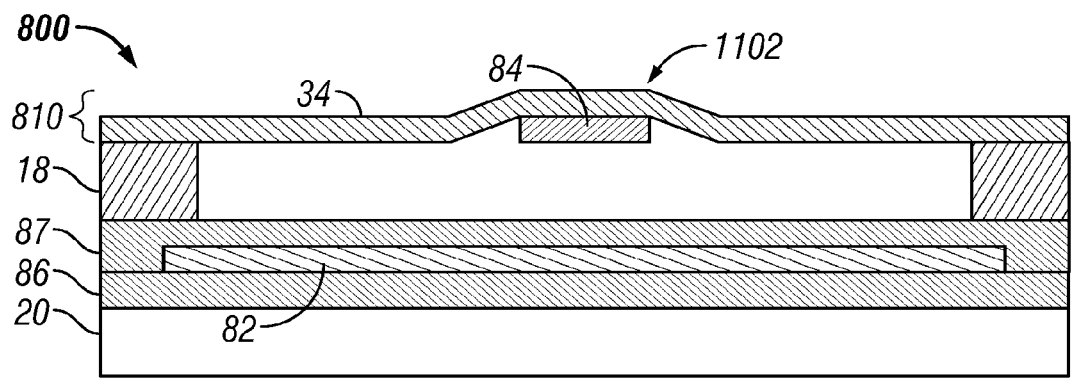
FIGS. 11A-11B are cross sections of yet another example embodiment of the MEMS device of FIG. 8A taken along line A-A.
Figure 11B:
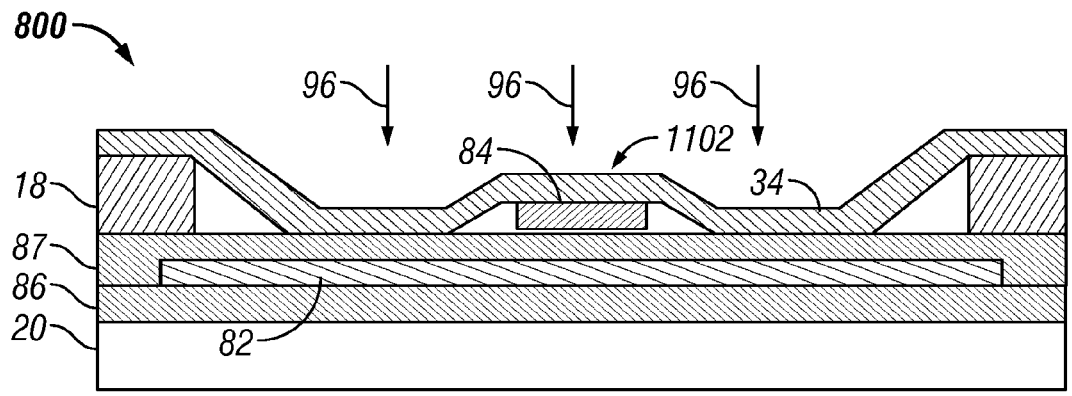
Figure 11C:
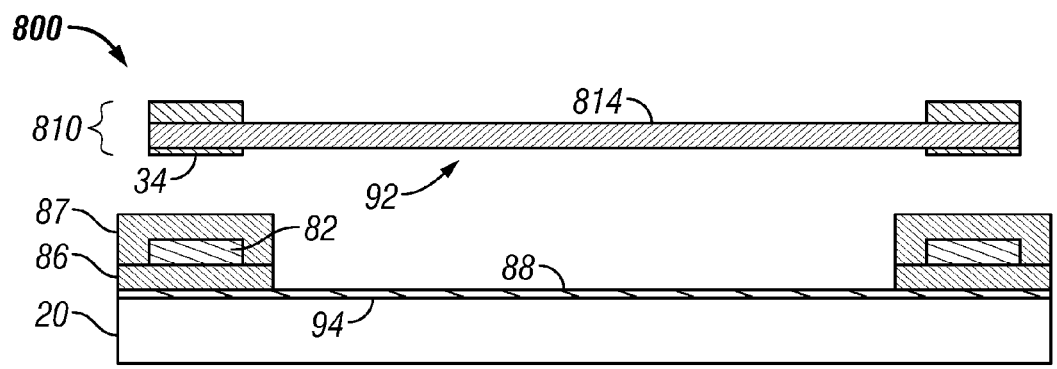
FIGS. 11C-11D are cross sections of the embodiment of FIGS. 11A-11B taken along line C-C of FIG. 8A.
Figure 11D:
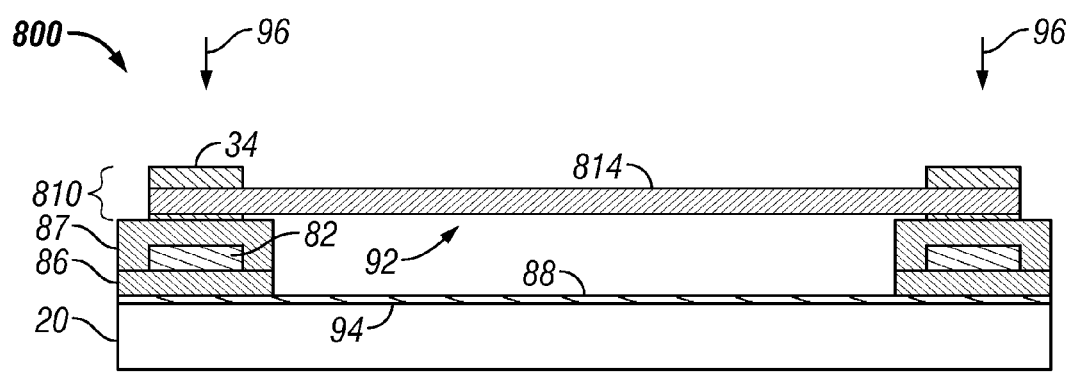

FIG. 11A is a cross section of another example embodiment of a MEMS device 800 taken along line A-A of FIG. 8A, and FIG. 11C is a cross section taken along line C-C, when the MEMS device 800 is in an unactuated state. FIGS. 11B and 11D depict the cross sections along lines A-A and C-C, respectively, when the MEMS device 800 is in an actuated state. The cross sections along lines E-E and G-G would be apparent to one of skill in the art based on the cross sections of FIGS. 9E-9H. The reflective element 814 is mechanically coupled to the bottom surface of the deformable layer 34. However, the movable element 810 is configured such that the reflective surface 92 of the reflective element 814 does not contact the top surface 88 of the substrate 20 when the MEMS device 800 is in the actuated state. For example, the deformable layer 34 may include a vertically raised portion 1102 that is coupled to the reflective element 814 (e.g., as illustrated in FIGS. 11A and 11B). Other configurations are also possible.

The deformable layer 34 of the MEMS device 800 of FIGS. 9A-9H is configured such that it contacts a stationary portion of the MEMS device 800 (e.g., the top surface 88 of the substrate 20, the top surface of an insulating layer 87) when the MEMS device 800 is in an actuated state. However, as illustrated in FIGS. 9C, 9D, 9G, and 9H, the reflective surface 92 of the reflective element 814 does not contact the top surface 88 of the substrate 20 in either the relaxed or actuated states, respectively. A distance between the reflective surface 92 of the reflective element 814 and the top surface 88 of the substrate 20 is greater than a distance between the deformable layer 34 and the top surface 88 of the substrate 20. Embodiments in which the reflective surface 92 of the movable element 810 does not contact the top surface 88 of the substrate 20 advantageously provide a reduced risk for stiction due to the smaller mechanical contact area between the deformable layer 34 and the top surface 88 of the substrate 20. Reduced risk for stiction allows the use of a lower spring constant for the deformable layer 34 because the mechanical forces only overcome the adhesion forces of the small contact area between the deformable layer 34 and the stationary portion in the actuated state (e.g., to relax the MEMS device 800). The use of a lower spring constant for the deformable layer 34 allows a lower amount of electrostatic force to be used to overcome the mechanical forces in the relaxed state (e.g., to actuate the MEMS device 800). A lower amount of electrostatic forces used for actuation of the MEMS device 800 allows a smaller capacitor to be used. Thus, certain such embodiments enable fast and low power operation of the MEMS device 800, even for large reflective elements 814, because the capacitance of the MEMS device 800 due to the overlapping area of the actuation electrode 82 and the deformable layer 34 is smaller than embodiments in which a larger portion of the movable element 810 interacts with the actuation electrode 82 to produce the electrostatic attractive force. Moreover, the dimensions of the reflective element 814 are advantageously independent of the dimensions of the mechanical and electrical elements (e.g., the deformable layer 34 and the actuation electrode 82) because the reflective element 814 does not contact the top surface 88 of the substrate 20 and because the reflective element 814 is not operationally attracted by electrostatic forces upon actuation. Furthermore, the reflective surface 92 of the reflective element 814 may be smooth and flat because the risk of stiction is greatly reduced when the reflective surface 92 does not contact the top surface 88 of the substrate 20 in either the actuated or unactuated state of the MEMS device 800. A smoother and flatter reflective surface 92 can advantageously improve color gamut.

In embodiments in which the reflective surface 92 and the top surface 88 are flat (e.g., to enhance color gamut), stiction between the surfaces may disadvantageously affect operation of MEMS devices in which they contact. Certain features, such as surface roughening and anti-stiction layers, may be used to reduce such stiction, but those features can adversely impact the optical performance of the MEMS device. However, in embodiments in which the deformable layer 34 contacts the stationary portion (e.g., as depicted in FIGS. 9B and 9D), an actuation electrode 82 laterally disposed from the reflective surface 92 allows a lower surface of the deformable layer 34 and/or an upper surface of the stationary portion not in the optical path to be adapted to reduce stiction without impacting optical performance. For example, the surface topography of the surfaces may be roughened to reduce the number of contact points or an anti-stiction layer may be formed therebetween.

The reflective element 814 and the first reflective layer 94 are preferably at the same potential in order to decrease any electrostatic forces or electric field therebetween that may cause arcing. In certain embodiments, the reflective element 814 is in electrical communication with the first reflective layer 94 through the deformable layer 34 such that they are at the same potential. In certain embodiments, the reflective element 814 is insulated from the deformable layer 34 (e.g., using a dielectric connecting element 84) and the first reflective layer 94 is also insulated, such that they are at the same potential.

Figure 12A:
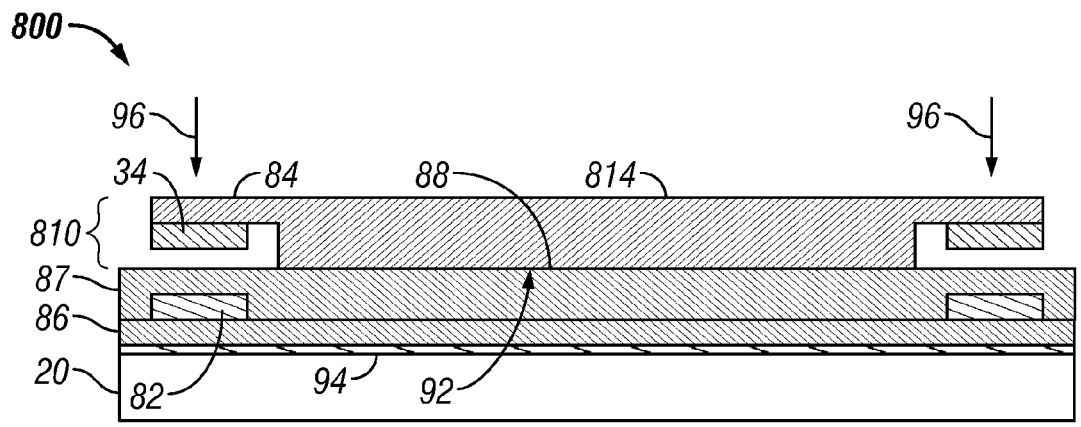
FIGS. 12A-12C are cross sections of still another example embodiments of the MEMS device taken along line C-C of FIG. 8A.
Figure 12B:
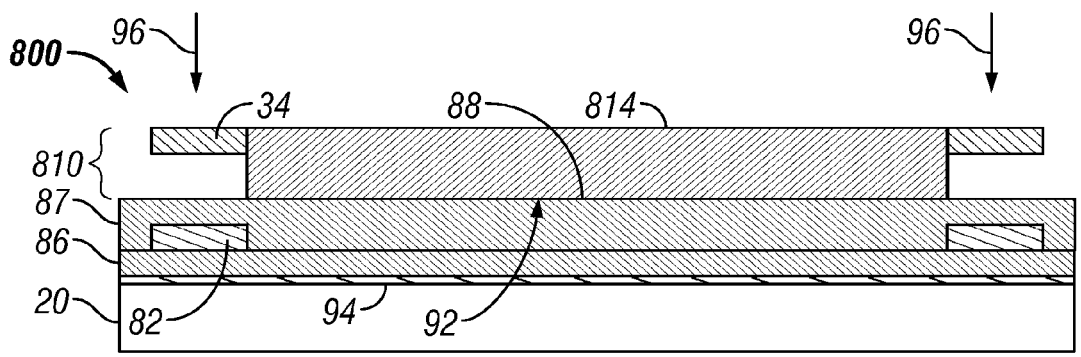
Figure 12C:
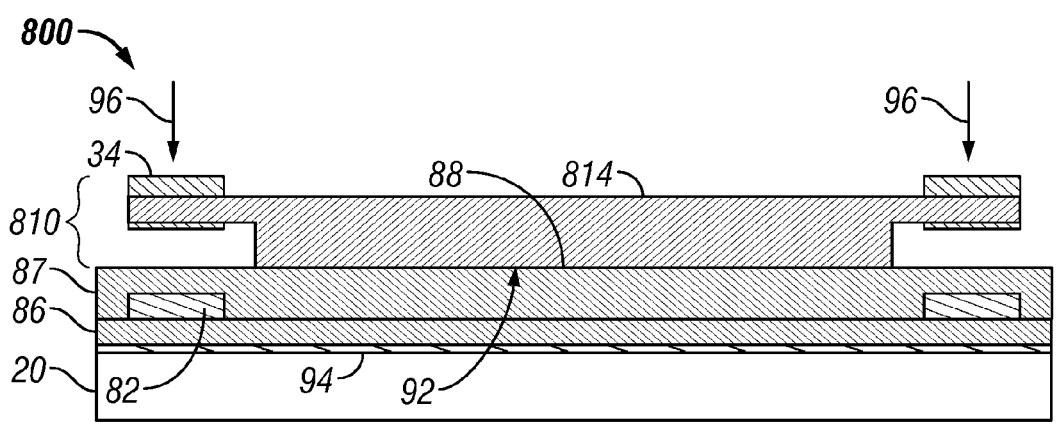

Embodiments in which a distance between the deformable layer 34 and the top surface 88 of the substrate 20 is greater than a distance between the reflective surface 92 of the reflective element 814 and the top surface 88 of the substrate 20 are also possible. FIGS. 12A-12C illustrate embodiments similar to FIGS. 9D, 10D, and 11D, respectively, except that the reflective surface 92 of the reflective element 814 contacts the top surface 88 of the substrate 20 when the MEMS device 800 is in the actuated state. In certain embodiments, contact between the reflective surface 92 and the top surface 88 of the substrate 20 allows the MEMS device 800 to be used for applications in which the MEMS device 800 desirably produces low reflectivity (i.e., darker) black. If the top surface 88 of the substrate 20 comprises an insulating layer 87 having a thickness between about 90 and 110 nm (e.g., about 100 nm), the MEMS devices 800 can produce low reflectivity black when the reflective surface 92 is touching the top surface 88 of the substrate 20. In certain embodiments, contact between the reflective surface 92 and the top surface 88 of the substrate 20 allows the MEMS device 800 to be used for applications in which the MEMS device 800 desirably produces high reflectivity broadband white. If the top surface 88 of the substrate 20 comprises the first reflective layer 94 (e.g., with no insulating layer 87 or with an insulating layer 87 having a thickness of less than about 100 Å), the MEMS device 800 can produce high reflectivity broadband white when the reflective surface 92 is touching or is spaced less than about 100 Å (e.g., by touching an insulating layer 87 having a thickness of less than about 100 Å) from the first reflective layer 94. In certain such embodiments, the reflective element 814 and the first reflective layer 94 are at the same potential in order to reduce the chance of arcing. In certain embodiments, such contact may simplify fabrication of the MEMS device 800.

Low reflectivity black and high reflectivity broadband white may also be produced using the MEMS devices illustrated in FIGS. 9D, 10D, and 11D in embodiments in which the top surface 88 of the substrate 20 comprises the first reflective layer 94 and in which the reflective surface 92 is spaced from the top surface 88 of the substrate 20 by less than about 100 Å or between about 90 nm and 110 nm (e.g., about 100 nm).

Figure 13A:
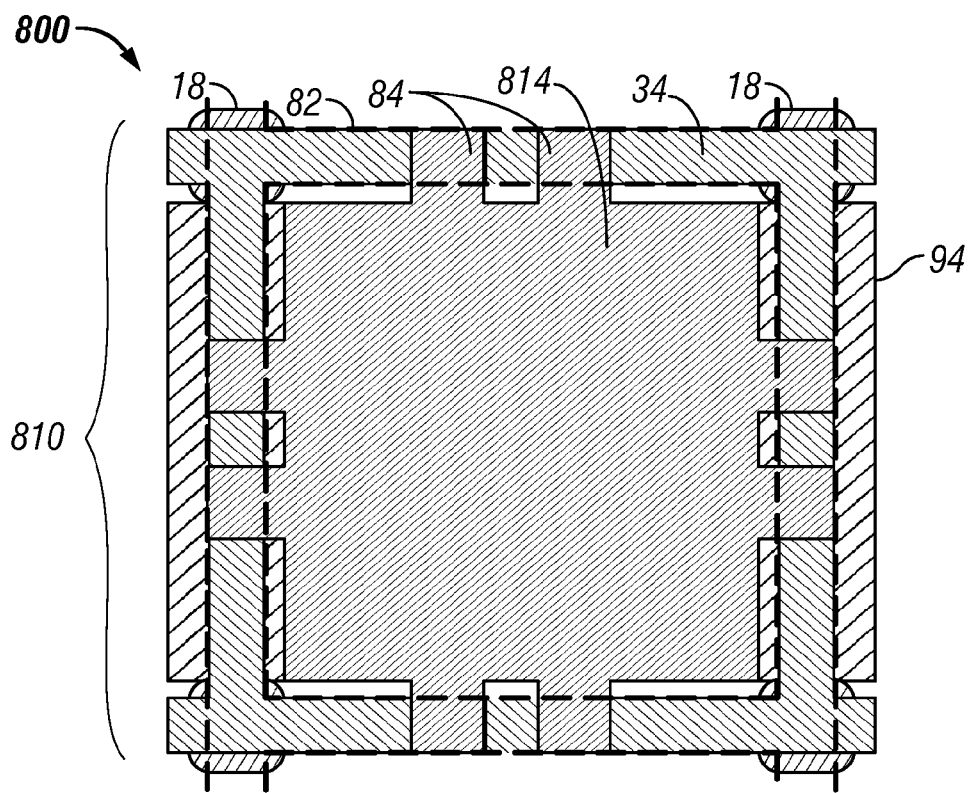
FIGS. 13A-13B are top plan views of yet still other example embodiments of MEMS devices.
Figure 13B:
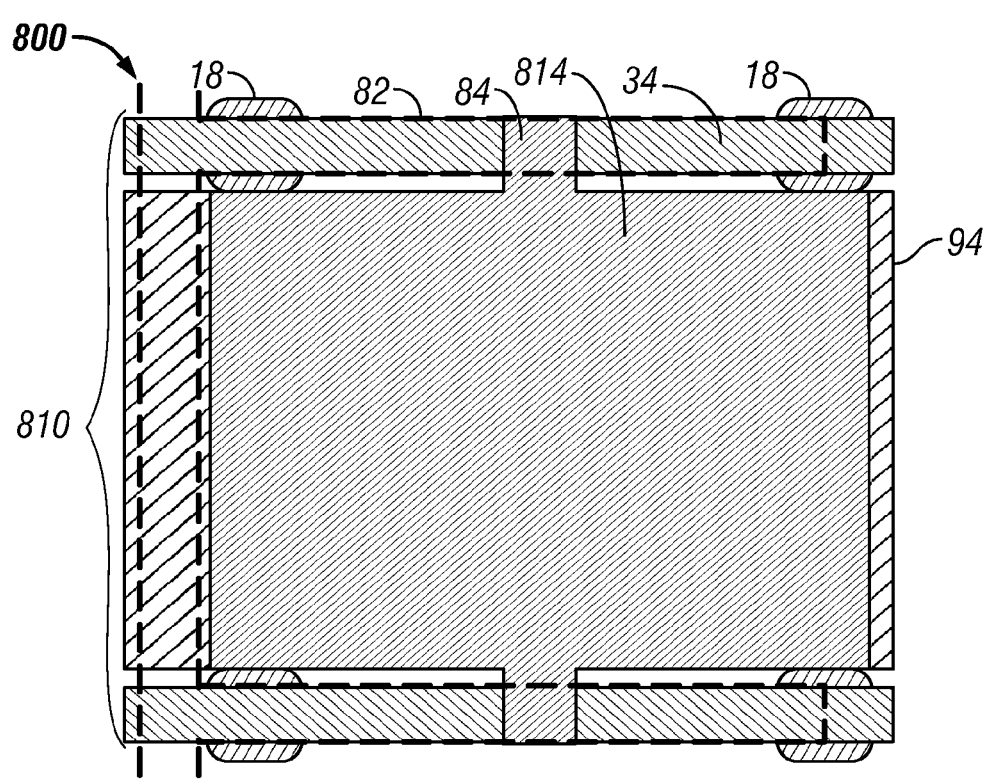

In the embodiment of FIG. 8A, the reflective element 814 has a plurality of edges (e.g., four edges) and is mechanically coupled to the deformable layer 34 by at least one connecting element 84 at each of the edges of the reflective element 814 (e.g., four connecting elements 84, one for each of the four edges). FIGS. 13A, 13B, and 13D illustrate additional example embodiments of MEMS devices 800 in which the actuation electrode 82 is disposed laterally from the reflective surface 92 of the reflective element 814. In FIG. 13A, the MEMS device 800 comprises a plurality of connecting elements 84 (e.g., two) on each edge of the reflective element 814 and that mechanically couple the reflective element 814 to the deformable layer 34.

In FIG. 13B, the MEMS device 800 comprises a pair of connecting elements 84, each mechanically coupling a side of the reflective element 814 to the deformable layer 34. Moreover, in the embodiment of FIG. 13B, the MEMS device 800 comprises an actuation electrode 82, at least a portion of which is under at least a portion of the deformable layer 34. In such embodiments, the connecting element 84 is preferably configured such that the reflective element 814 is substantially parallel to the top surface 88 of the substrate 20 (e.g., by mechanically coupling a first connecting element 84 to a first edge of the reflective element 814 and mechanically coupling a second connecting element 84 to a second edge of the reflective element 814 that is substantially opposite the first edge). Such embodiments may also enable a larger "fill factor" (i.e., the effective area of the reflective surface 92 versus the total area of the MEMS device 800) because reflective elements 814 of neighboring MEMS devices 800 in an array of MEMS devices 800 may be placed in close proximity to each other across each row.

Figure 13C:
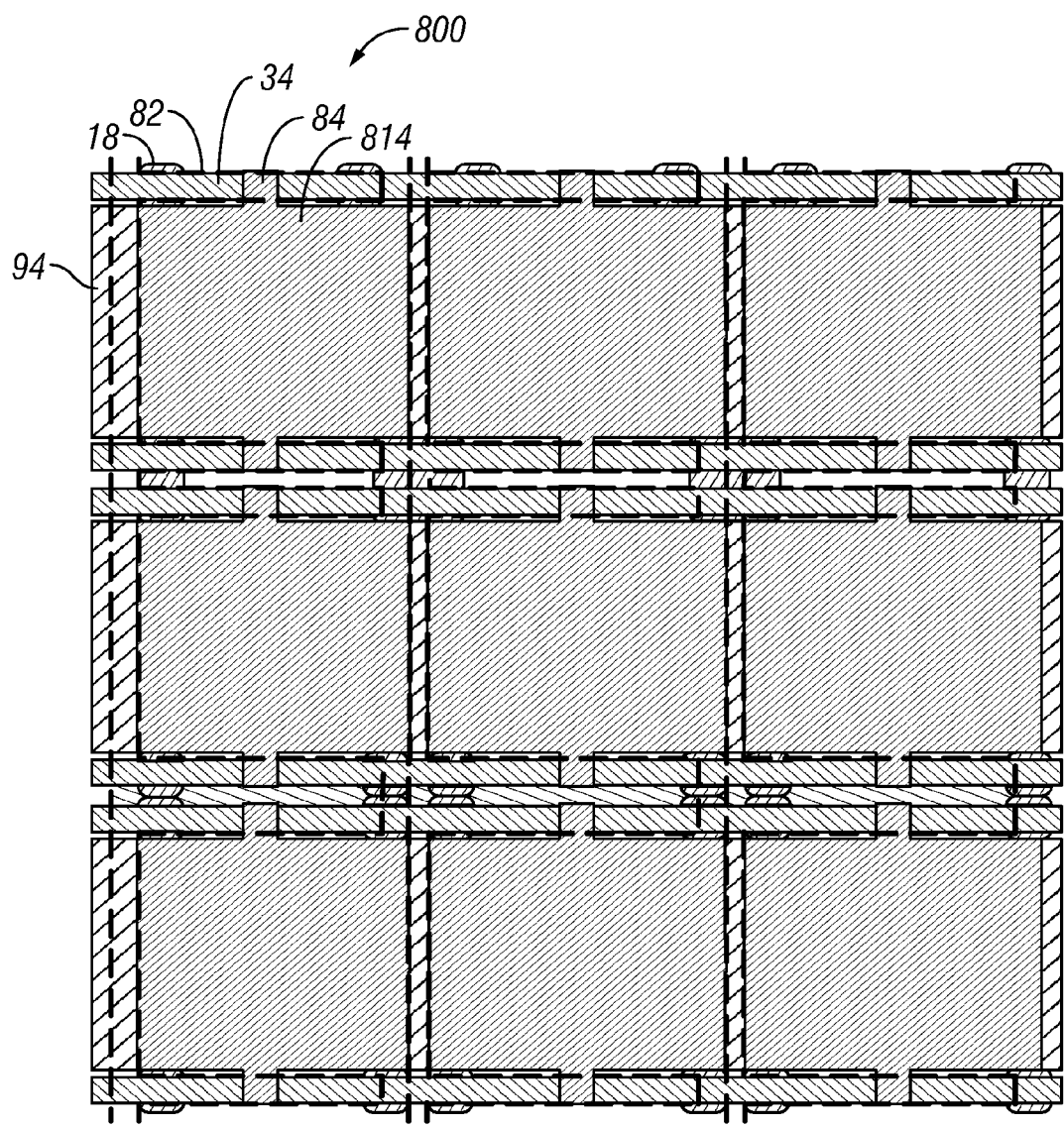
FIG. 13C is a top plan view of a 3×3 array of the MEMS device of FIG. 13A.
Figure 13D:
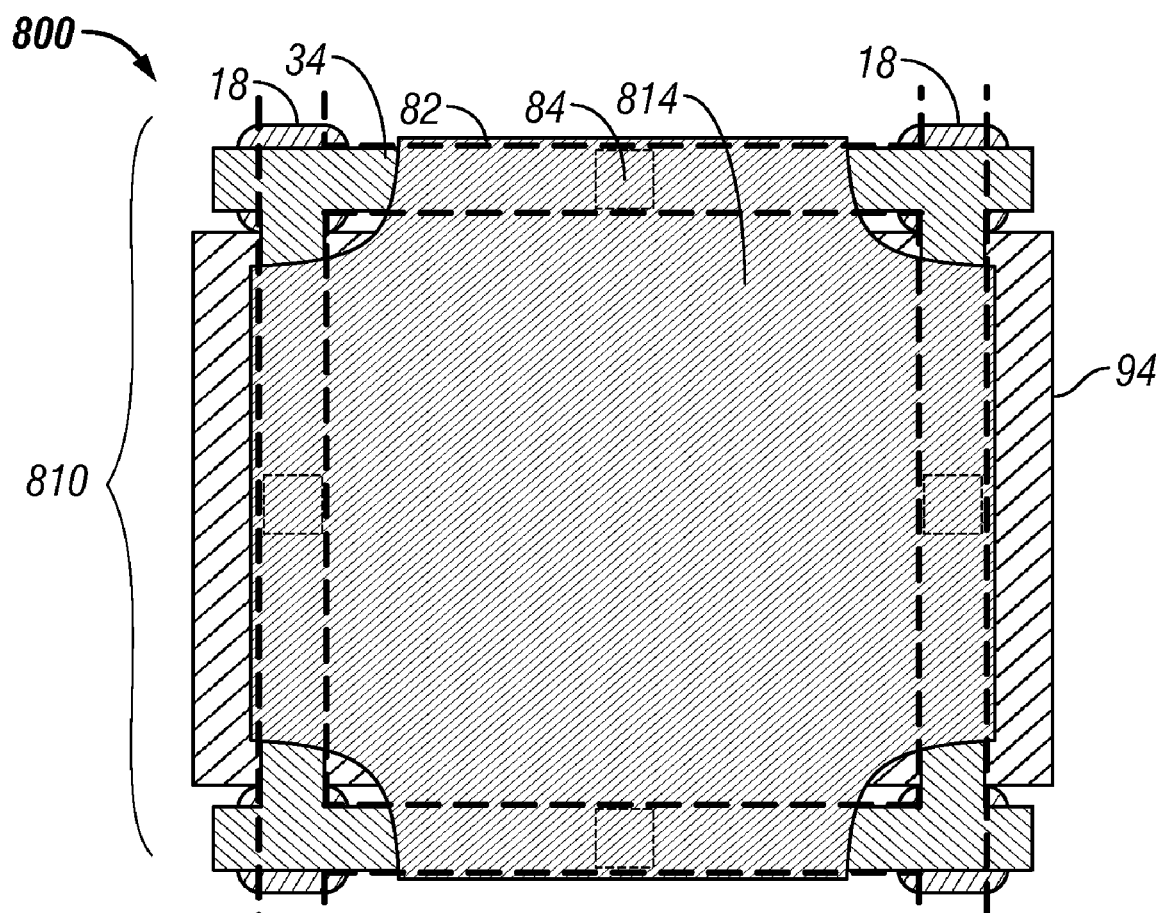
FIG. 13D is a top plan view of a further example embodiment of a MEMS device.

FIG. 13C illustrates a 3×3 array of MEMS devices 800 of FIG. 13B. The deformable layers 34 are connected in a row from left to right and the actuation electrodes 82 are connected in a column from top to bottom so as to effect the actuation protocol describe above. However, the actuation electrode 82 for each MEMS device 800 is only on a single side in the column direction such that a column of actuation electrodes 82 form an E-like structure. When the actuation electrode 82 is connected in rows on one side of the reflective element 814, the space previously used to connect the actuation electrode 82 on the other side of the reflective element 814 (e.g., as illustrated in FIG. 8B) can be used for the reflective element 814 of the adjacent MEMS device 800. The MEMS devices 800 in the array of FIG. 13C are thus closer together than the MEMS devices 800 in the array of FIG. 13B, and the array of FIG. 13C thereby has a higher fill factor than the array of FIG. 8B.

In the MEMS device 800 illustrated in FIG. 8A, the reflective surface 92 is spaced from the deformable layer 34 along a direction generally parallel to the top surface 88 of the substrate 20. FIG. 13D illustrates another embodiment of the MEMS device 800 in which the reflective surface 92 is spaced from the deformable layer 34 along a direction generally parallel to the top surface 88 of the substrate 20, but in which the reflective element 814 extends over the deformable layer 34. The plurality of connecting elements 84 comprise vertical elements (illustrated as dotted lines at the point of contact below the reflective element 814) that space the deformable layer 34 from the reflective element 814. The portions of the reflective element proximate to the posts (e.g., the corners of the reflective element 814 illustrated in FIG. 13D) are shaped such that the reflective element 814 does not contact the deformable layer 34 upon actuation of the MEMS device 800. In certain embodiments, by laterally extending the reflective element 814 closer to or further over the deformable layer 34, the reflective surface 92 of the reflective element 814 of FIG. 13D has a larger area than do the reflective surfaces 92 of reflective elements 814 that are laterally spaced further from the deformable layer 34 (e.g., as shown in FIGS. 8A, 13A, and 13B). Other configurations are also possible.

FIGS. 14A-14H illustrate an example method of manufacturing a MEMS device 800 similar to the MEMS device 800 depicted in FIGS. 9A-9H. However, rather than extending across a row of MEMS devices 800 (e.g., as illustrated in FIG. 8B), the first reflective layer 94 is positioned substantially only below the reflective surface 92 of the reflective element 814. Such embodiments may be advantageous when the first reflective layer 94 does not need to be grounded, may be grounded within each MEMS device 800, and the like. Additionally, the insulating layer 86 depicted in FIGS. 14A-14H is not removed from the optical path, which can reduce fabrication complexity (e.g., by removing a patterning step). The left side of FIGS. 14A-14H are cross sections along the line A-A of FIG. 8A (e.g., similar to FIG. 9A), and the right side of FIGS. 14A-14H are cross sections along the line C-C of FIG. 8A (e.g., similar to FIG. 9C).

Figure 14A:
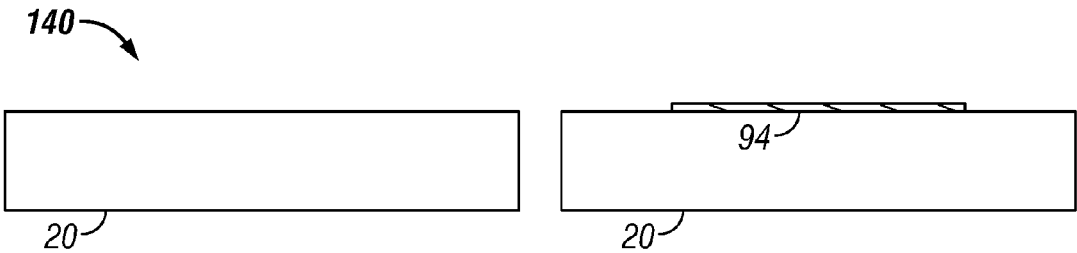
FIGS. 14A-14H are cross sections of an example embodiment of a method of fabricating an MEMS device.
Figure 14B:
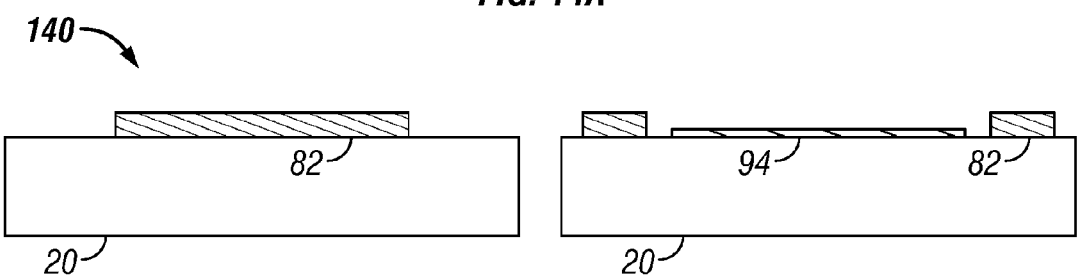

FIG. 14A illustrates a structure 140 comprising a substrate 20 on which a first reflective layer 94 has been formed. As described above, the first reflective layer 94 may be integrated in an optical stack in the substrate 20. The first reflective layer 94 is disposed in the optical path of light being modulated by the MEMS device 800, and need not be formed in regions which are not in the optical path, for example, beneath the posts 18 or the actuation electrode 82 (e.g., as depicted in FIGS. 14A-14H). In certain such embodiments, the first reflective layer 94 may be in the same plane as the actuation electrode 82 (e.g., as depicted in FIG. 14B).

Figure 14C:
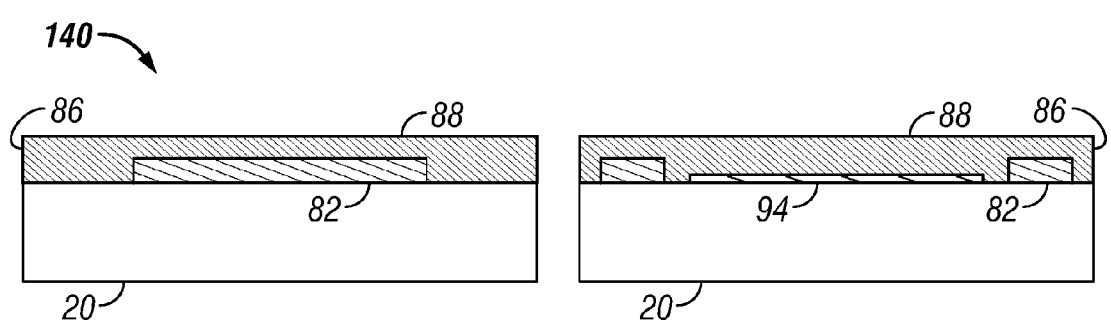

FIG. 14B illustrates the structure 140 after an actuation electrode 82 has been formed over the substrate 20. As illustrated above in FIGS. 8B and 13C, the actuation electrode 82 may be formed in strips around the reflective surface 92 of the reflective element 814. In some embodiments, the first reflective layer 94 is formed after the actuation electrode 82. The first reflective layer 94 and the actuation electrode 82 may have different thicknesses. FIG. 14C illustrates the structure 140 after the first reflective layer 94 and the actuation electrode 82 are covered (e.g., encapsulated) by an insulator 86. In certain embodiments, the insulator 86 provides electrical isolation between the deformable layer 34 and the actuation electrode 82 when the MEMS device 800 is in the actuated state. Other embodiments to insulate the deformable layer 34 from the actuation electrode 82 are also possible. In certain embodiments, the insulator 86 comprises one or more layers formed between the deformable layer 34 and the actuation electrode 82, which may be used to advantageously optimize the shape and surface energy of the contact point and/or to minimize stiction between the deformable layer 34 and layers below the deformable layer 34. For example, in certain embodiments, an upper surface of the insulator 86 between the actuation electrode 82 and the deformable layer 34 is roughened to reduce stiction upon contact with the deformable layer 34. In certain embodiments, the top surface of the insulating layer 86 is defined as the top surface 88 of the substrate 20.

Figure 14D:
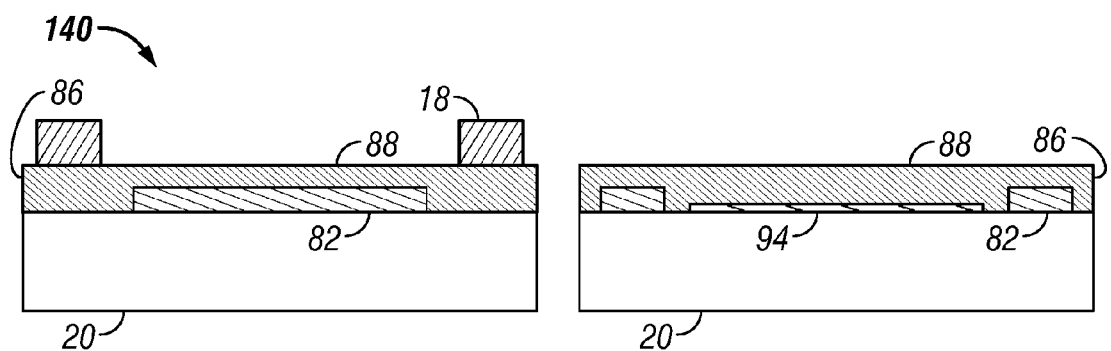

FIG. 14D illustrates the structure 140 after posts 18 have been formed. As described above, in certain embodiments, the posts 18 mechanically couple the deformable layer 34 to the substrate 20, and can have a variety of configurations (e.g., as depicted in FIGS. 7B, 7C, and 7E). In certain embodiments, a black mask (not shown) is formed under the posts 18 and may be integrated with the substrate.

Figure 14E:
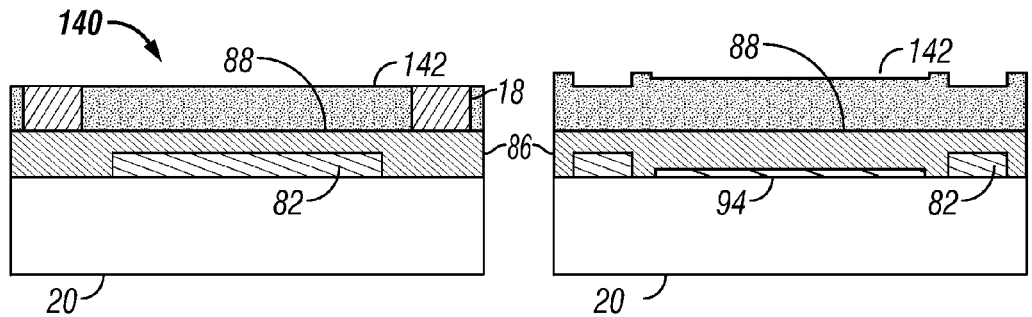

FIG. 14E illustrates the structure 140 after a sacrificial layer 142 has been formed over the actuation electrode 82 and the insulator 86. The sacrificial layer 142 may comprise, for example, molybdenum, photoresist, polysilicon, or other suitable materials. In certain embodiments, the thickness of the sacrificial layer 142 determines a distance between the deformable layer 34 and the stationary portion of the MEMS device 800 and/or a distance between the reflective surface 92 of the reflective element 814 and the top surface 88 of the substrate 20. In some embodiments, the sacrificial layer 142 is patterned in preparation for the deposition of the material that forms the deformable layer 34.

Figure 14F:
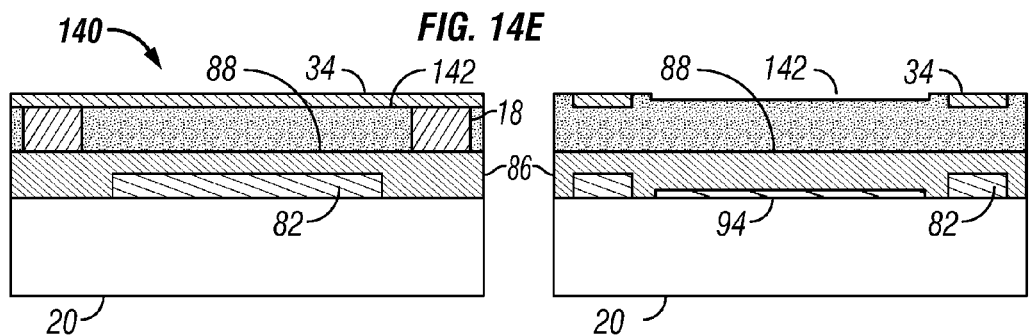
Figure 14G:
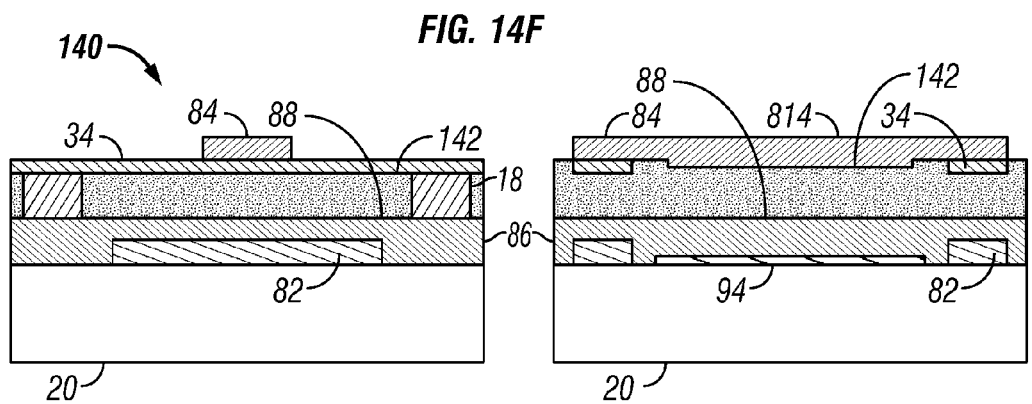
Figure 14H:
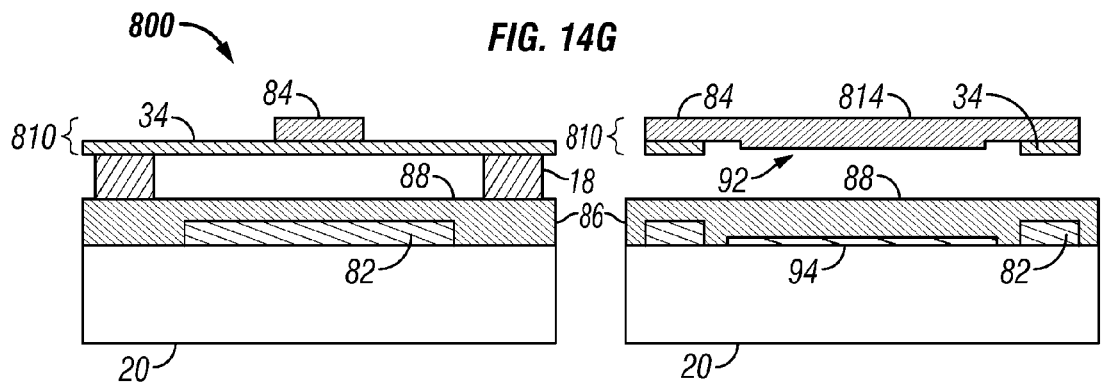

FIG. 14F illustrates the structure 140 after a deformable layer 34 has been formed over the sacrificial layer 142. Similar to FIG. 8A, the deformable layer 34 of the embodiment illustrated in FIG. 14F comprises one or more portions extending between the posts 18. FIG. 14G illustrates the structure 140 after a reflective element 814 has been formed over the sacrificial layer 142. The reflective element 814 is mechanically coupled to the deformable layer 34 by a connecting element 84. In certain embodiments, the connecting element 84 is formed at the same time as the reflective surface 92 and the reflective element 814 (e.g., by depositing a single layer of aluminum). In certain alternative embodiments, the connecting element 84 is formed separately from the reflective surface 92 and/or the reflective element 814. The reflective element 814 includes a reflective surface 92. The reflective surface 92 is disposed laterally from the actuation electrode 82 and the deformable layer 34. In some embodiments, the sacrificial layer 142 is patterned such that the reflective surface 92 of the reflective element 814 is positioned relative to the deformable layer 34 to avoid contact with the top surface 88 of the substrate 20 when the MEMS device 800 is in an actuated state. In some embodiments, the reflective surface 92 is made smooth and flat by forming the reflective element 814 on a smooth and flat sacrificial layer 142 (e.g., on photoresist or polished molybdenum). FIG. 14H illustrates the structure 140 after the sacrificial layer 142 has been removed (e.g., by etching with $XeF_2$ in embodiments in which the sacrificial layer 142 comprises molybdenum), which forms the MEMS device 800 having a movable element 810.

FIGS. 15A-15H illustrate another example method of manufacturing the MEMS device 800 similar to the MEMS device 800 depicted in FIGS. 9A-9H. As illustrated in FIG. 8B, the first reflective layer 94 extends across a plurality of MEMS devices 800. Such embodiments may be advantageous to ground the first reflective layer 94 of a plurality of MEMS devices 800 at a few points. FIGS. 15A-15H each show four cross sections at the same point in the fabrication process. From top to bottom, the first cross section ("A") is along the line A-A of FIG. 8A (e.g., similar to FIG. 9A), the second cross section ("C") is along the line C-C (e.g., similar to FIG. 9C), the third cross section ("E") is along the line E-E (e.g., similar to FIG. 9E), the fourth cross section ("G") is along the line G-G (e.g., similar to FIG. 9G).

Figure 15A:
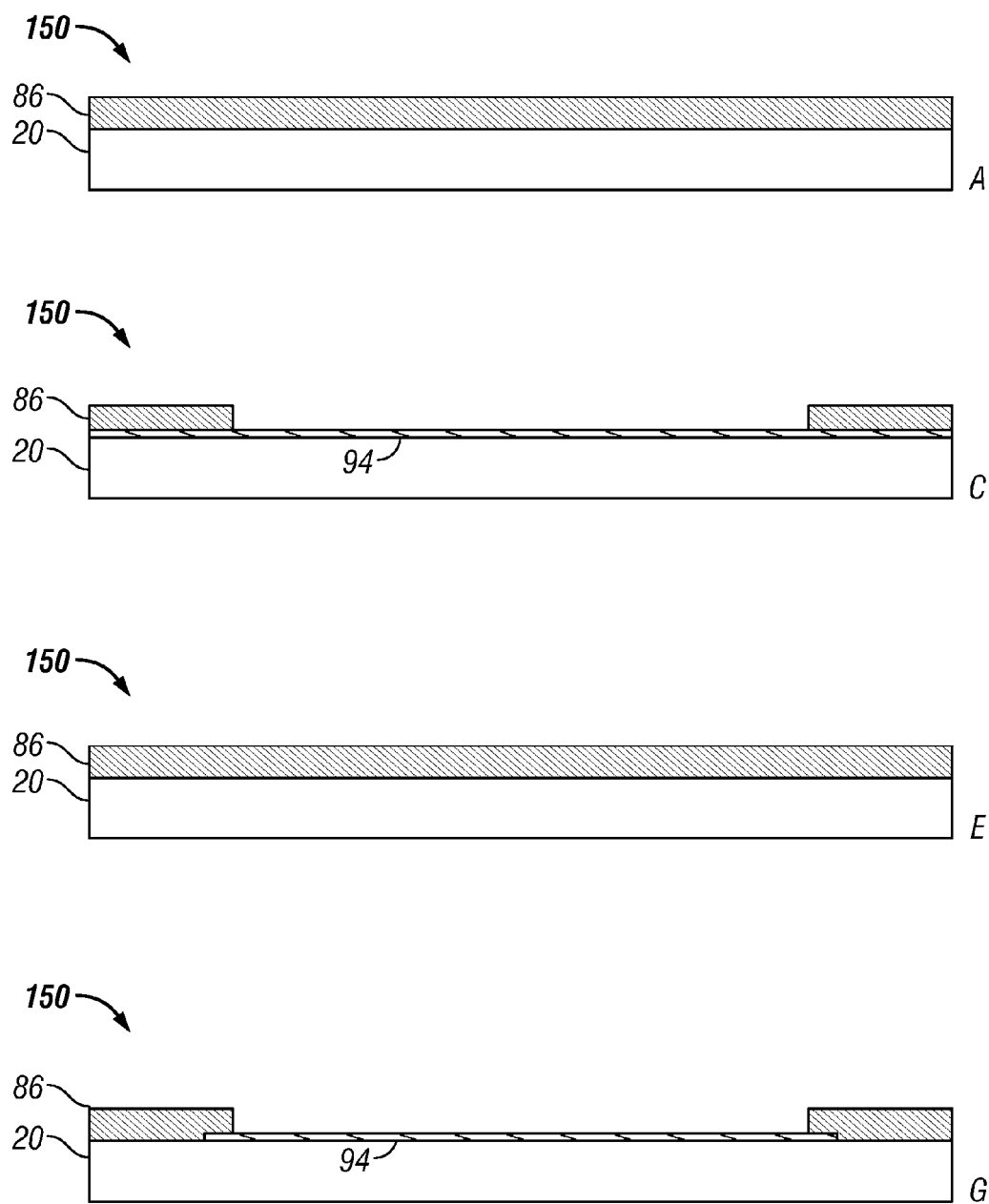
FIGS. 15A-15H are cross sections of an example embodiment of a method of fabricating the MEMS device of FIGS. 9A-9H.

FIG. 15A illustrates a structure 150 comprising a substrate 20 on which a first reflective layer 94 and a first insulating layer 86 have been formed. As described above, the first reflective layer 94 may be integrated in an optical stack in the substrate 20. The first reflective layer 94 is disposed in the optical path of light being modulated by the MEMS device 800, and need not be formed in regions which are not in the optical path, for example, beneath the posts 18 or the actuation electrode 82. However, in certain embodiments (e.g., as depicted in FIGS. 15A-15H), the first reflective layer 94 is formed in a continuous strip along the same direction as the deformable layer 34 (e.g., in a row). In certain such embodiments, the first reflective layer 94 is in electrical communication with the deformable layer 34 of that row. After formation of the first reflective layer 94, an insulating layer 86 (e.g., comprising $SiO_2$ or $Al_2O_3$) may be deposited to insulate the first reflective layer 94 from the actuation electrodes 82, which are, for example, in electrical communication in columns. As can be seen in the C-C and G-G cross sections, portions of the insulating layer 86 in the optical path have been removed. In alternative embodiments, the portions of the insulating layer 86 in the optical path may remain or may be removed by later steps.

Figure 15B:
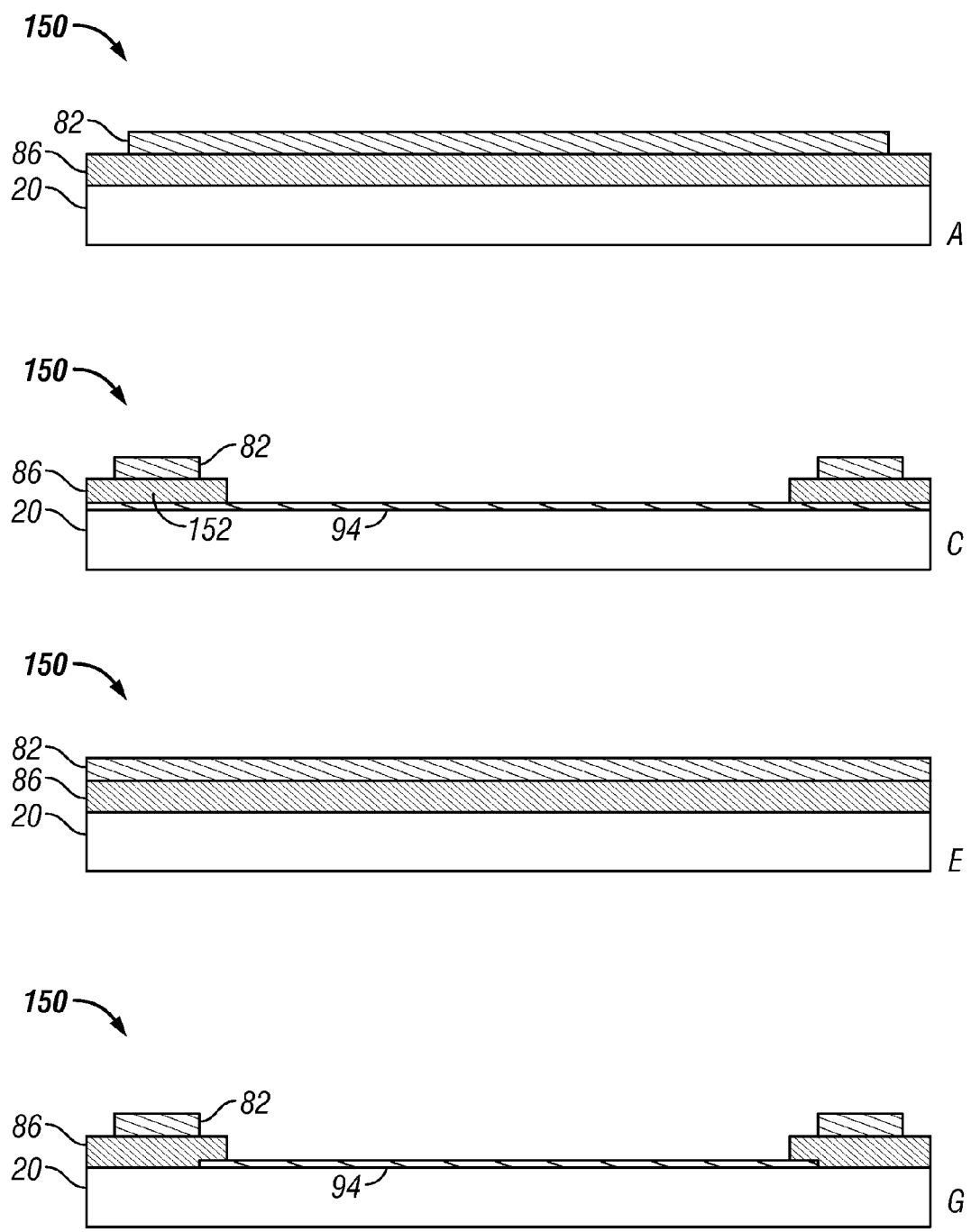

FIG. 15B illustrates the structure 150 after an actuation electrode 82 has been formed over the substrate 20 (e.g., over the insulating layer 86). As illustrated above in FIG. 8B, the actuation electrode 82 may be formed in strips around the reflective surface 92 of the reflective element 814.

In certain embodiments, a portion of the MEMS device 800 in which the actuation electrode 82 and the first reflective layer 94 overlap may comprise a black mask 152. In certain such embodiments, the thickness of the insulating layer 96 is preferably between about 90 and 110 nm (e.g., about 100 nm) thick depending on the refractive index of the insulator 86 such that light entering the black mask 152 is seen by a user as black. If the insulating layer 86 is too thin, there may be a danger of the formation of a parasitic capacitor and/or electrical breakdown. If the insulating layer 86 is too thick, the mask 152 may be seen as a color other than black, reducing contrast. For example, in some embodiments in which the insulator 86 comprises $SiO_2$, the thickness of the insulator 86 is between about 280 and 300 nm (e.g., about 290 nm) to create second order blue. In some embodiments in which air occupies the black mask 152 between the first reflective layer 94 and the actuation electrode 82, the thickness of the air is between about 400 and 500 nm (e.g., about 440 nm) to create second order blue. In some embodiments in which $SiO_2$ occupies the black mask 152 between the first reflective layer 94 and the actuation electrode 82, the thickness of the $SiO_2$ is between about 250 and 350 nm (e.g., between about 280 and 300 nm) to create second order blue.

Figure 15C:
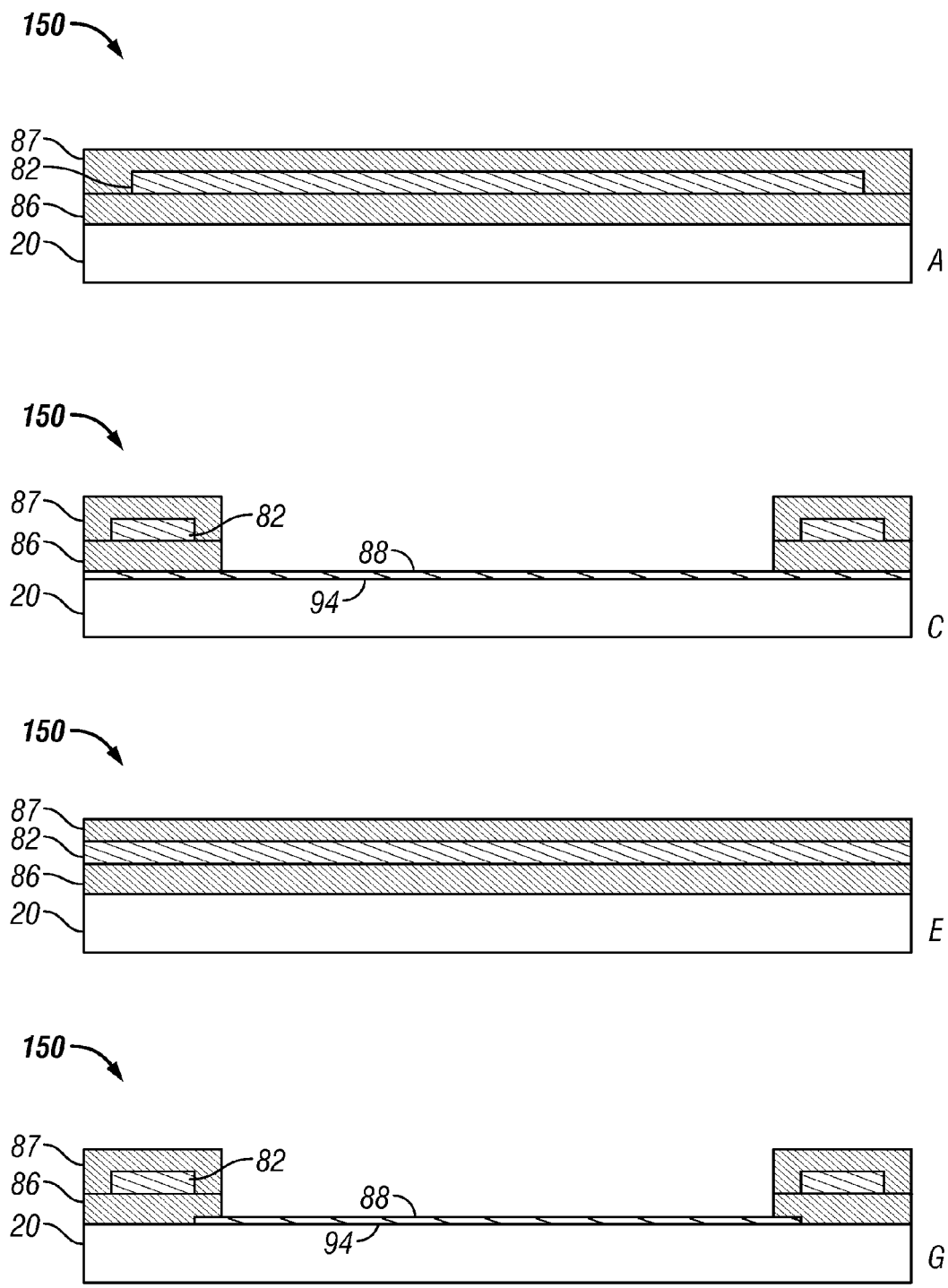

FIG. 15C illustrates the structure 150 after the actuation electrode 82 is covered (e.g., encapsulated) by an insulator 87. In certain embodiments, the insulator 87 provides electrical isolation between the actuation electrode 82 and the deformable layer 34 when the MEMS device 800 is in the actuated state. Other embodiments to insulate the deformable layer 34 from the actuation electrode 82 are also possible. In certain embodiments, the insulator 87 comprises one or more layers formed between the deformable layer 34 and the actuation electrodes 82, which advantageously may be used to optimize the shape and surface energy of the contact point and/or to minimize stiction between the deformable layer 34 and layers below the deformable layer 34. For example, in certain embodiments, an upper surface of the insulator 87 between the actuation electrode 82 and the deformable layer 34 is roughened to reduce stiction upon contact with the deformable layer 34. In the embodiment illustrated in FIG. 15C, an opening to the first reflective layer 94 is formed in the optical path during patterning of the insulating layer 87. In some embodiments, for example in embodiments in which the insulating layers 86, 87 comprise the same material, the opening in the insulating layer 86 is formed during patterning of the insulating layer 87. In certain embodiments, the top surface of the first reflective layer 94 is defined as the top surface 88 of the substrate 20. In certain embodiments, the top surface of the insulating layer 87 is defined as the stationary portion of the MEMS device 800.

In certain embodiments, the insulating layers 86, 87 are formed such that they are not in the optical path, which can decrease the number of reflecting surfaces and which can allow for additional separation between the reflective surface 92 and the top surface 88. Removing the insulators 86, 87 from the optical path also allows the insulator 86 to be thick without adversely affecting optical performance, thereby improving the electrical breakdown strength and reducing the parasitic capacitance between first reflective layer 94 and the actuation electrode 82.

Figure 15D:
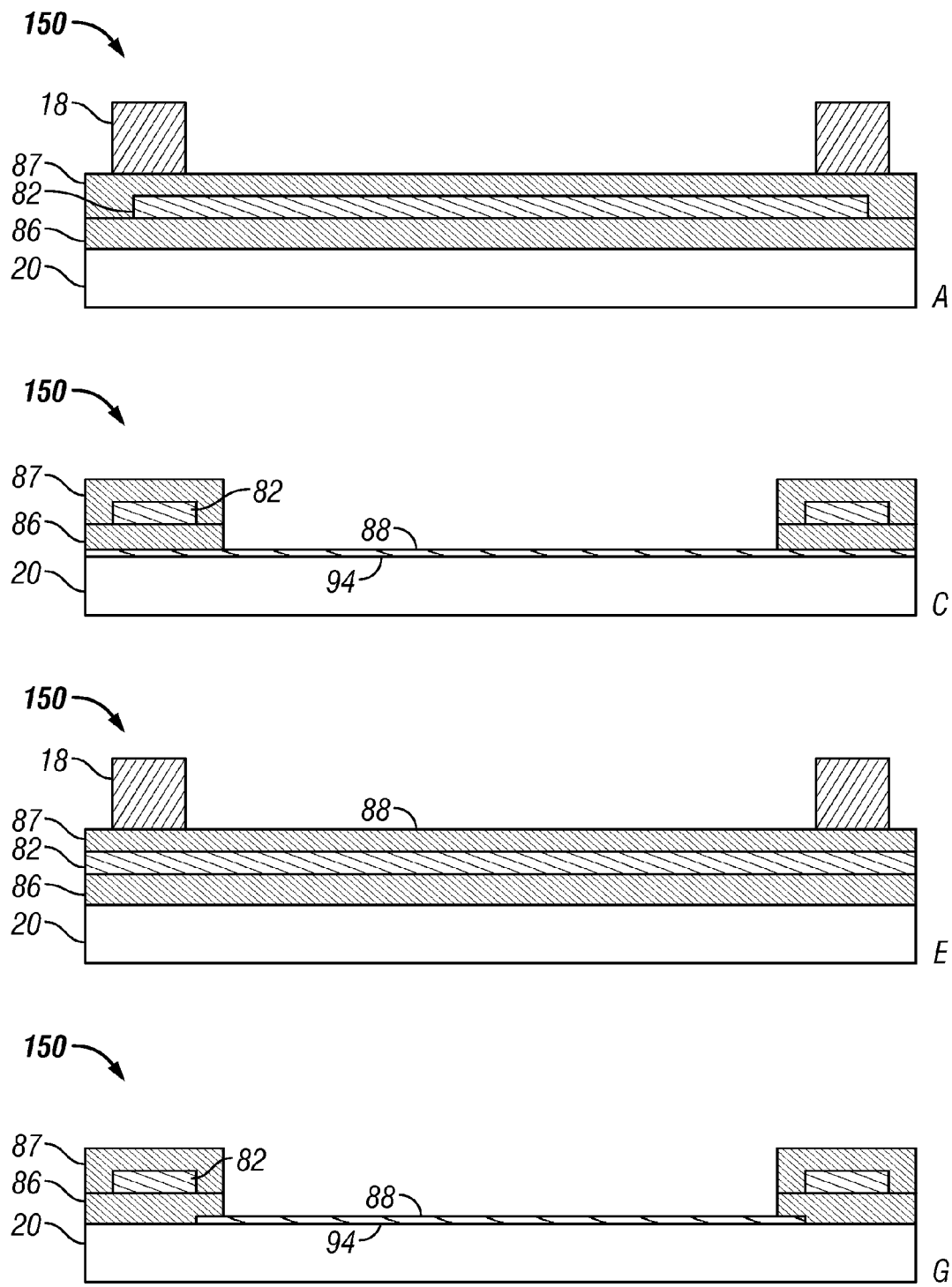

FIG. 15D illustrates the structure 150 after posts 18 have been formed. As described above, in certain embodiments, the posts 18 mechanically couple the deformable layer 34 to the substrate 20, and can have a variety of configurations (e.g., as depicted in FIGS. 7B, 7C, and 7E). In certain embodiments, a black mask is formed under the posts 18 (e.g., the black mask 152 between the actuation electrode 82 and the first reflective layer 94), and may be integrated with the substrate 20.

Figure 15E:
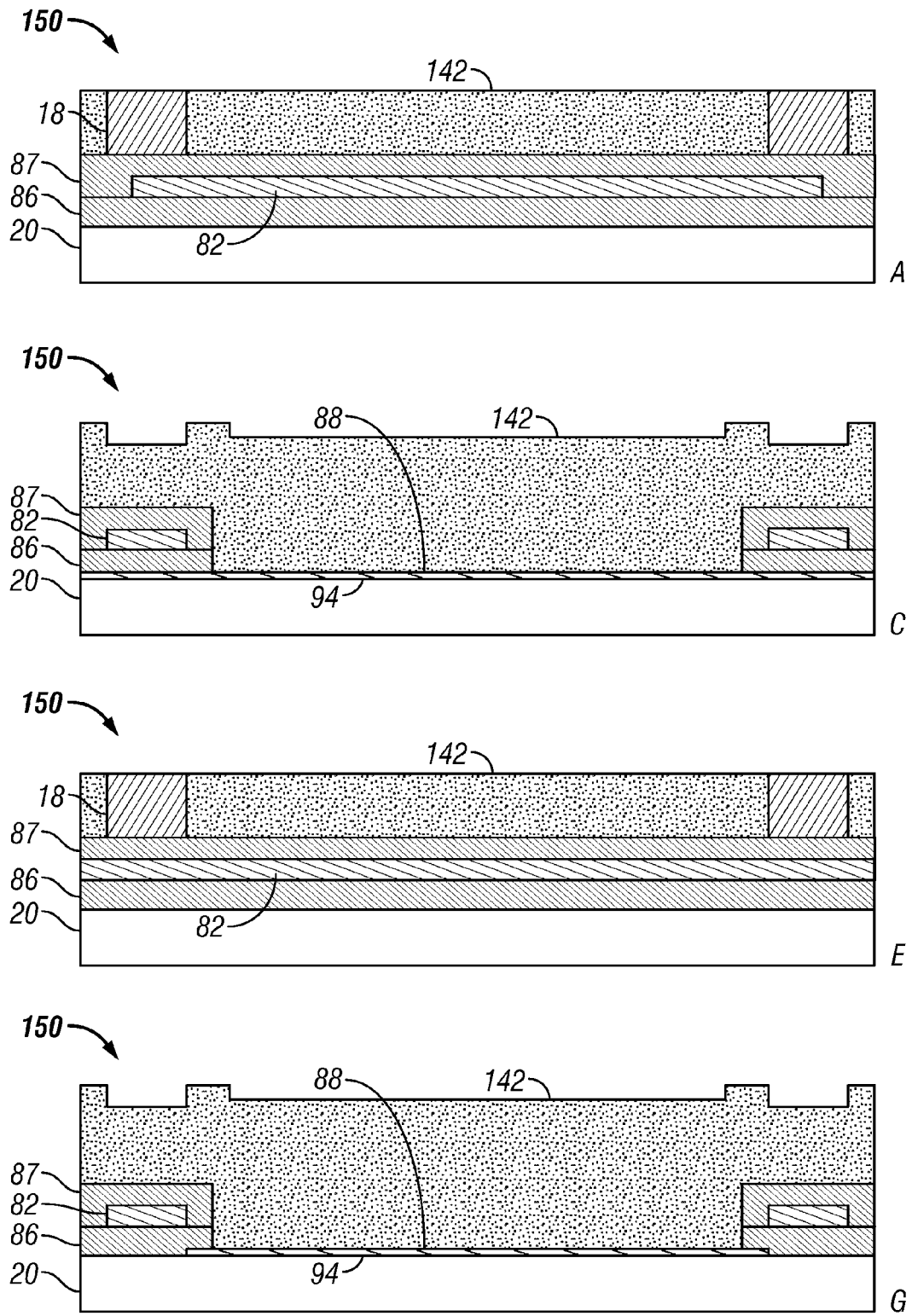

FIG. 15E illustrates the structure 150 after a sacrificial layer 142 has been formed over the actuation electrode 82, the insulator 87, and the first reflective layer 94. The sacrificial layer 142 may comprise, for example, molybdenum, photoresist, polysilicon, or other suitable materials. In certain embodiments, the thickness of the sacrificial layer 142 determines a distance between the deformable layer 34 and the stationary portion of the MEMS device 800 and/or a distance between the reflective surface 92 of the reflective element 814 and the top surface 88 of the substrate 20. In some embodiments, the sacrificial layer 142 is patterned in preparation for the deposition of the material that forms the deformable layer 34.

Figure 15F:
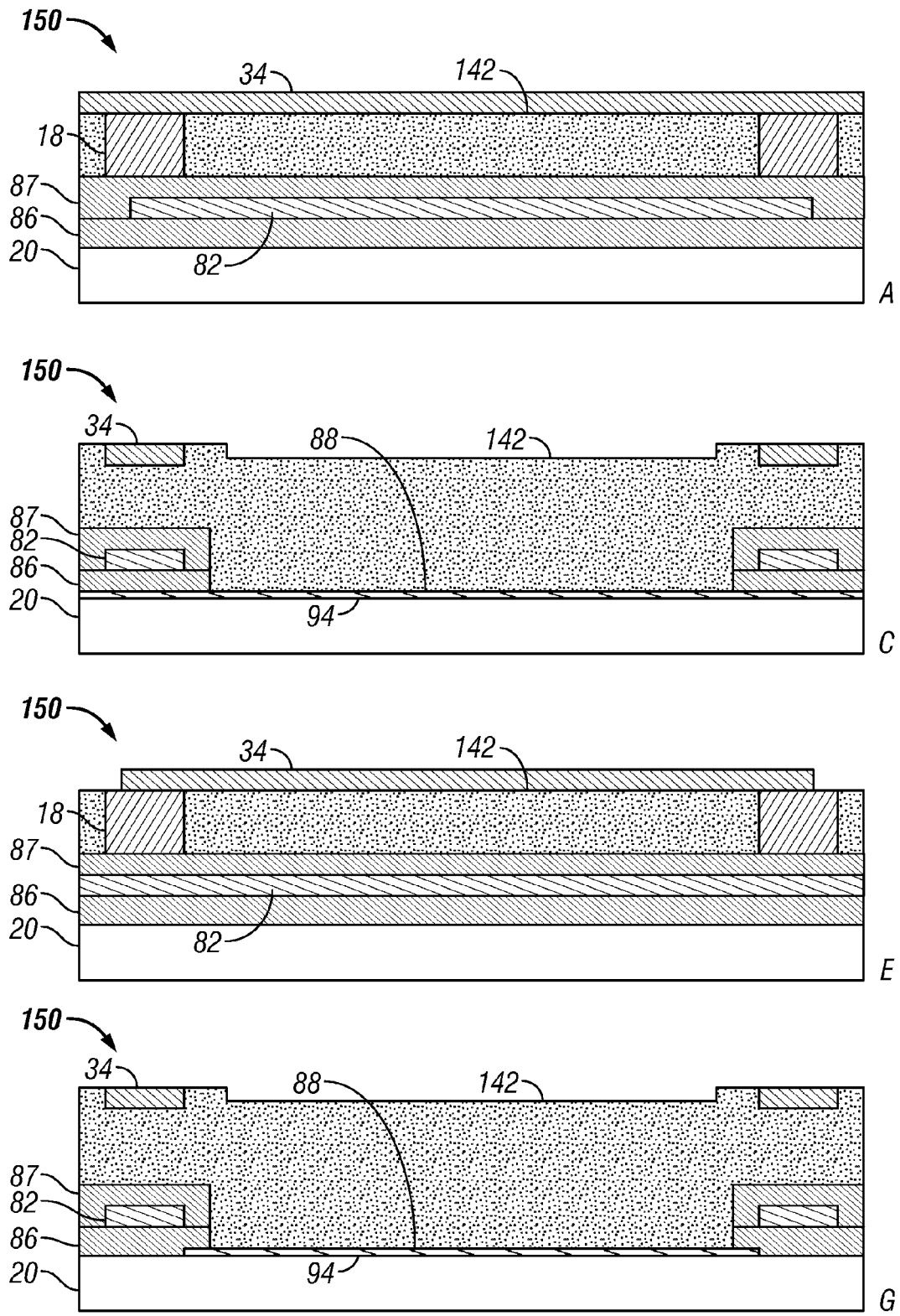
Figure 15G:
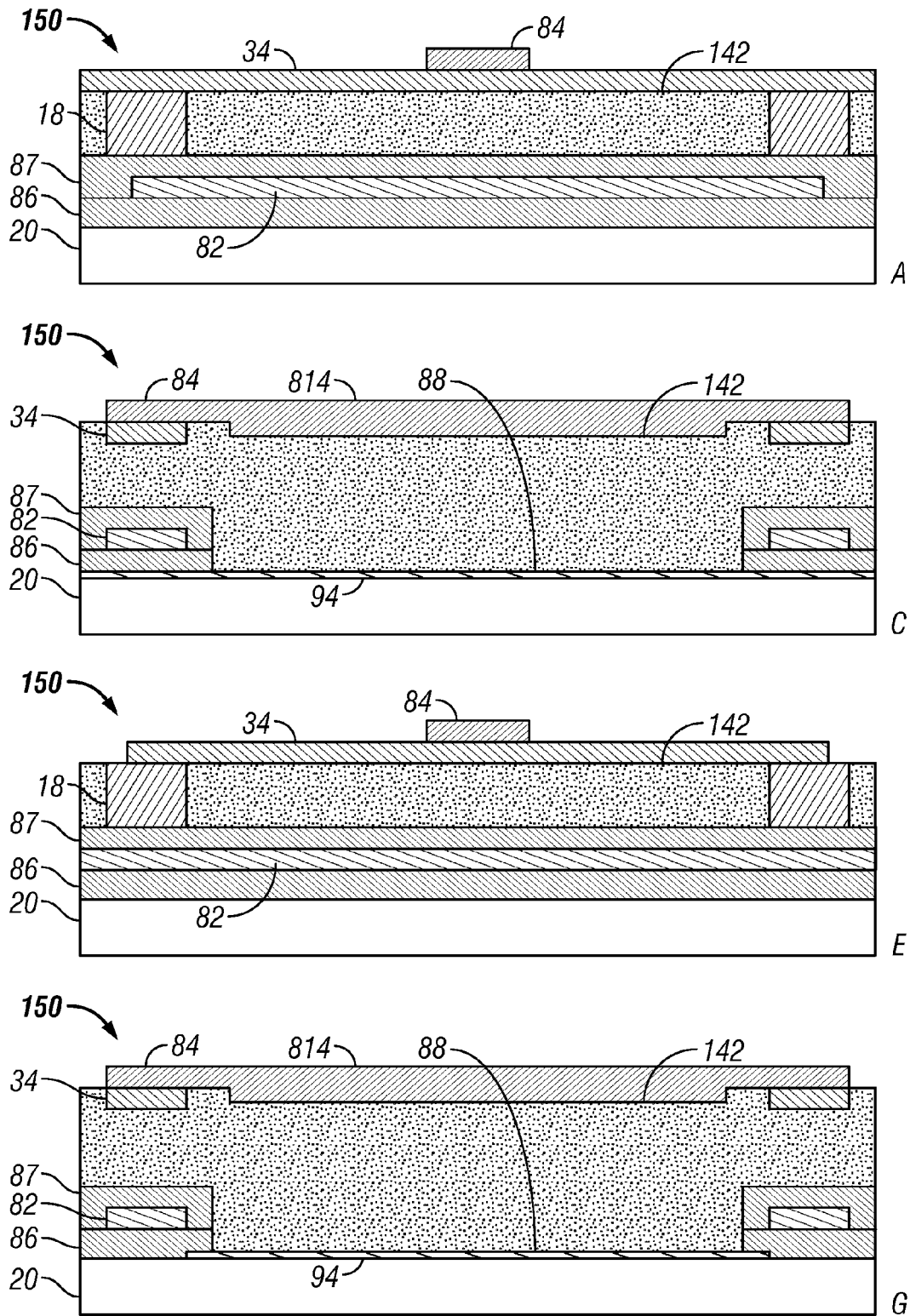
Figure 15H:
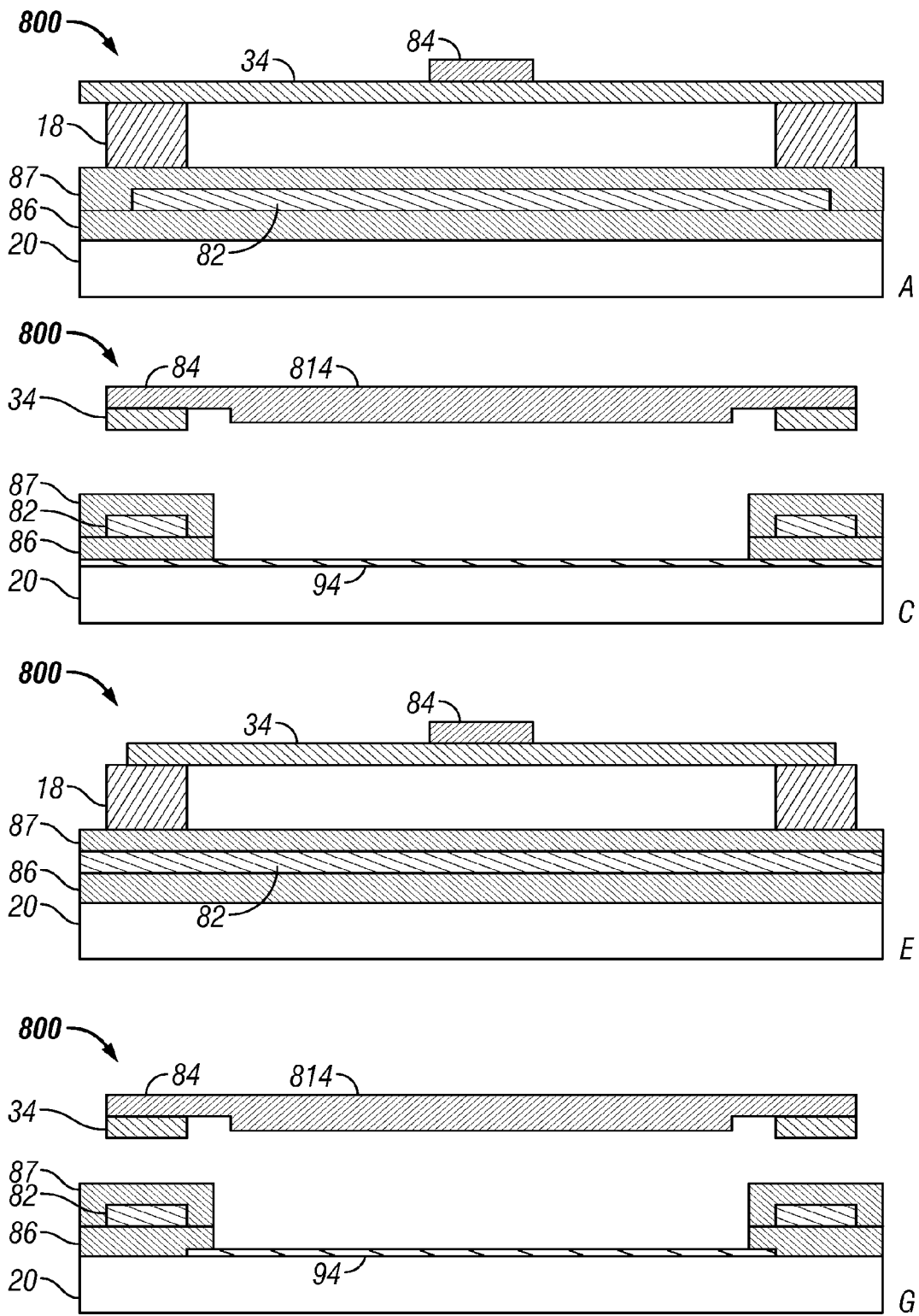

FIG. 15F illustrates the structure 150 after a deformable layer 34 has been formed over the sacrificial layer 142. Similarly to FIG. 8A, the deformable layer 34 of the embodiment illustrated in FIG. 15F comprises one or more portions extending between the posts 18. FIG. 15G illustrates the structure 150 after a reflective element 814 has been formed over the sacrificial layer 142. The reflective element 814 is mechanically coupled to the deformable layer 34 by a connecting element 84. In certain embodiments, the connecting element 84 is formed at the same time as the reflective surface 92 and the reflective element 814 (e.g., by depositing a single layer of aluminum). In certain alternative embodiments, the connecting element 84 is formed separately from the reflective surface 92 and/or the reflective element 814. The reflective element 814 includes a reflective surface 92. The reflective surface 92 is disposed laterally from the actuation electrode 82 and the deformable layer 34. In some embodiments, the sacrificial layer 142 is patterned such that the reflective surface 92 of the reflective element 814 is positioned relative to the deformable layer 34 to avoid contact with the top surface 88 of the substrate 20 when the MEMS device 800 is in an actuated state. In some embodiments, the reflective surface 92 is made smooth and flat by forming the reflective element 814 on a smooth and flat sacrificial layer 142 (e.g., on photoresist or polished molybdenum). FIG. 15H illustrates the structure 140 after the sacrificial layer 142 has been removed (e.g., by etching with XeF$_2$ in embodiments in which the sacrificial layer 142 comprises molybdenum), which forms the MEMS device 800 having a movable element 810. It will be appreciated that, from top to bottom, the MEMS device 800 depicted corresponds to the cross sections of FIGS. 9A, 9C, 9E, and 9G, respectively.

The MEMS devices 800 illustrated in FIGS. 10A-13B and 13C, as well as other MEMS devices in which the actuation electrode 82 is laterally disposed form the reflective surface 92 of the reflective element 814, may be formed in certain embodiments using similar sets of steps as those described above with appropriate modifications (e.g., different deposition thicknesses, different patterning masks, etc.) to achieve the desired configuration.

Figure 16A:
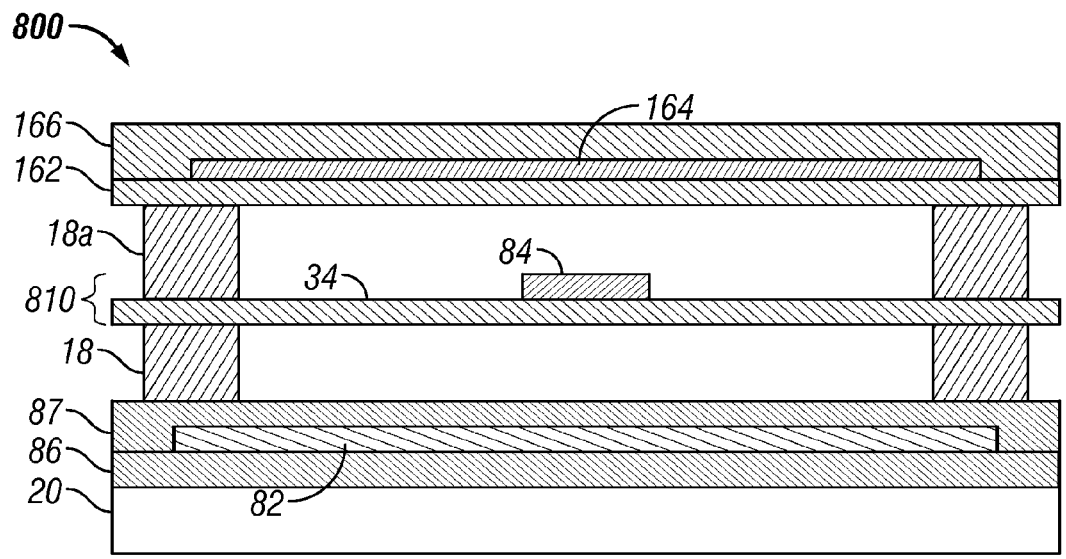
Figures 1, 16B:
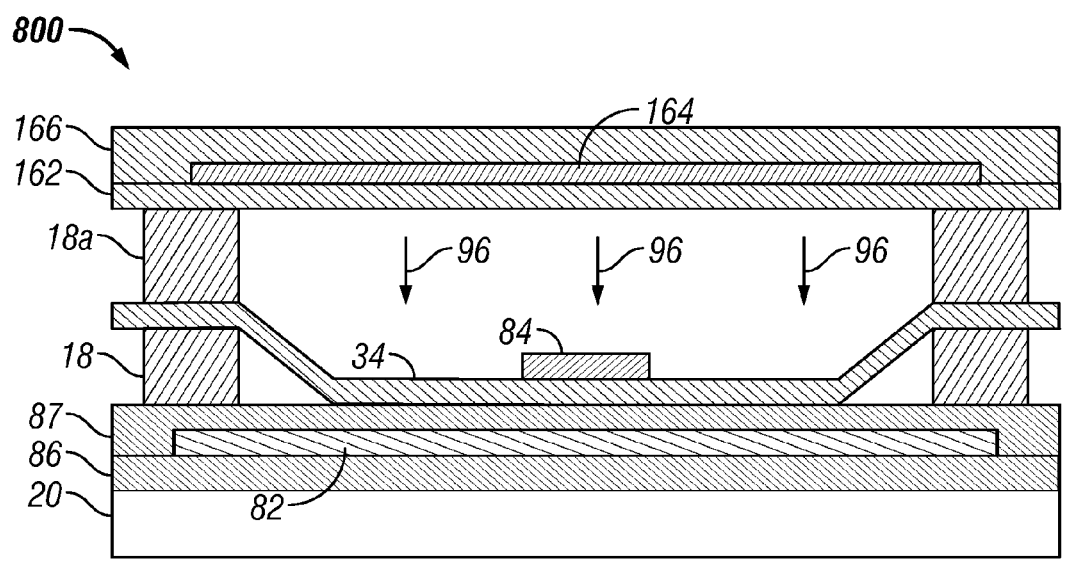
Figures 2, 16B:
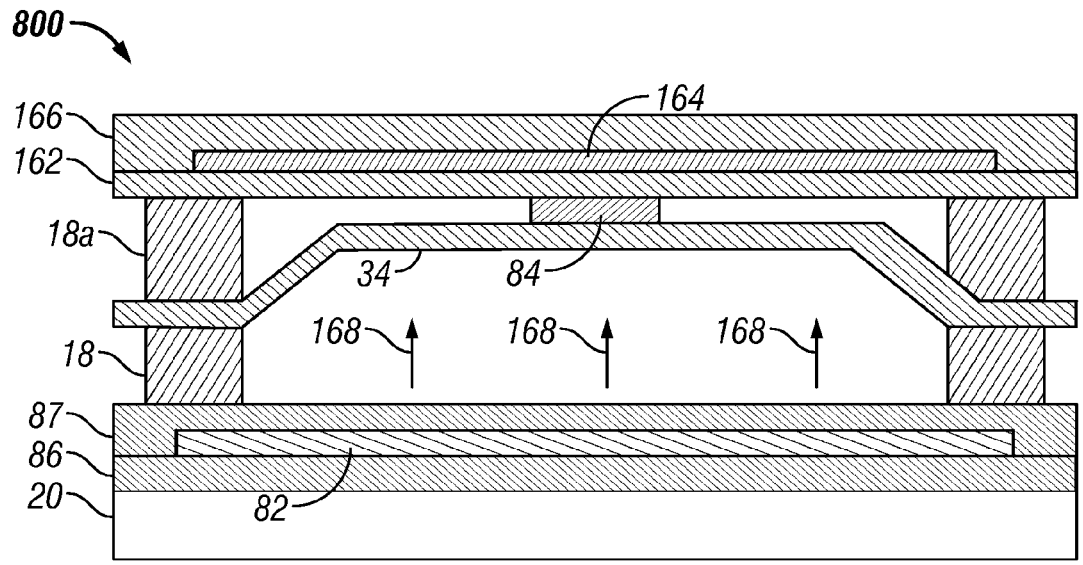
Figure 16C:
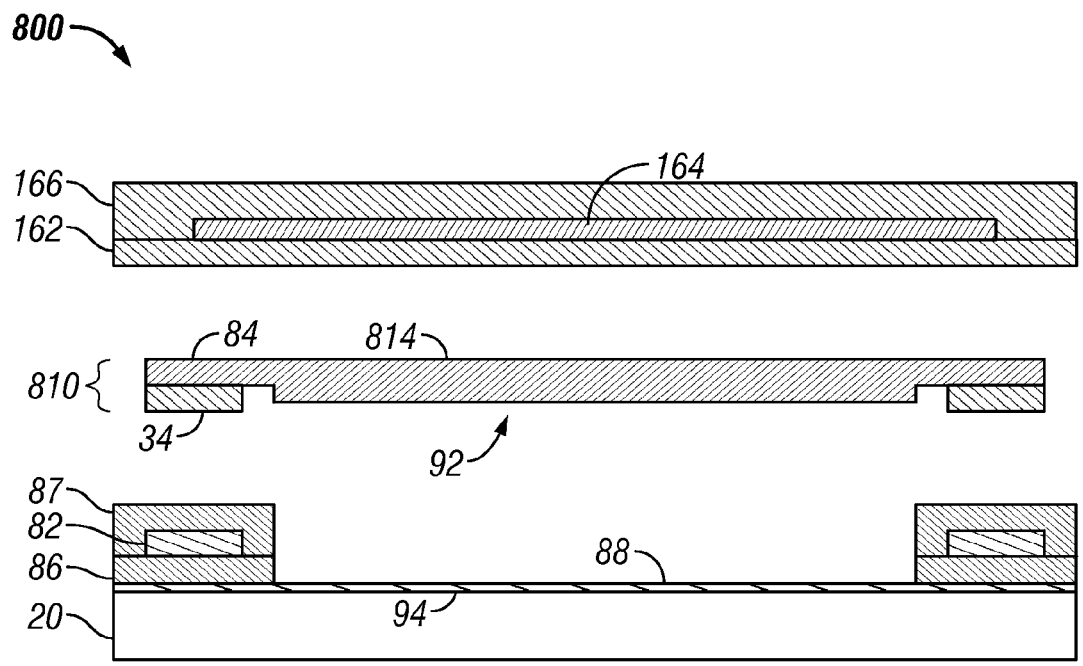
Figures 1, 16D:
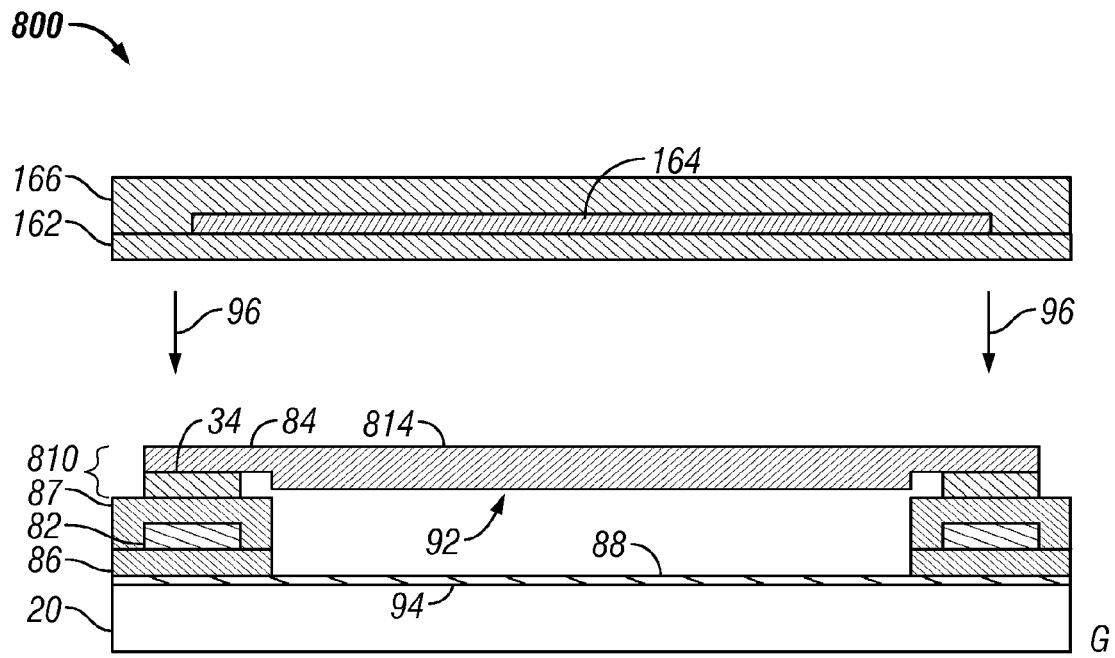
Figures 2, 16D:
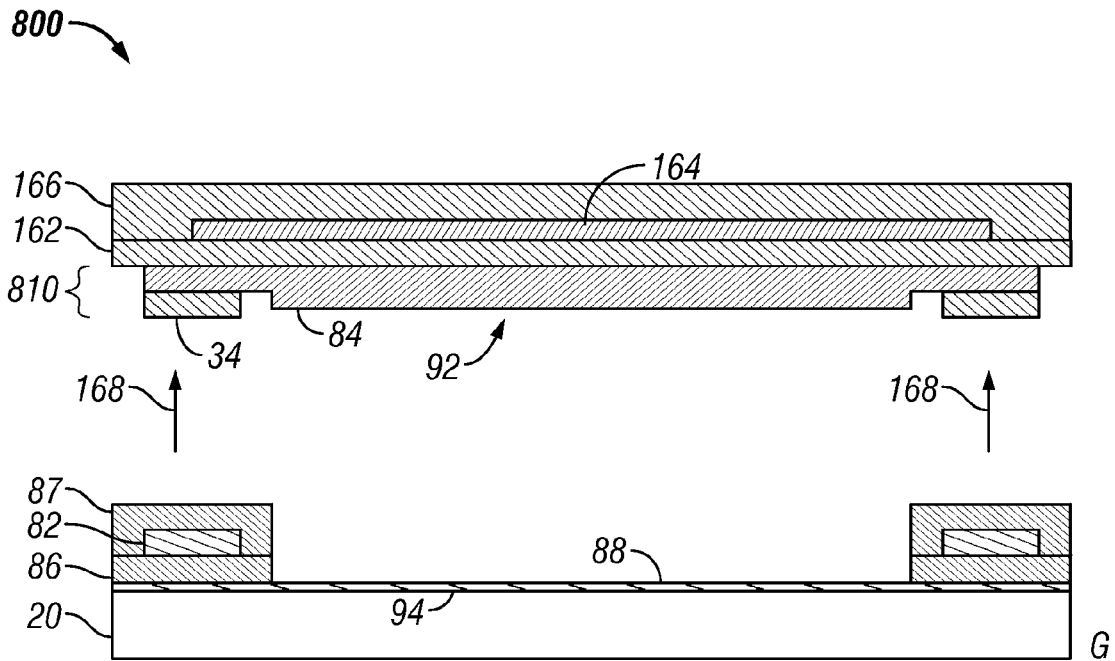
Figure 16E:
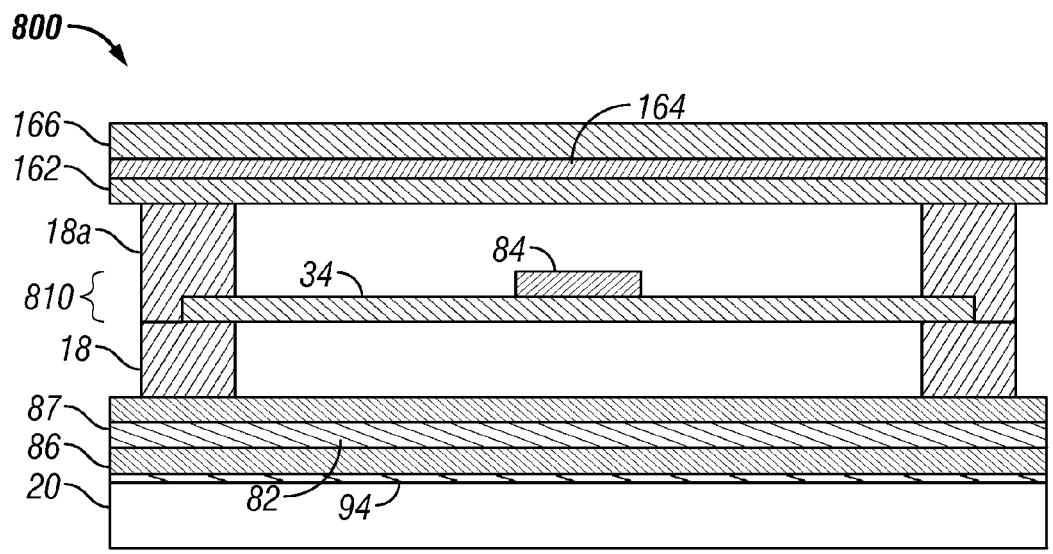
Figures 1, 16F:
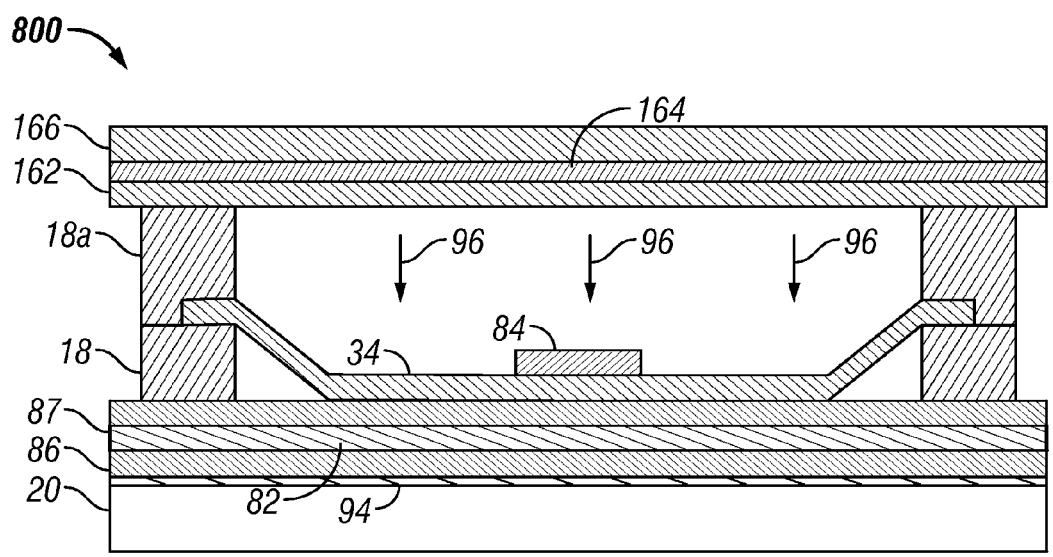
Figures 2, 16F:
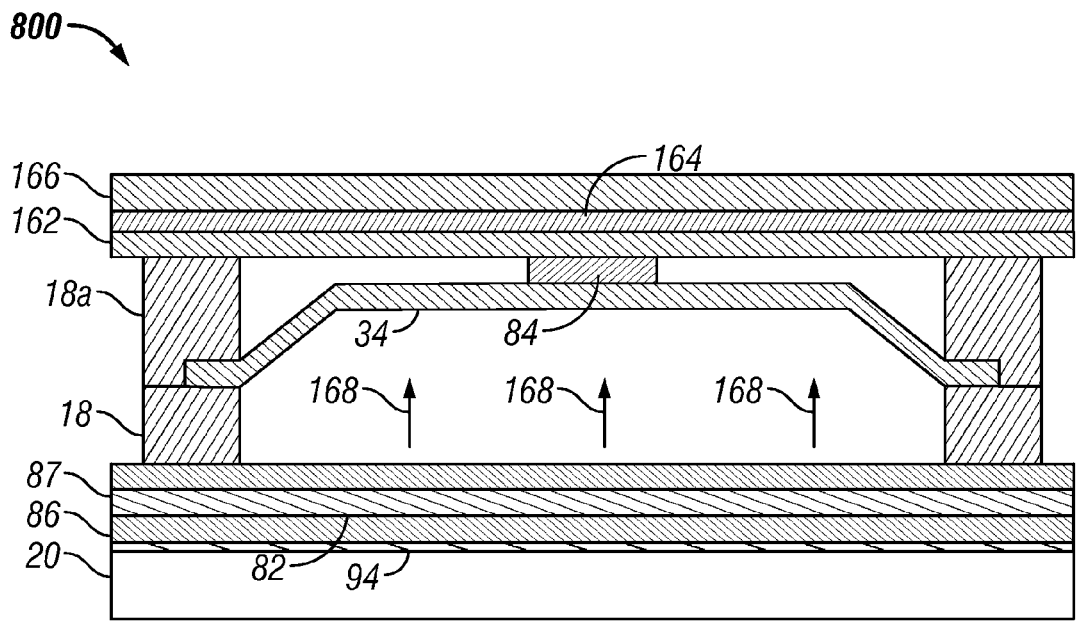
Figure 16G:
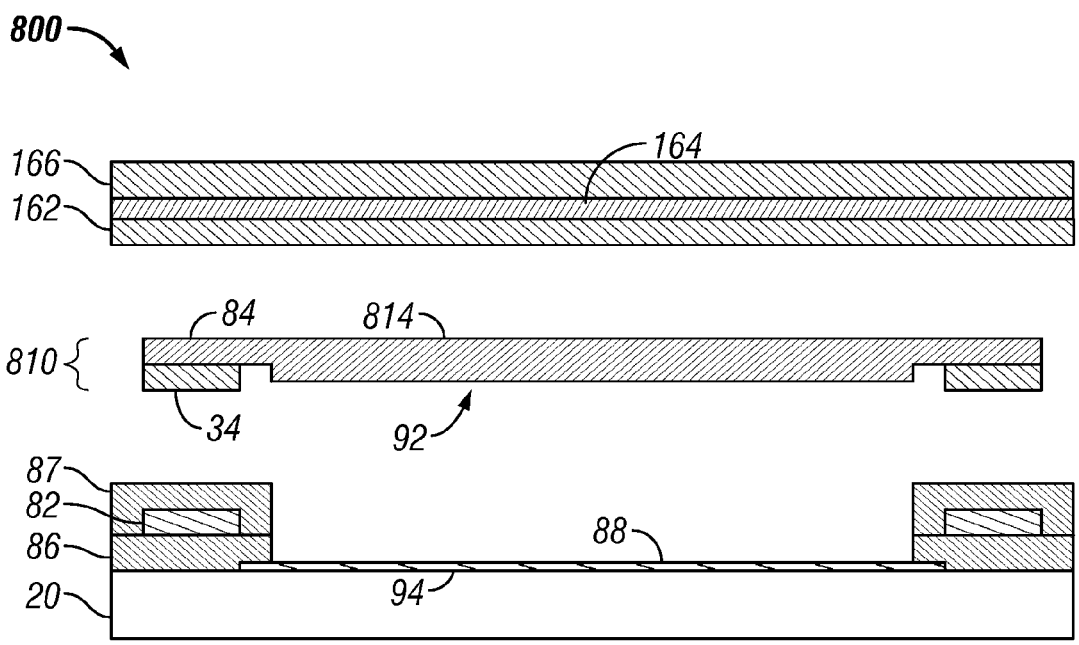
Figures 1, 16H:
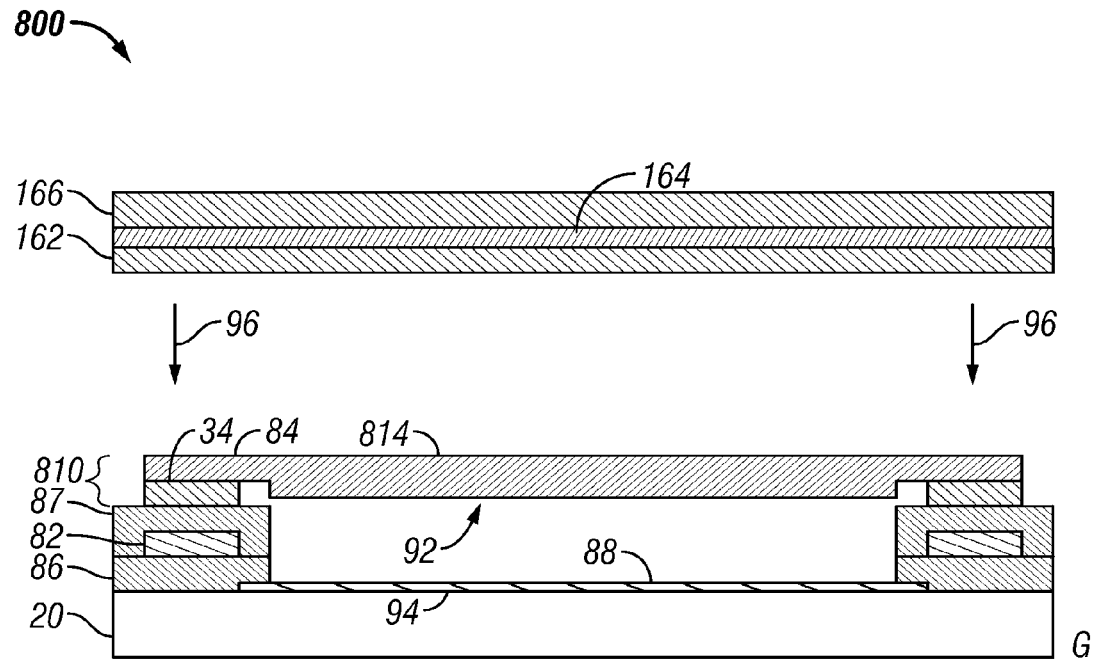
Figures 2, 16H:
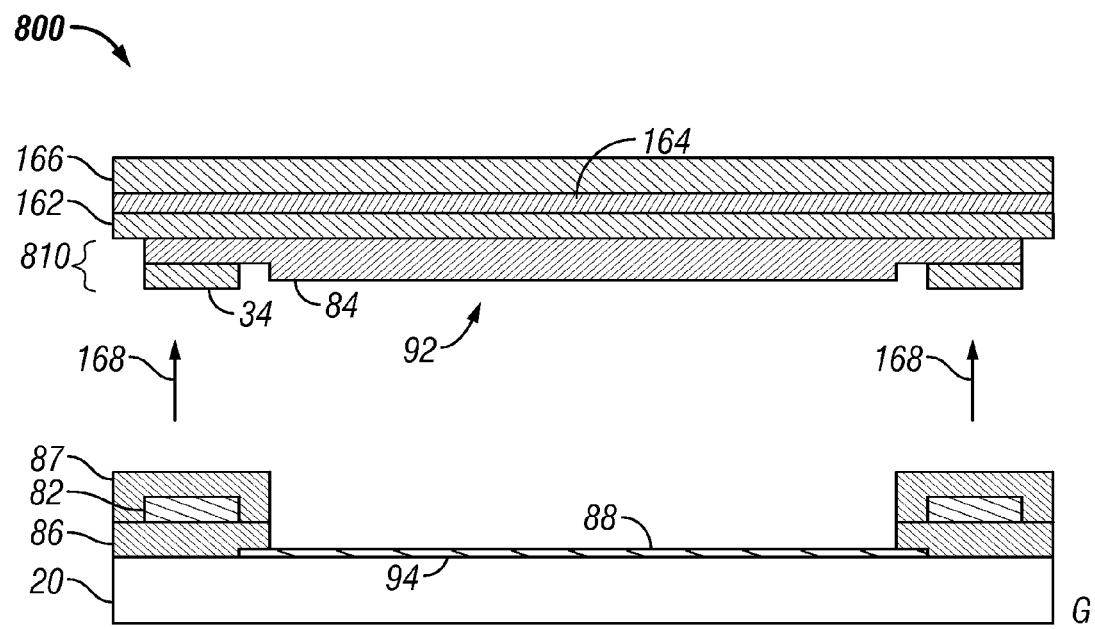

FIGS. 16A-16H2 depict cross sections of another example embodiment of the MEMS device 800 of FIG. 8A including a second actuation electrode 164. FIG. 16A is a cross section taken along line A-A, and FIG. 16C is a cross section taken along line C-C, when the MEMS device 800 is in an unactuated (or "relaxed") state. FIGS. 16B1 and 16D1 depict the cross sections along lines A-A and C-C, respectively, when the MEMS device 800 is in a first actuated state. FIGS. 16B2 and 16D2 depict the cross sections along lines A-A and C-C, respectively, when the MEMS device 800 is in a second actuated state. FIG. 16E is a cross section taken along line E-E, and FIG. 16G is a cross section taken along line G-G, when the MEMS device 800 is in an unactuated state. FIGS. 16F1 and 16H1 depict the cross sections along lines E-E and G-G, respectively, when the MEMS device 800 is in a first actuated state. FIGS. 16F2 and 16H2 depict the cross sections along lines E-E and G-G, respectively, when the MEMS device 800 is in a second actuated state.

The movable element 810 is responsive to voltages applied to the actuation electrode 82 between the deformable layer 34 and the reflective element 82 by moving generally in a first direction, as described above (e.g., as illustrated in FIGS. 16B1, 16D1, 16F1, and 16H1). The movable element 810 is further responsive to voltages applied to the second actuation electrode 164 by moving generally in a second direction. In certain embodiments, the second direction is substantially opposite to the first direction (e.g., as illustrated in FIGS. 16B2, 16D2, 16F2, and 16H2). The MEMS device 800 is thus capable of stably producing at least three colors: a first color in the relaxed state, a second color in the actuated state in the first direction, and a third color in the actuated state in the second direction.

In the embodiment illustrated in FIGS. 16A, 16C, 16E, and 16H, the second actuation electrode 164 is over the movable element 810. The MEMS device 800 further comprises a support structure 18a, which supports the second actuation electrode 164, and an optional insulating layer 162. In certain embodiments, the support structure 18a is formed on an opposite side of that reflective element 814 as the support structure 18.

When voltages are applied to the second actuation electrode 164, electrostatic forces act on the movable element 810. In response to the attractive forces, the deformable layer 34 flexes towards the second actuation electrode 164 in the direction of the arrows 168 (e.g., as depicted in FIGS. 16B2, 16D2, 16F2, and 16G2). The reflective element 814 is mechanically coupled to the deformable layer 34, so it also moves in the direction of the arrows 168 in response to voltages applied to the second actuation electrode 164. Thus, the movable element 810 moves in a direction generally perpendicular to the top surface 88 of the substrate 20.

A stationary portion of the MEMS device 800 acts as a stop for movement of the movable element 810. In certain embodiments, an insulating layer 162 comprises the stationary portion (e.g., as illustrated in FIG. 16H2). In certain embodiments, the second actuation electrode 164 comprises the stationary portion. In certain such embodiments, an insulating layer formed on an upper surface of the reflective element 814 (not shown) insulates the movable element 810 from the second actuation electrode 164.

The second actuation electrode 164 is positioned above the reflective surface 92 of the reflective element 814 such that the second actuation electrode 164 is not in the optical path of the MEMS device. Accordingly, the second actuation electrode 164 may comprise a transparent and/or a non-transparent conductive material. Embodiments in which the actuation electrode comprises a non-transparent conductive material may be advantageous, for example for the electrical properties described above.

FIGS. 15A-15G and 17A-17F depict an example embodiment of a method of manufacturing the MEMS device 800 of FIGS. 16A-16H2. After the reflective element 814 has been formed over the sacrificial layer 142 in FIG. 15G, a support structure 18a is formed over the deformable layer 34 (e.g., as illustrated in FIG. 17A).

Figure 17A:
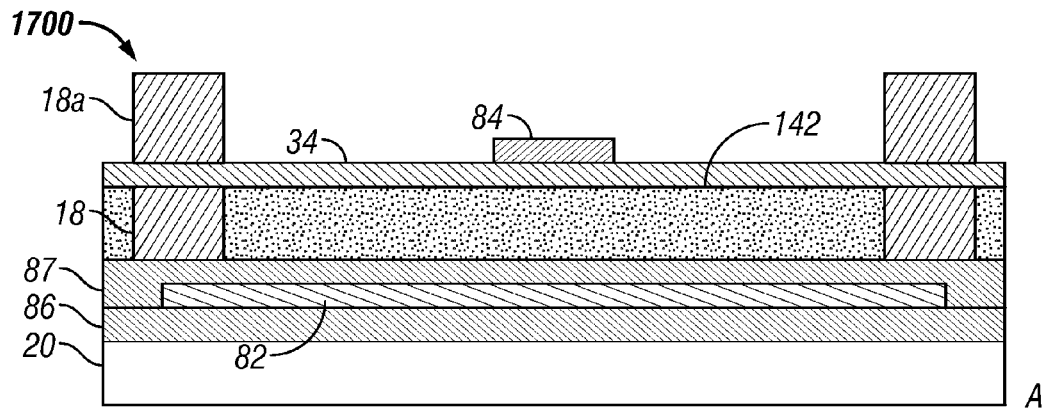
FIGS. 17A-17F are cross sections of an example embodiment of a method of fabricating the MEMS device of FIGS. 16A-16H2.
Figure 17A:
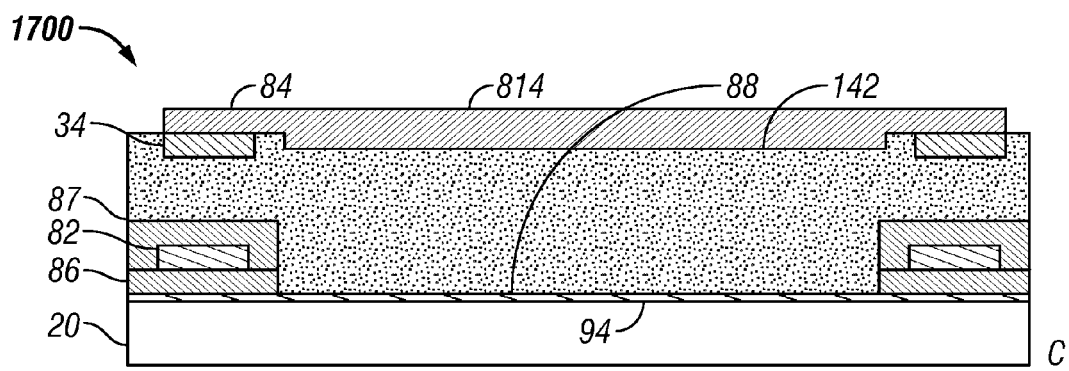
Figure 17A:
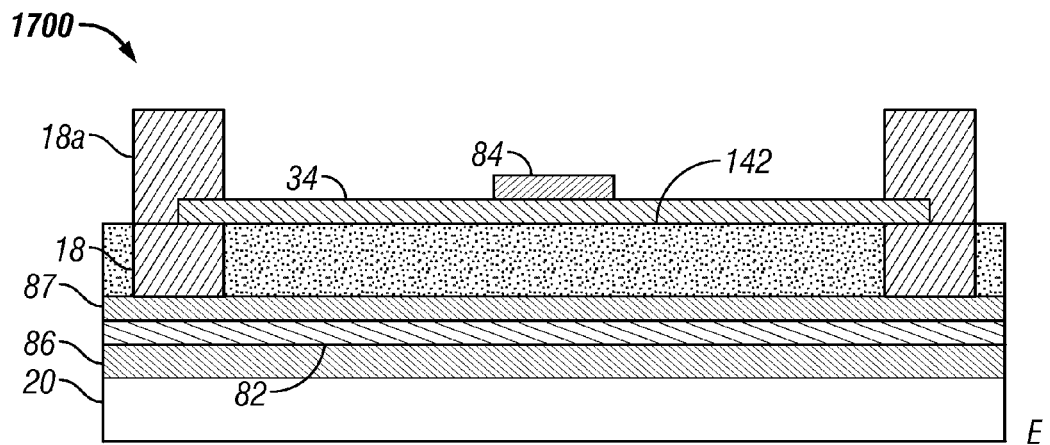
Figure 17A:
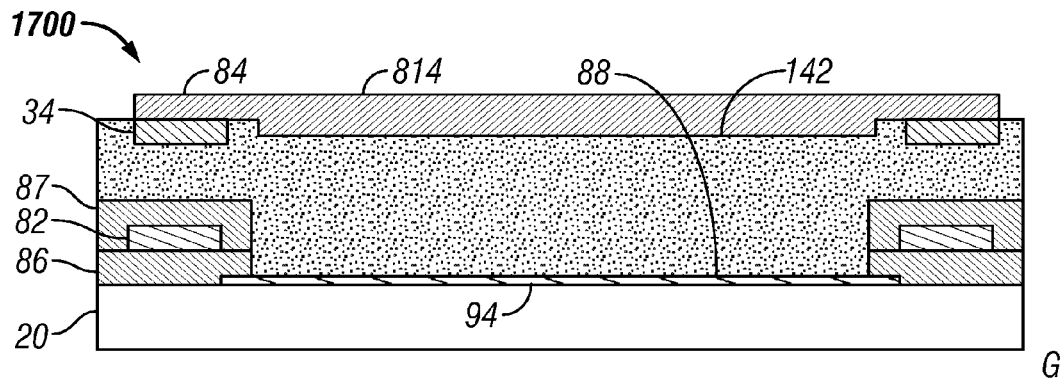
Figure 17B:
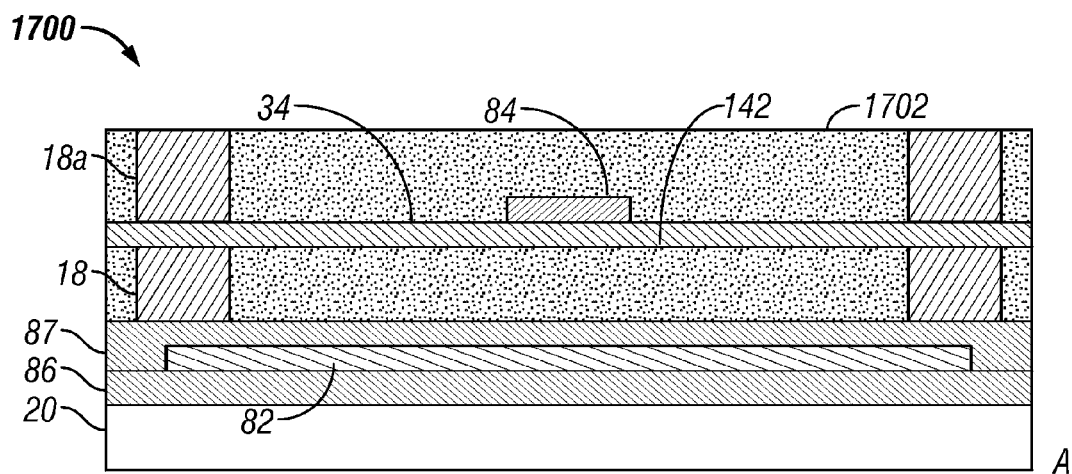
Figure 17B:
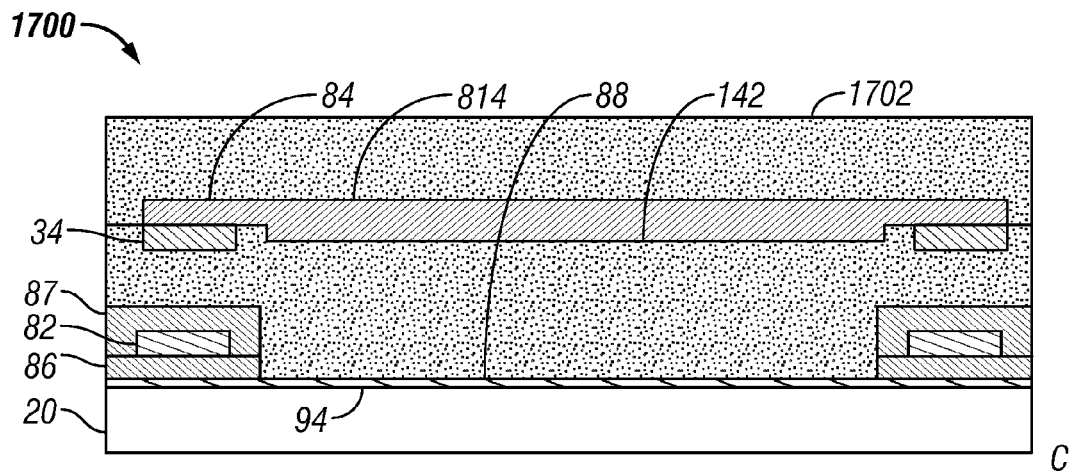
Figure 17B:
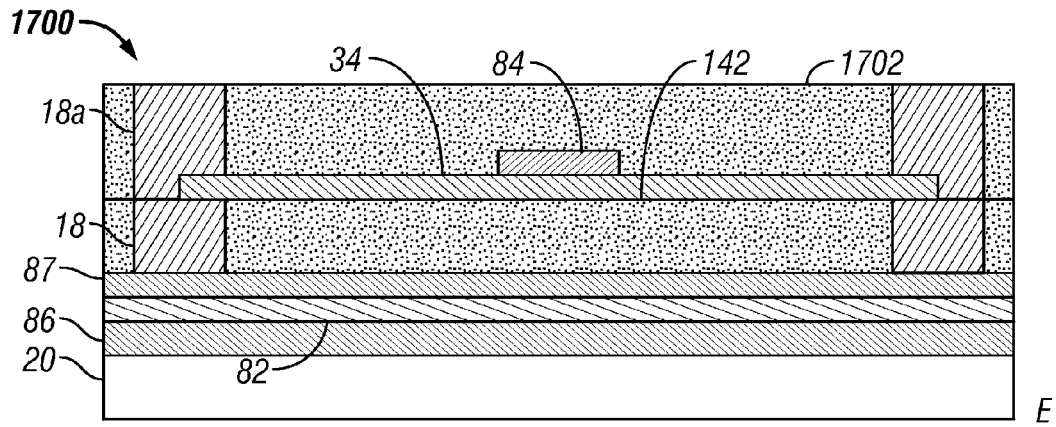
Figure 17B:
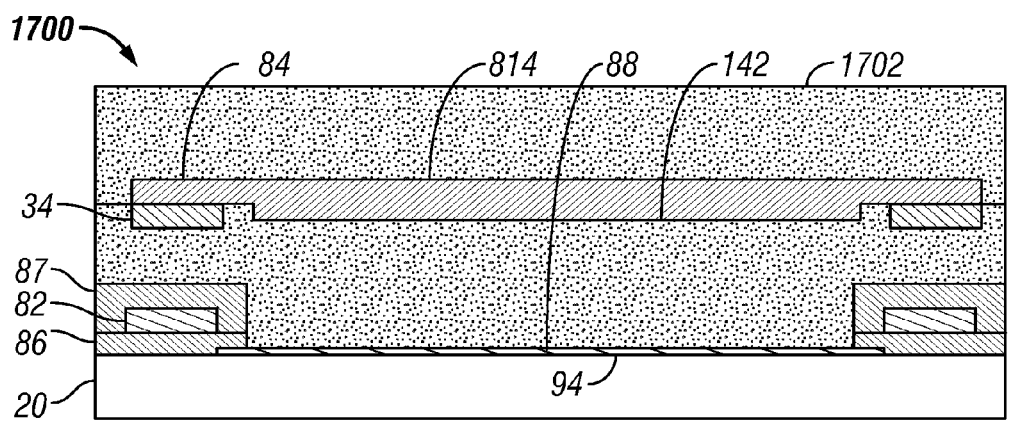

FIG. 17B illustrates the MEMS structure 1700 of FIG. 17A after a second sacrificial layer 1702 (e.g., comprising molybdenum) has been formed over the deformable layer 34. The second sacrificial layer 1702 spaces the deformable layer 34 from the second actuation electrode 164. The second sacrificial layer 1702 may comprise the same material as the second sacrificial layer 142 or a different material than the first sacrificial layer 142. In certain embodiments, the thickness of the second sacrificial layer 1702 influences the color of the MEMS device 800 in the actuated state.

Figure 17C:
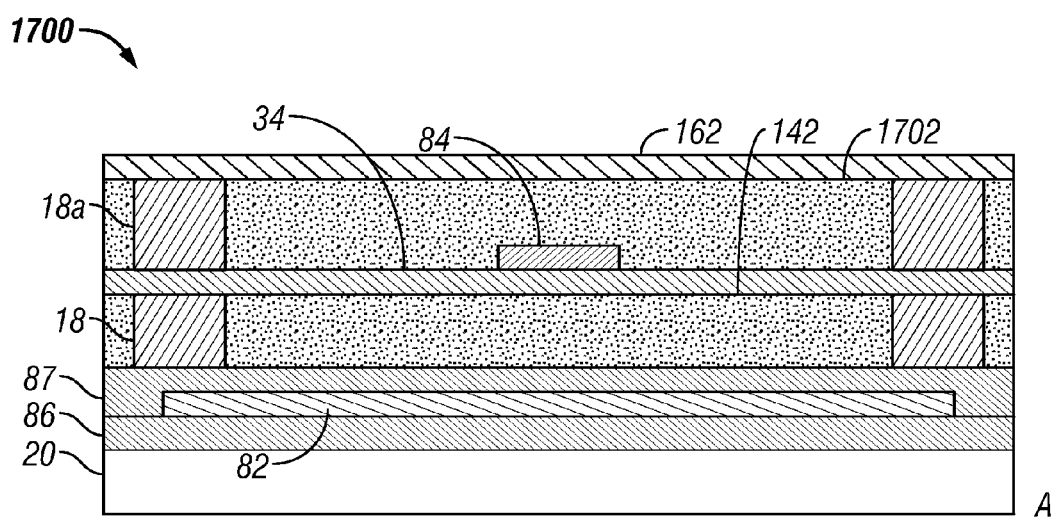
Figure 17C:
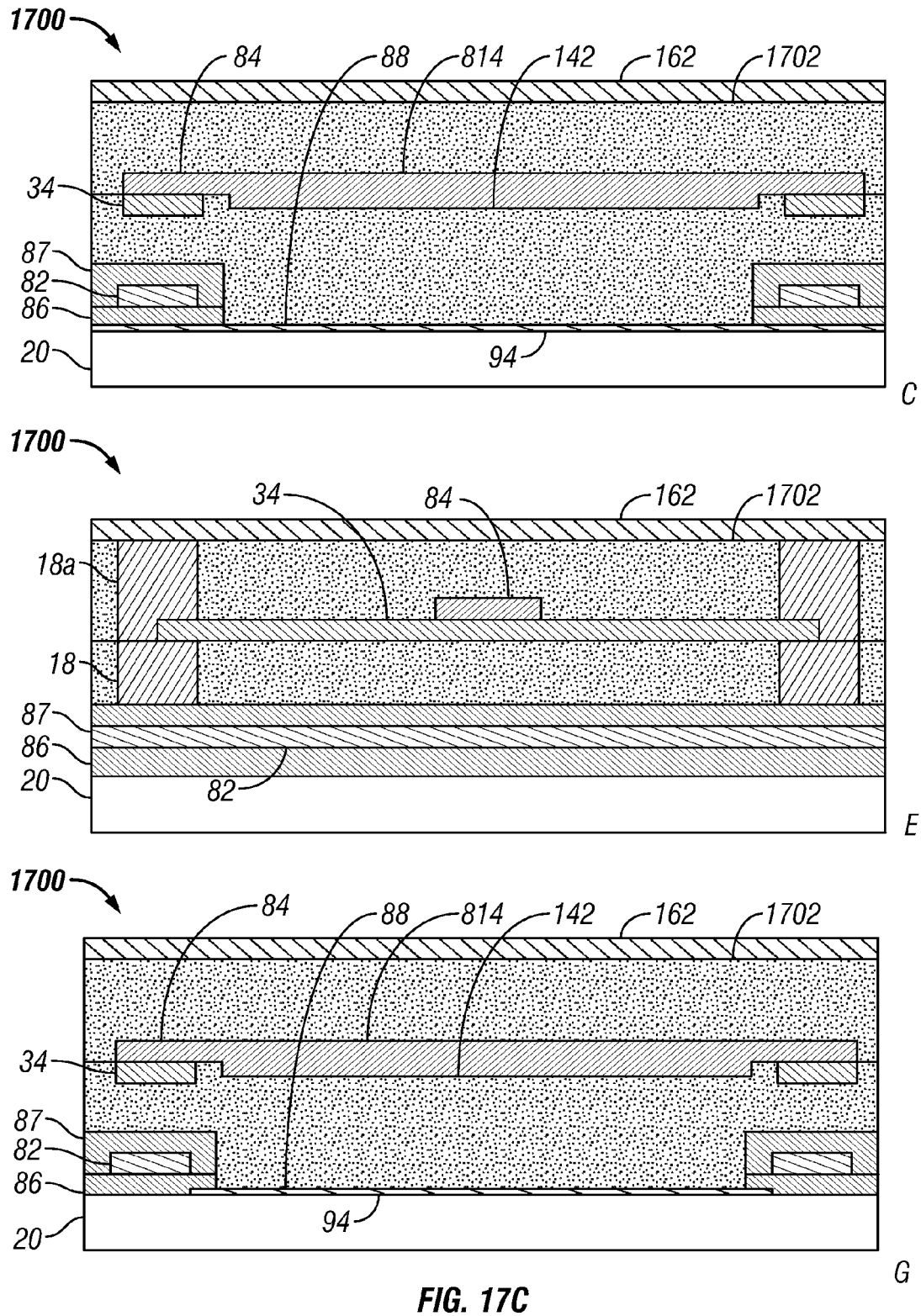

FIG. 17C illustrates the MEMS structure 1700 of FIG. 17B after an insulating layer 162 (e.g., comprising SiO$_2$) has been formed over the second sacrificial layer 1702. In certain embodiments, an insulating layer is formed on an upper surface of the reflective element 814 prior to formation of the second sacrificial layer 1702. In the illustrated embodiment, the support structure 18a is formed before the second sacrificial layer 1702. In certain embodiments, the support structure 18a is formed while forming the insulating layer 162 (e.g., by depositing SiO$_2$ and patterning the SiO$_2$).

Figure 17D:
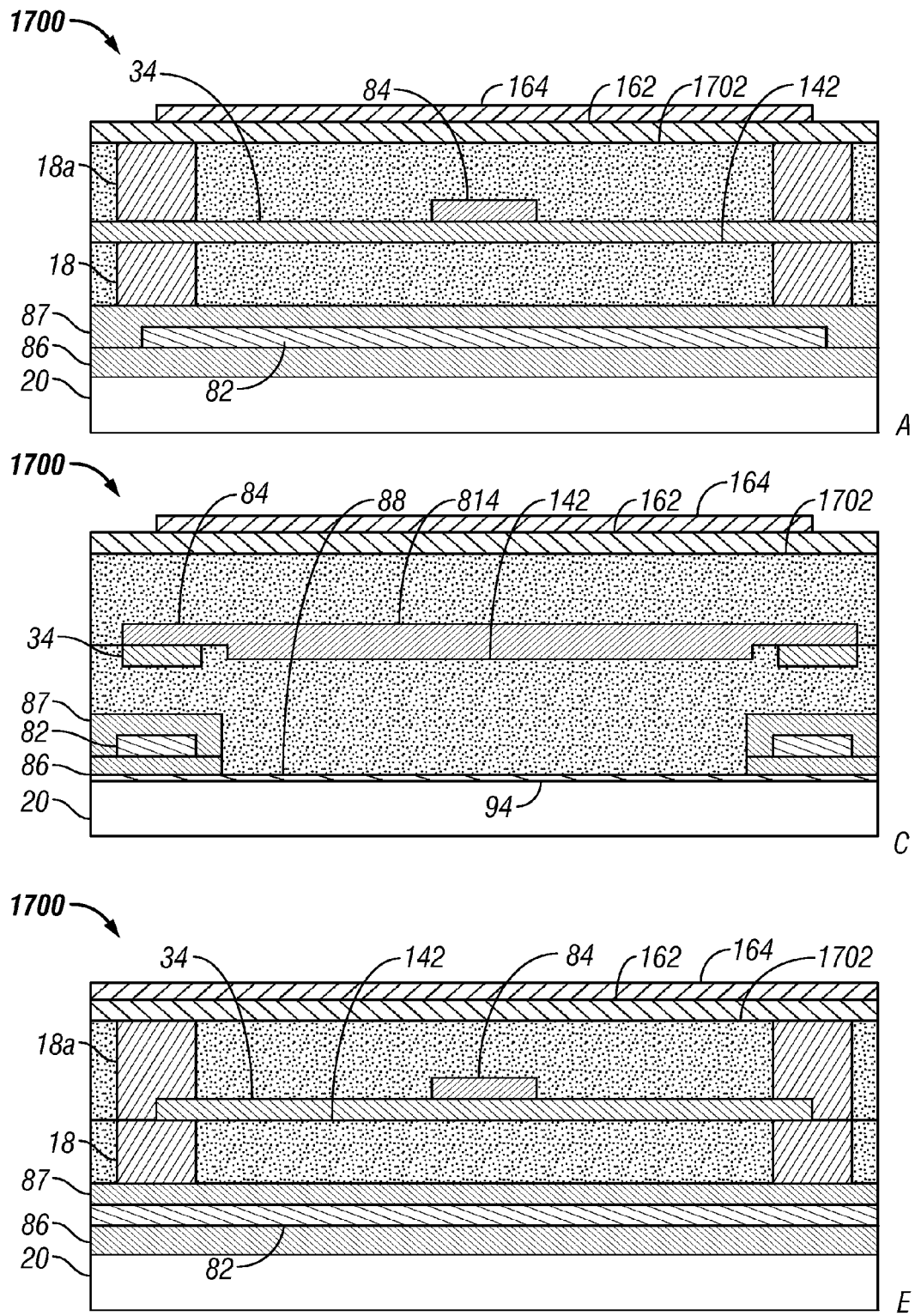
Figure 17D:
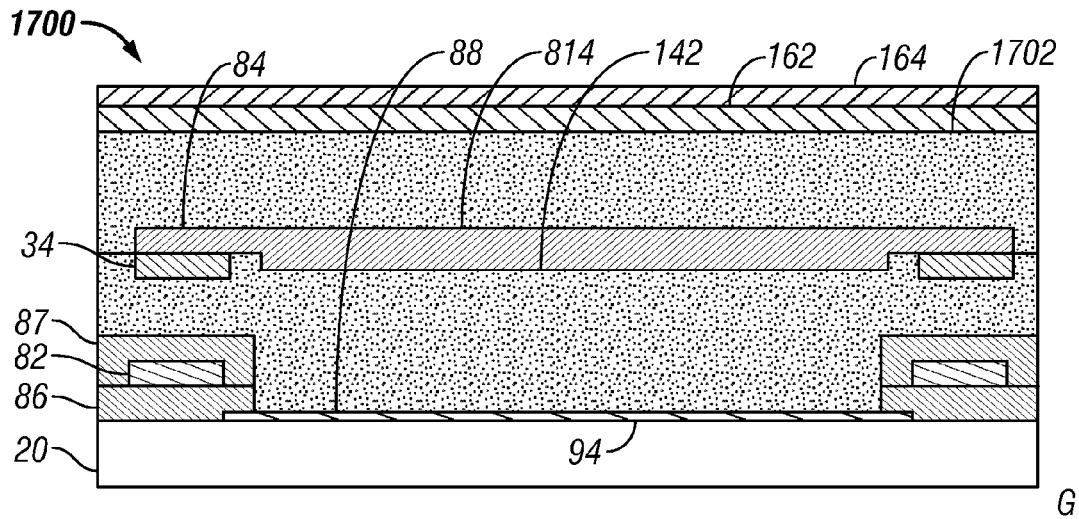

FIG. 17D illustrates the MEMS structure 1700 of FIG. 17C after a second actuation electrode 164 (e.g., comprising nickel, aluminum, copper, silver, gold, alloys thereof) has been formed over the insulating layer 162. In certain embodiments, the second actuation electrode 164 and the insulating layer 162 comprise at least one aperture to allow for easier etching of the sacrificial layers 142, 1702.

Figure 17E:
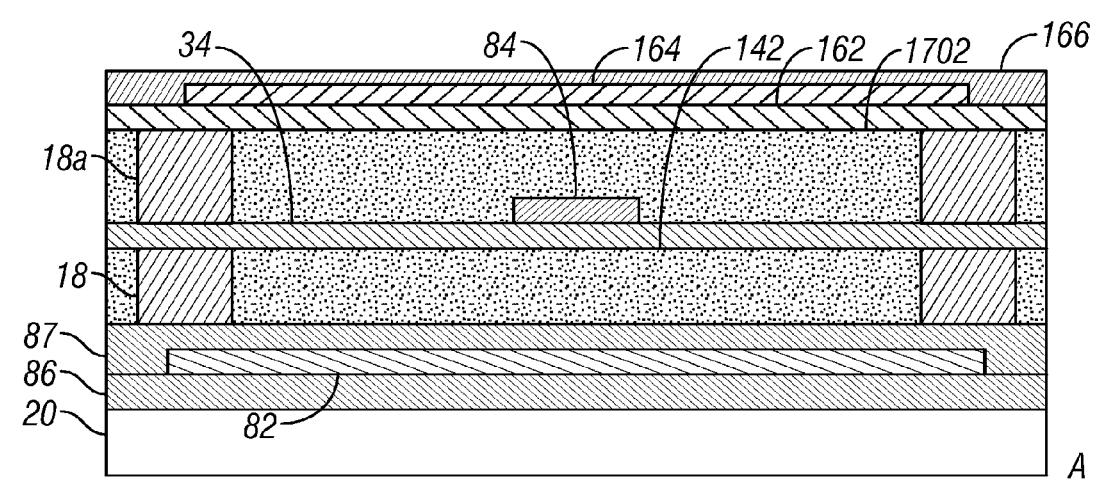
Figure 17E:
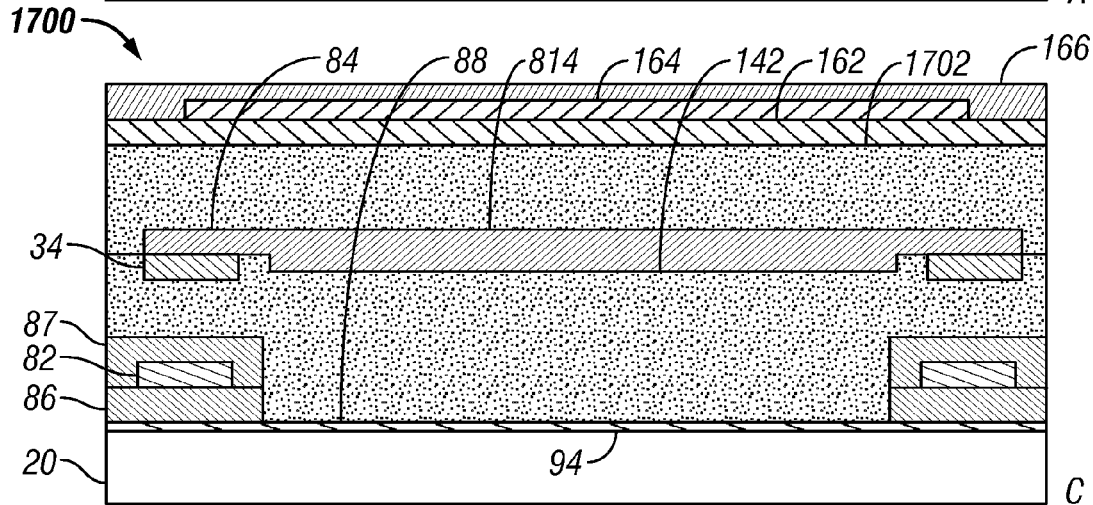
Figure 17E:
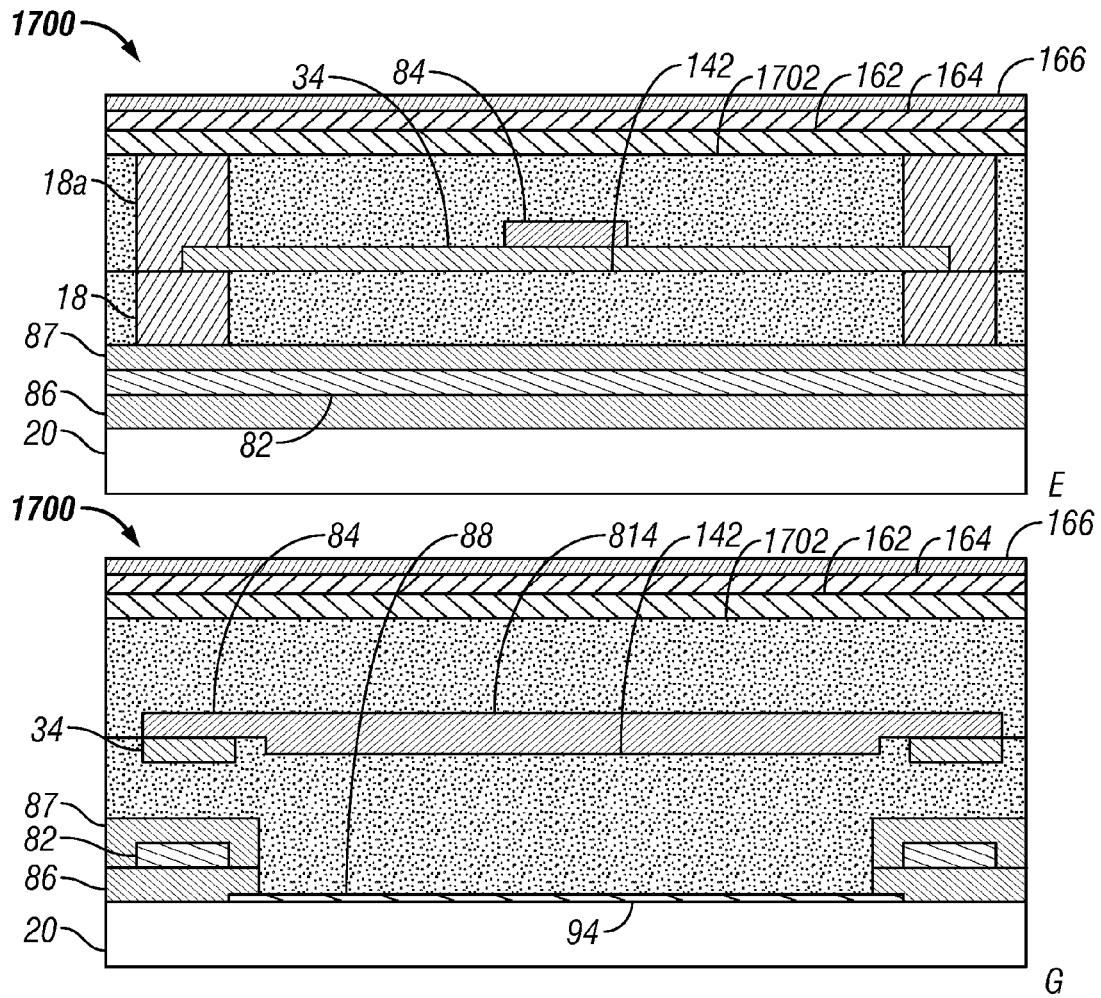

FIG. 17E illustrates the MEMS structure 1700 of FIG. 17D after an optional insulating layer 166 (e.g., comprising SiO$_2$, polyimide) has been formed over the second actuation electrode 164. The insulating layer 166 can be used to insulate components in a display comprising the MEMS device 800 from the second actuation electrode 164.

Figure 17F:
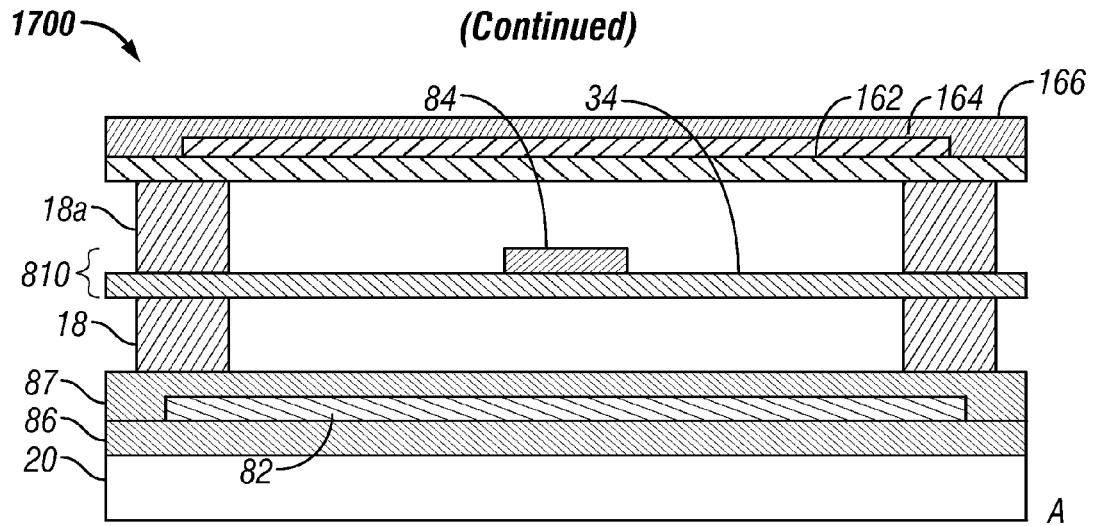
Figure 17F:
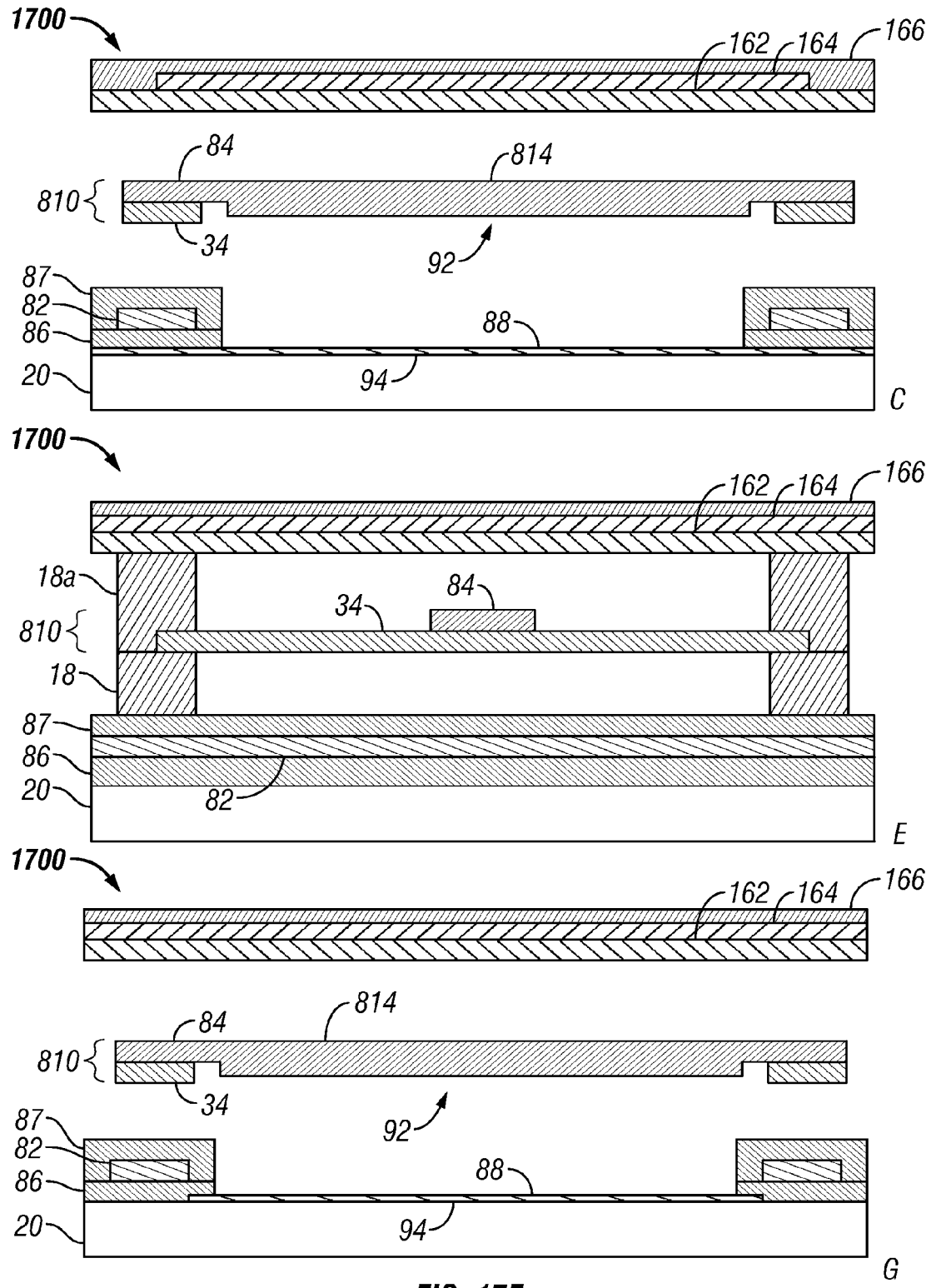

FIG. 17F illustrates the MEMS structure 1700 of FIG. 17E after the first and second sacrificial layers 142, 1702 have been removed, resulting in the MEMS device 800 of FIGS. 16A, 16C, 16E, and 16G. In embodiments in which the sacrificial layers 142, 1702 each comprise molybdenum, they may be removed, for example, by etching with XeF$_2$. In embodiments in which a sacrificial layer comprises photoresist, it may be removed, for example, by ashing (e.g., by etching with O$_2$ and/or H$_2$O). One or more apertures in the reflective element 814 may be used to help the etchant to remove the first sacrificial layer 142 under the reflective element 814. One or more apertures in the insulating layer 162 and the second actuation electrode 164 may be used to help the etchant to remove the second sacrificial layer 1702 under the second actuation electrode 164. Upon removal of the sacrificial layers 142, 1702, the movable element 810 can move in response to voltages applied to the actuation electrodes 82, 164.

In certain embodiments in which the actuation electrode 82 is disposed laterally from the reflective surface 92 of the reflective element 814, the reflective surface 92 faces away from the substrate 20 and the MEMS device 800 is viewable by a user from a side of the movable element 810 opposite from the substrate 20. In some embodiments, the first reflective layer 94 is formed below the movable element 810. In certain such embodiments, the movable element 810 comprises a partially reflective and partially transmissive material and the first reflective layer 94 comprises a fully reflective material. In some embodiments, the first reflective layer 94 is formed above the movable element 810. In certain such embodiments, the movable element 810 comprises a fully reflective material and the first reflective layer 94 comprises a partially reflective and partially transmissive material.

In some embodiments, the actuation electrode 82 is disposed laterally from the reflective surface 92 of the reflective element 814 and is positioned above the movable element 810. The movable element 810 is attracted toward the actuation electrode 82 and in a direction away from the substrate 20. The movable element 810 is positioned proximate to (e.g., in contact with) the top surface 88 of the substrate 20 in the relaxed state, and moves in a direction generally perpendicular to the top surface 88 of the substrate 20 upon actuation. In some embodiments in which the actuation electrode 82 is positioned above the movable element 810, the first reflective layer 94 is formed above the movable element 810. In some alternative embodiments in which the actuation electrode 82 is positioned above the movable element 810, the movable element 810 comprises a fully reflective material and the first reflective layer 94 comprises a partially reflective and partially transmissive material.

In certain embodiments in which actuation of the MEMS device 800 causes the reflective element 814 to move away from the substrate 20, the deformable layer 34 may be configured such that the movable element 810 "launches" negatively (e.g., towards the substrate 20) in the relaxed state. For example, the residual stresses between the deformable layer 34 and the support structure 18 may be designed such that the deformable layer 34 deflects downward upon removal of the sacrificial layer.

In some embodiments in which the actuation electrode 82 is positioned above the movable element 810, the MEMS device 800 is viewable by a user through the substrate 20. In certain such embodiments in which the movable element 810 launches negatively in the relaxed state, the relaxed state can be configured to produce high reflectivity broadband white (e.g., by having the reflective surface 92 of the movable element 810 touching the top surface 88 of the substrate 20 or being spaced less than about 100 Å from the first reflective layer 94), low reflectivity black (e.g., by having the reflective surface 92 of the movable element 810 spaced from the first reflective layer 94 by about 100 nm), gray (e.g., by having the reflective surface 92 of the movable element 810 spaced from the first reflective layer 94 by between about 100 Å and 100 nm), or a color (e.g., yellow, red, blue, etc.). In some embodiments, the movable element 810 comprises a partially reflective and partially transmissive material and the first reflective layer 94 comprises a fully reflective material.

In some alternative embodiments in which the actuation electrode 82 is positioned above the movable element 810, the MEMS device 800 is viewable by a user from a side of the movable element 810 opposite from the substrate 20. In certain such embodiments in which the movable element 810 launches negatively in the relaxed state, the relaxed state can be configured to produce high reflectivity broadband white (e.g., by having the reflective surface 92 of the movable element 810 being spaced less than about 100 Å from the first reflective layer 94), low reflectivity black (e.g., by having the reflective surface 92 of the movable element 810 spaced from the first reflective layer 94 by about 100 nm), gray (e.g., by having the reflective surface 92 of the movable element 810 spaced from the first reflective layer 94 by between about 100 Å and 100 nm), or a color (e.g., yellow, red, blue, etc.).

In embodiments in which the MEMS device 800 is viewable by a user from a side of the movable element 810 opposite from the substrate 20, the user does not view the reflective surface 92 through the substrate 20. In certain such embodiments, the substrate 20 comprises a material that is substantially non-transparent (e.g., opaque, highly reflective, translucent) to light. In certain such embodiments, the substrate 20 may comprise metals (e.g., stainless steel, aluminum), anodized metals, silicon (e.g., a silicon wafer), poly-silicon, plastics, ceramics, polymers (e.g., polyimide, MYLAR™), and carbon (e.g., graphite), as well as alloys and composites of such materials. A substantially non-transparent substrate 20 can present numerous fabrication and operation advantages including, but not limited to, avoiding processing problems due to light scattering during photolithography, shielding underlying circuitry from stray light, allowing standard semiconductor processing equipment to be used to fabricate the MEMS device, allowing integration of the MEMS device fabrication with underlying control circuitry fabrication, increasing the area for control circuitry, reducing constraints associated with integrating control circuitry within the MEMS device, and facilitating using illumination sources integrated in an array of MEMS device (e.g., interferometric modulators).

In some embodiments comprising a second actuation electrode 164, the second actuation electrode 164 is positioned between the reflective surface 92 of the reflective element 814 and the substrate 20 such that the second actuation electrode 164 is in the optical path of the MEMS device. Accordingly, the second actuation electrode 164 may comprise a non-transparent in embodiments in which the MEMS device 800 is viewable from a side of the movable element 810 opposite from the substrate 20 and may comprise a transparent conductive material in embodiments in which the MEMS device 800 is viewable through the substrate 20. Embodiments in which the actuation electrode comprises a non-transparent conductive material may be advantageous, for example for the electrical properties described above.

Various specific embodiments have been described above. Although the invention has been described with reference to these specific embodiments, the descriptions are intended to be illustrative of the invention and are not intended to be limiting. Various modifications and applications may occur to those skilled in the art without departing from the true scope of the invention as defined in the appended claims.

What is claimed is:

1. An electromechanical device comprising:
a substrate;
a movable element over the substrate, the movable element comprising an electrically conductive deformable layer and a reflective element mechanically coupled to the deformable layer, the reflective element including a reflective surface, the reflective surface spaced from the deformable layer along a direction generally parallel to the reflective surface; and
an actuation electrode under at least a portion of the deformable layer and disposed laterally from the reflective surface, the movable element responsive to a voltage difference applied between the actuation electrode and the deformable layer by moving in a direction towards the substrate, wherein a stationary portion of the device is configured to act as a stop for movement of the movable element, the movable element responsive to the voltage difference applied between the actuation electrode and the deformable layer by moving from a first position in which a portion of the movable element is not in contact with the stationary portion to a second position in which the portion is in contact with the stationary portion.

2. The electromechanical device of claim 1, wherein the reflective element is mechanically coupled to a top surface of the deformable layer.

3. The electromechanical device of claim 1, wherein the reflective element is mechanically coupled to a bottom surface of the deformable layer.

4. The electromechanical device of claim 1, wherein the movable element further comprises at least one connecting element, the at least one connecting element mechanically coupling the reflective element to the deformable layer.

5. The electromechanical device of claim 4, wherein a first connecting element is mechanically coupled to a first edge of the reflective element and a second connecting element is mechanically coupled to a second edge of the reflective element, the first edge substantially opposite the second edge.

6. The electromechanical device of claim 4, wherein the reflective element has a plurality of edges and wherein the at least one connecting element mechanically couples each edge of the reflective element to the deformable layer.

7. The electromechanical device of claim 4, wherein the at least one connecting element comprises at least one protrusion extending from the reflective element.

8. The electromechanical device of claim 1, wherein the reflective surface is not in contact with a top surface of the substrate when an actuation voltage difference is applied between the actuation electrode and the deformable layer.

9. The electromechanical device of claim 1, wherein a distance between the reflective surface and a top surface of the substrate is greater than a distance between the deformable layer and the top surface of the substrate.

10. The electromechanical device of claim 1, wherein a distance between the deformable layer and a top surface of the substrate is greater than a distance between the reflective surface and the top surface of the substrate.

11. The electromechanical device of claim 1, wherein the stationary portion of the device comprises a top surface of the substrate.

12. The electromechanical device of claim 1, wherein the stationary portion of the device comprises a top surface of the actuation electrode.

13. The electromechanical device of claim 1, wherein the stationary portion of the device comprises a top surface of an insulating layer between the actuation electrode and the deformable layer.

14. The electromechanical device of claim 1, wherein application of a voltage difference between the actuation electrode and the deformable layer causes displacement of the deformable layer and displacement of the reflective surface, the displacement of the deformable layer parallel to the displacement of the reflective surface, the displacement of the deformable layer on a different plane than the displacement of the reflective surface.

15. The electromechanical device of claim 1, wherein the substrate is at least partially transparent.

16. The electromechanical device of claim 1, wherein the reflective element is configured to reflect a first color in the first position and to reflect a second color in the second position.

17. The electromechanical device of claim 1, wherein the reflective element is completely reflective.

18. The electromechanical of claim 1, further comprising an other actuation electrode over the movable element, the movable element responsive to a voltage difference applied between the other actuation electrode and the movable element by moving away from the substrate.

19. The electromechanical device of claim 18, further comprising an insulating layer between the other actuation electrode and the movable element.

20. The electromechanical device of claim 19, wherein the insulating layer is formed on an upper surface of the movable element.

21. The electromechanical device of claim 19, wherein the insulating layer is formed on a lower surface of the other actuation electrode.

22. The electromechanical device of claim 1, further comprising:
- a display;
- a processor that is configured to communicate with said display, said processor being configured to process image data; and
- a memory device that is configured to communicate with said processor.

23. The electromechanical device of claim 22, further comprising a driver circuit configured to send at least one signal to the display.

24. The electromechanical device of claim 23, further comprising a controller configured to send at least a portion of the image data to the driver circuit.

25. The electromechanical device of claim 22, further comprising an image source module configured to send said image data to said processor.

26. The electromechanical device of claim 25, wherein the image source module comprises at least one of a receiver, transceiver, and transmitter.

27. The electromechanical device of claim 22, further comprising an input device configured to receive input data and to communicate said input data to said processor.

28. An electromechanical device comprising:
- a substrate;
- a movable element over the substrate, the movable element comprising an electrically conductive deformable layer and a reflective element mechanically coupled to the deformable layer, the reflective element including a reflective surface, the reflective surface spaced from the deformable layer along a direction generally parallel to the reflective surface; and
- an actuation electrode under at least a portion of the deformable layer and disposed laterally from the reflective surface, the movable element responsive to a voltage difference applied between the actuation electrode and the deformable layer by moving in a direction away from the substrate, wherein a stationary portion of the device is configured to act as a stop for movement of the movable element, the movable element responsive to the voltage difference applied between the actuation electrode and the deformable layer by moving from a first position in which a portion of the movable element is not in contact with the stationary portion to a second position in which the portion is in contact with the stationary portion.

29. The electromechanical device of claim 28, wherein application of a voltage difference between the actuation electrode and the deformable layer causes displacement of the deformable layer and displacement of the reflective surface, the displacement of the deformable layer parallel to the displacement of the reflective surface, the displacement of the deformable layer on a different plane than the displacement of the reflective surface.

30. The electromechanical device of claim 28, further comprising an insulating layer between the actuation electrode and the movable element.

31. The electromechanical device of claim 30, wherein the insulating layer is formed on an upper surface of the movable element.

32. The electromechanical device of claim 30, wherein the insulating layer is formed on a lower surface of the actuation electrode.

33. An electromechanical device comprising:
- a movable element comprising a deformable layer and a reflective element, the deformable layer extending along at least two sides of the reflective element, the reflective element mechanically coupled to the deformable layer at least partially by a connecting element on the at least two sides; and
- an actuation electrode under at least a portion of the deformable layer along the at least two sides of the reflective element.

* * * * *

UNITED STATES PATENT AND TRADEMARK OFFICE
CERTIFICATE OF CORRECTION

PATENT NO. : 7,630,121 B2  Page 1 of 1
APPLICATION NO. : 11/772751
DATED : December 8, 2009
INVENTOR(S) : Denis Endisch et al.

It is certified that error appears in the above-identified patent and that said Letters Patent is hereby corrected as shown below:

On the Title Page at Item (56), Page 1, Column 2, Line 14, under Other Publications, change "Liquivista" to --Liquavista--.

On the Title Page at Item (56), Page 2, Column 2, Line 48, under U.S. Patent Documents, change "Pichl et al." to --Piehl et al.--.

On the Title Page at Item (56), Page 3, Column 2, Line 26, under Other Publications, change "Transcucers," to --Transducers,--.

On the Title Page at Item (56), Page 3, Column 2, Line 26, under Other Publications, change "1991,," to --1991,--.

At Column 26, Line 54 (approx.), in Claim 18, after "electromechanical" insert --device--.

Signed and Sealed this

Twenty-second Day of June, 2010

David J. Kappos
*Director of the United States Patent and Trademark Office*